US012336190B2

(12) United States Patent
Chung et al.

(10) Patent No.: US 12,336,190 B2
(45) Date of Patent: Jun. 17, 2025

(54) INTEGRATED CIRCUIT STRUCTURE AND FABRICATION THEREOF

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Chia-Che Chung, Hsinchu (TW); Chun-Yi Cheng, New Taipei (TW); Chee-Wee Liu, Taipei (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 573 days.

(21) Appl. No.: 17/689,784

(22) Filed: Mar. 8, 2022

(65) Prior Publication Data

US 2023/0029046 A1    Jan. 26, 2023

Related U.S. Application Data

(60) Provisional application No. 63/224,361, filed on Jul. 21, 2021.

(51) Int. Cl.
*H10B 61/00* (2023.01)
*H10N 50/01* (2023.01)

(52) U.S. Cl.
CPC ............. *H10B 61/22* (2023.02); *H10N 50/01* (2023.02)

(58) Field of Classification Search
CPC ........... H01L 29/66439; H01L 29/0673; H01L 29/775; H01L 29/7831; H01L 29/0692;

(Continued)

(56) References Cited

U.S. PATENT DOCUMENTS 10,510,620 B1 * 12/2019 Chanemougame ........................ H01L 27/0924
10,522,740 B2   12/2019 Chuang et al.
(Continued)

FOREIGN PATENT DOCUMENTS

TW    201025322 A    7/2010
TW    I725437 B      4/2021
(Continued)

OTHER PUBLICATIONS

S. Angizi et al., "MRIMA: An MRAM-Based In-Memory Accelerator," in IEEE Transactions on Computer-Aided Design of Integrated Circuits and Systems, vol. 39, No. 5, May 2020, pp. 1123-1136.

(Continued)

*Primary Examiner* — Mouloucoulaye Inoussa
(74) *Attorney, Agent, or Firm* — Maschoff Brennan

(57) ABSTRACT

An IC structure comprises an MTJ cell, a transistor, a first word line, and a second word line. The transistor is electrically coupled to the MTJ cell. The transistor comprises a first gate terminal and a second gate terminal independent of the first gate terminal. The first word line is electrically coupled to the first gate terminal of the transistor. The second word line is electrically coupled to the second gate terminal of the transistor. A resistance state of the MTJ cell is dependent on a first word line voltage applied to the first word line and a second word line voltage applied to the second word line, and the resistance state of the MTJ cell follows an AND gate logic or an OR gate logic.

20 Claims, 61 Drawing Sheets

(58) Field of Classification Search
CPC ......... H01L 29/78696; H01L 29/42392; H01L
29/66545; H01L 29/0847; H01L
29/42376; H01L 29/785; H01L 29/7848;
H01L 29/165; H01L 29/78654; H01L
21/823412; H01L 29/78618; H01L
29/0653; H01L 29/1037; H01L 27/088;
H01L 27/0924; H01L 21/823878; H01L
21/823842; H01L 21/32139; H01L
21/823807; H01L 29/66772; H01L
21/823821; H01L 21/823814; H01L
29/82; H01L 28/60; H01L 21/02532;
H01L 21/3065; H01L 21/8221; H01L
29/66742; H01L 23/528; H01L 27/092;
H10B 61/22; H10B 63/34; H10B 63/20;
H10B 63/84; H10B 61/20; H10B 20/36;
H10B 20/50; H10N 50/01; H10N 50/10;
H10N 50/85; B82Y 10/00; G11C
11/1659; G11C 11/161; G11C 13/0069;
G11C 11/1657; G11C 11/1675; G11C
11/1673; G11C 11/1655; G11C 11/16;
G11C 11/15; G11C 17/12; G06F 7/5443;
G06N 3/065

See application file for complete search history.

(56) References Cited

U.S. PATENT DOCUMENTS

| | | | |
|---|---|---|---|
| 10,964,402 B1* | 3/2021 | Chen | G11C 7/04 |
| 11,088,201 B2 | 8/2021 | Lin et al. | |
| 11,315,938 B1* | 4/2022 | Reznicek | G11C 17/12 |
| 11,475,947 B1* | 10/2022 | Fantini | G11C 8/14 |
| 2007/0211519 A1* | 9/2007 | Thomas | G11C 11/412 |
| | | | 257/E27.099 |
| 2008/0049486 A1* | 2/2008 | Gruening-von Schwerin | |
| | | | H10B 63/34 |
| | | | 257/296 |
| 2009/0080237 A1* | 3/2009 | Thomas | G11C 11/413 |
| | | | 365/210.1 |
| 2010/0157664 A1 | 6/2010 | Chung | |
| 2014/0112074 A1* | 4/2014 | Rhie | G11C 16/14 |
| | | | 365/185.11 |
| 2014/0269064 A1* | 9/2014 | Jeon | G11C 13/0004 |
| | | | 365/185.05 |
| 2014/0340958 A1* | 11/2014 | Gharia | G11C 11/161 |
| | | | 365/158 |
| 2016/0293615 A1* | 10/2016 | Kwon | H01L 29/42324 |
| 2019/0088327 A1* | 3/2019 | Ito | G11C 11/1659 |
| 2019/0267388 A1* | 8/2019 | Choi | H10B 41/35 |
| 2019/0386203 A1* | 12/2019 | Gosavi | H10N 50/10 |
| 2020/0035567 A1* | 1/2020 | Chanemougame | H01L 29/401 |
| 2020/0144367 A1* | 5/2020 | Tsou | H01L 29/66772 |
| 2020/0335146 A1* | 10/2020 | Alrod | G11C 16/26 |
| 2020/0350203 A1* | 11/2020 | Fratin | G11C 8/08 |
| 2021/0193652 A1 | 6/2021 | Guha et al. | |
| 2021/0202498 A1 | 7/2021 | Liaw | |
| 2021/0265345 A1* | 8/2021 | Xie | H01L 21/823864 |
| 2021/0349691 A1* | 11/2021 | Hekmatshoartabari | |
| | | | H01L 29/42392 |

FOREIGN PATENT DOCUMENTS

| | | |
|---|---|---|
| TW | I727351 B | 5/2021 |
| TW | 202125825 A | 7/2021 |

OTHER PUBLICATIONS

Yongxun Liu et al., "A highly Threshold Voltage-Controllable 4T FinFET with an 8.5-nm-Thick Si-Fin Channel," in IEEE Electron Device Letters, vol. 25, No. 7, Jul. 2004, pp. 510-512.

* cited by examiner 1T-1MTJ with AND2 logic function

| Inputs | | Output |
|---|---|---|
| $V_{WL1}$ | $V_{WL2}$ | $R_{MTJ}$ |
| 0 or False | 0 or False | 0 or False ($R_P$) |
| 1 or True ($V_{DD}$) | 0 or False | 0 or False ($R_P$) |
| 0 or False | 1 or True ($V_{DD}$) | 0 or False ($R_P$) |
| 1 or True ($V_{DD}$) | 1 or True ($V_{DD}$) | 1 or True ($R_P$) |

Fig. 5

1T-1MTJ with OR2 logic function

| Inputs | | Output |
|---|---|---|
| $V_{WL1}$ | $V_{WL2}$ | $R_{MTJ}$ |
| 0 or False | 0 or False | 0 or False ($R_P$) |
| 1 or True ($V_{DD}$) | 0 or False | 1 or True ($R_{AP}$) |
| 0 or False | 1 or True ($V_{DD}$) | 1 or True ($R_{AP}$) |
| 1 or True ($V_{DD}$) | 1 or True ($V_{DD}$) | 1 or True ($R_{AP}$) |

Fig. 7

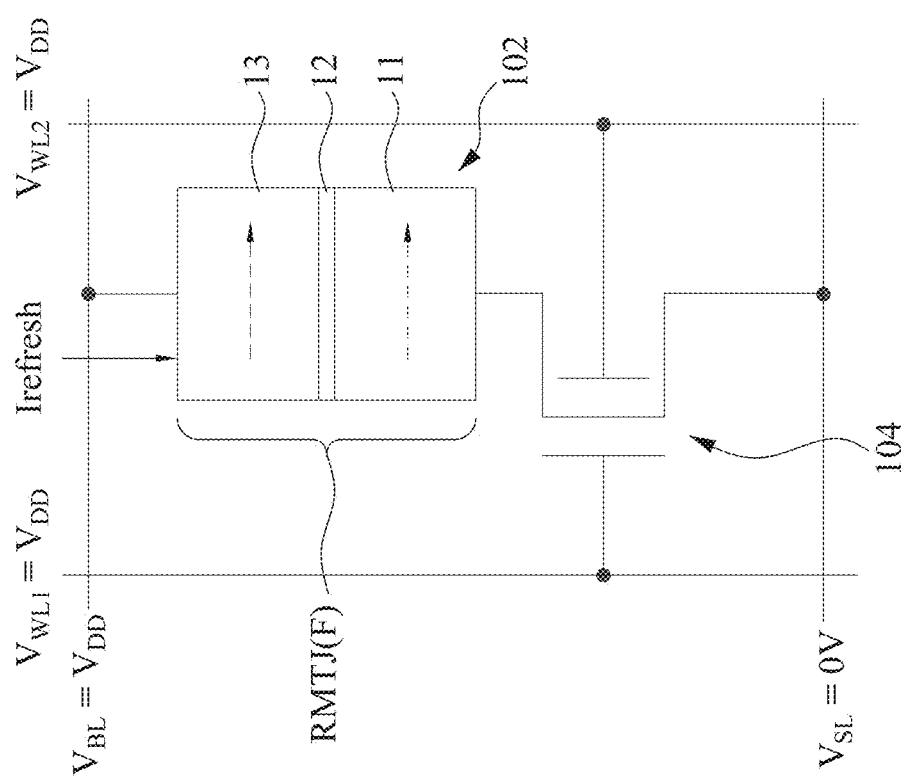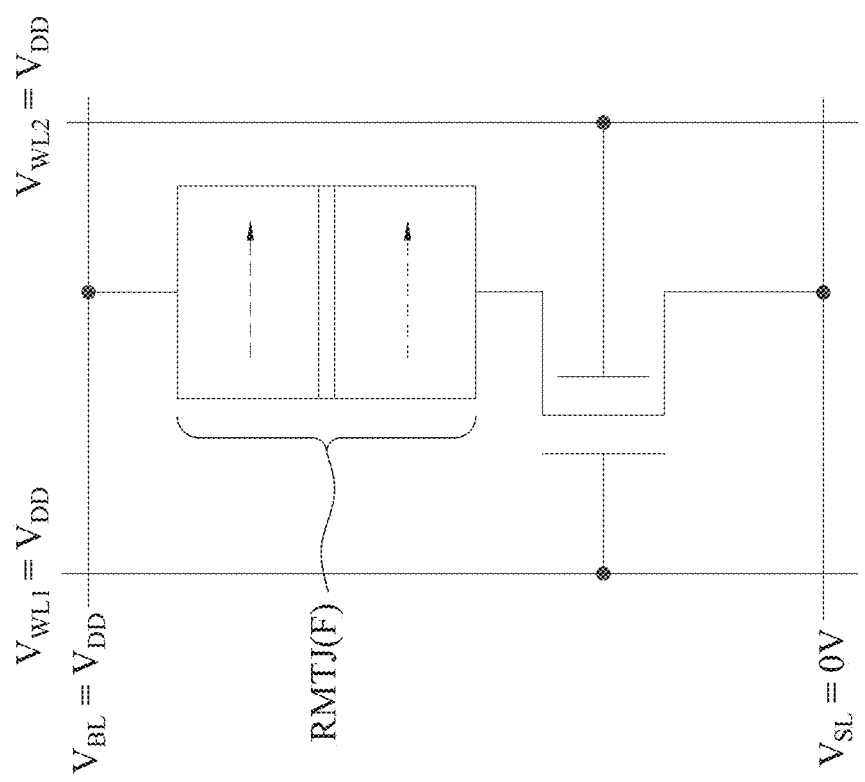
Fig. 8A

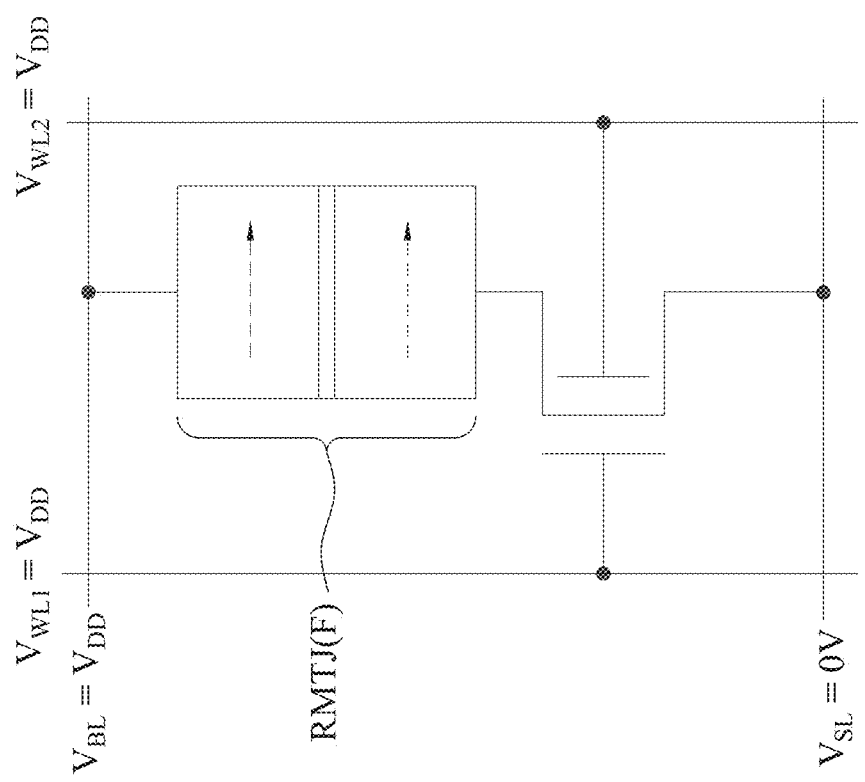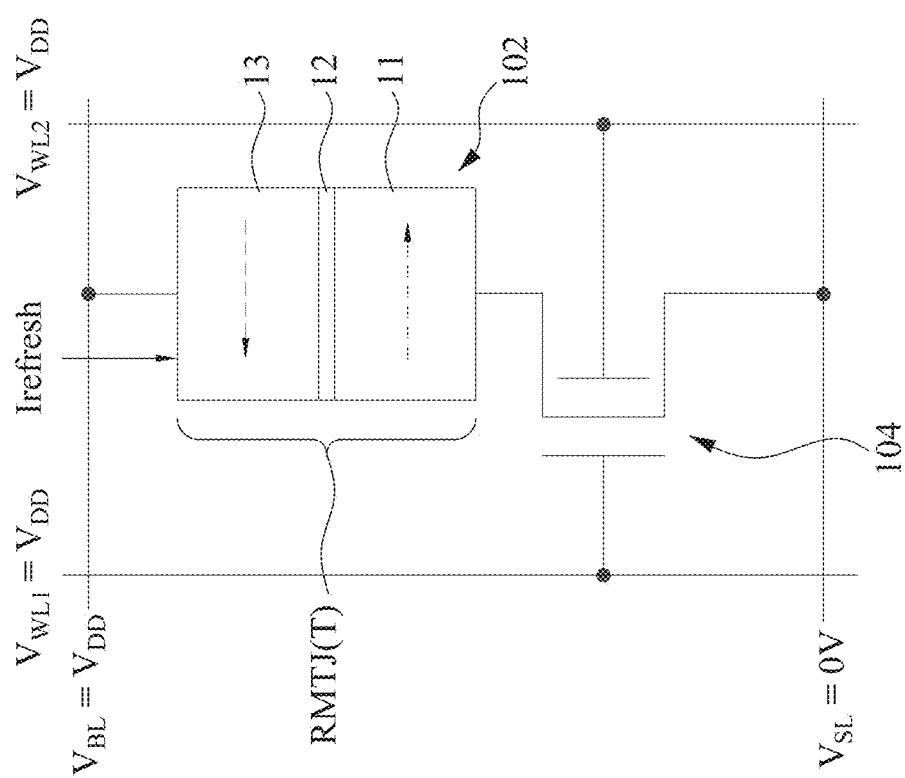
Fig. 8B

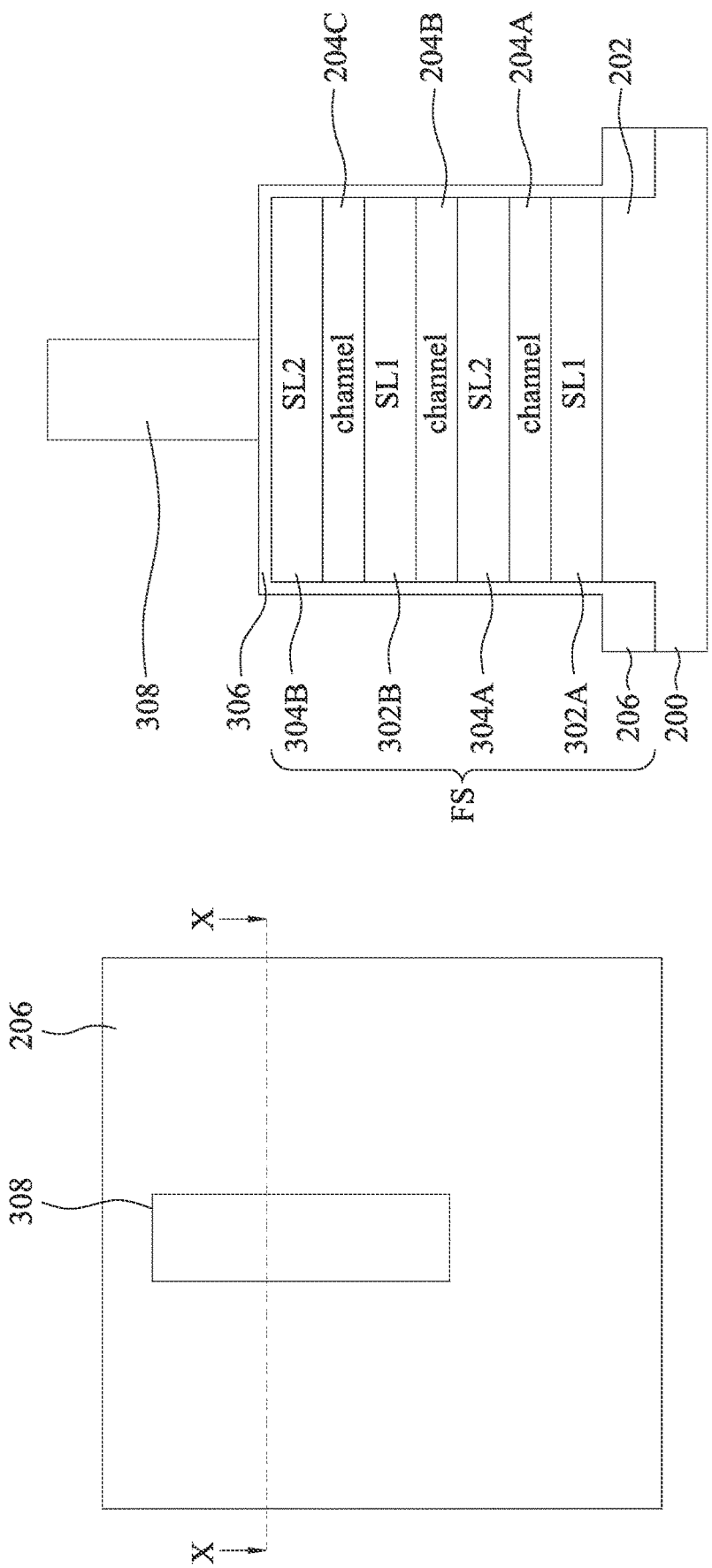

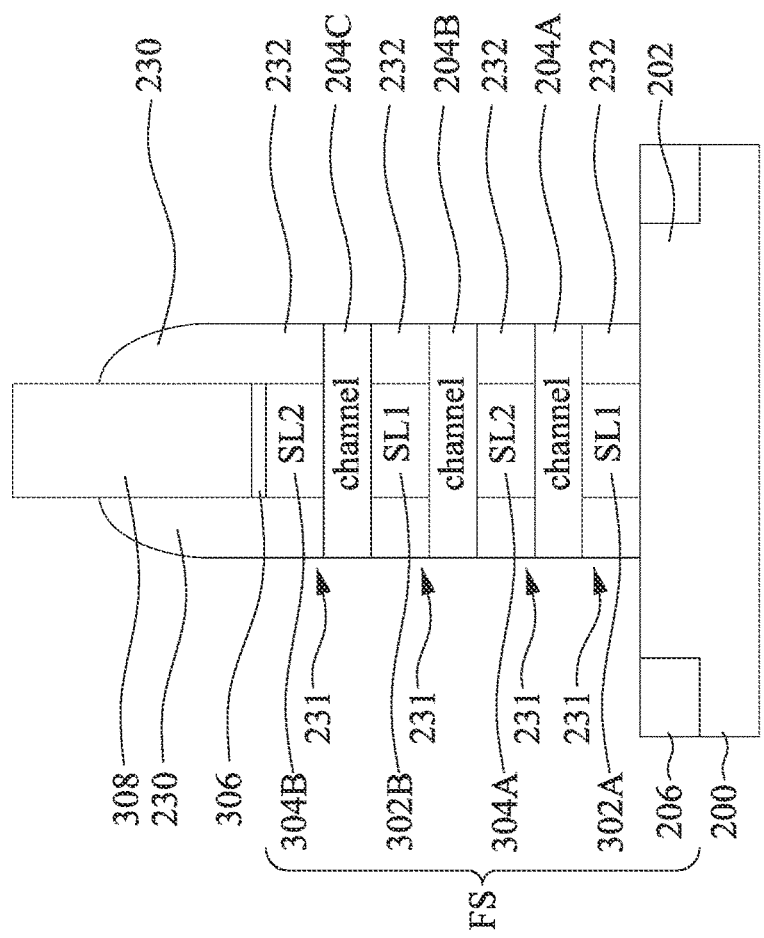
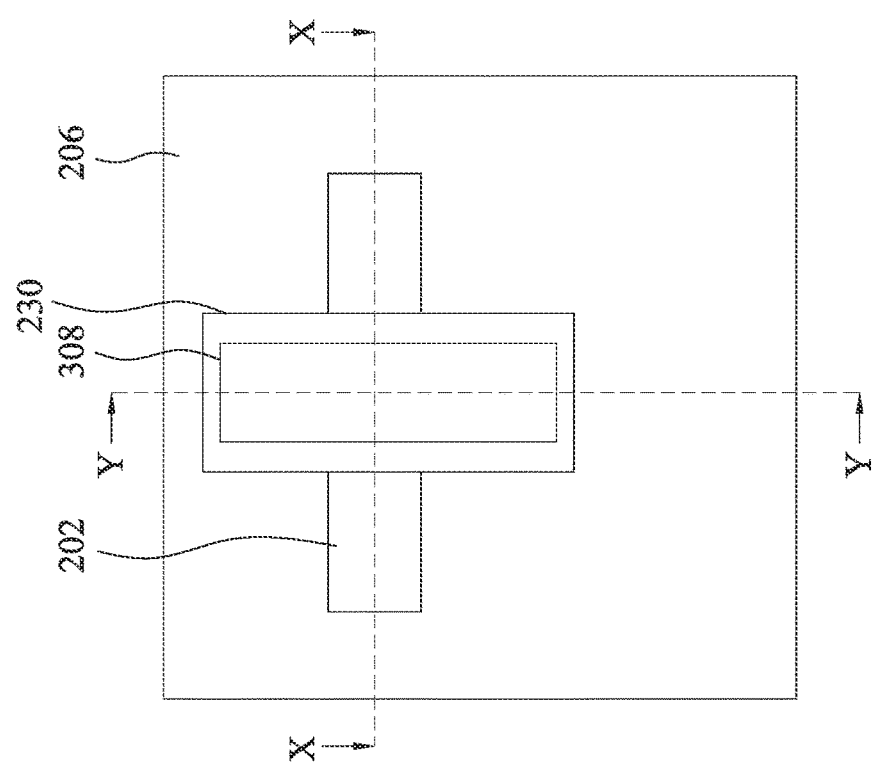
Fig. 13A
Fig. 13B

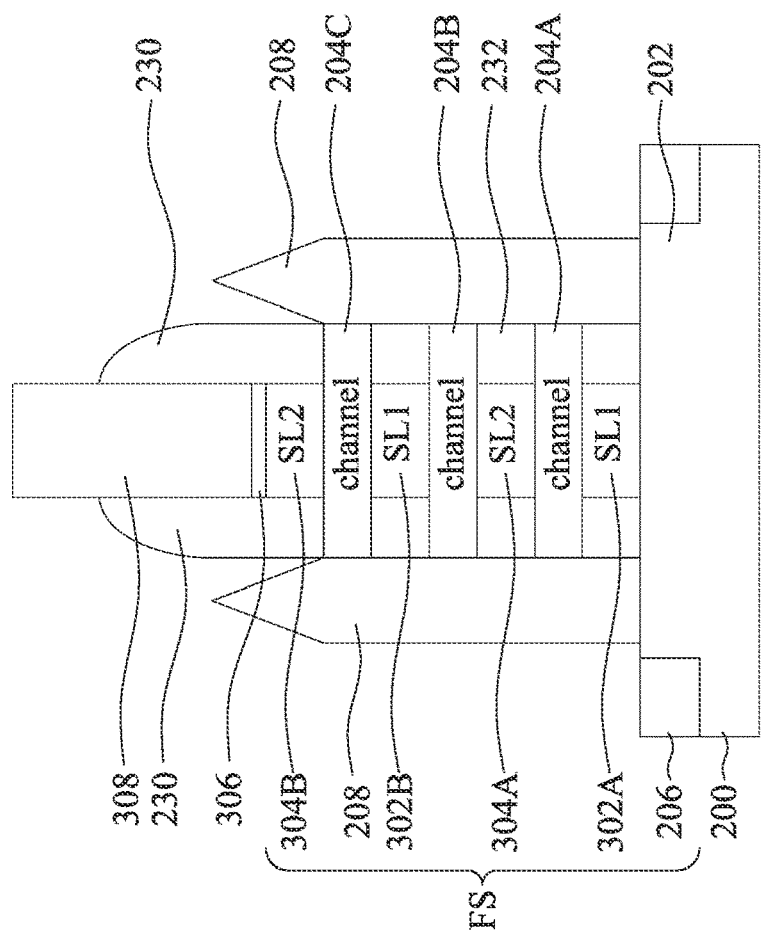
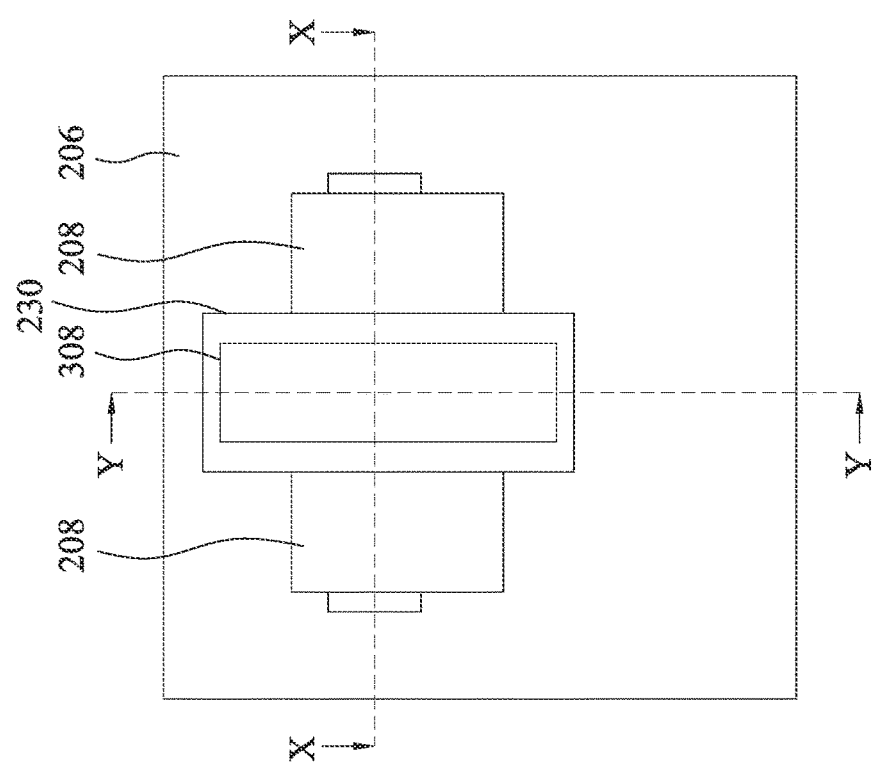
Fig. 14B
Fig. 14A

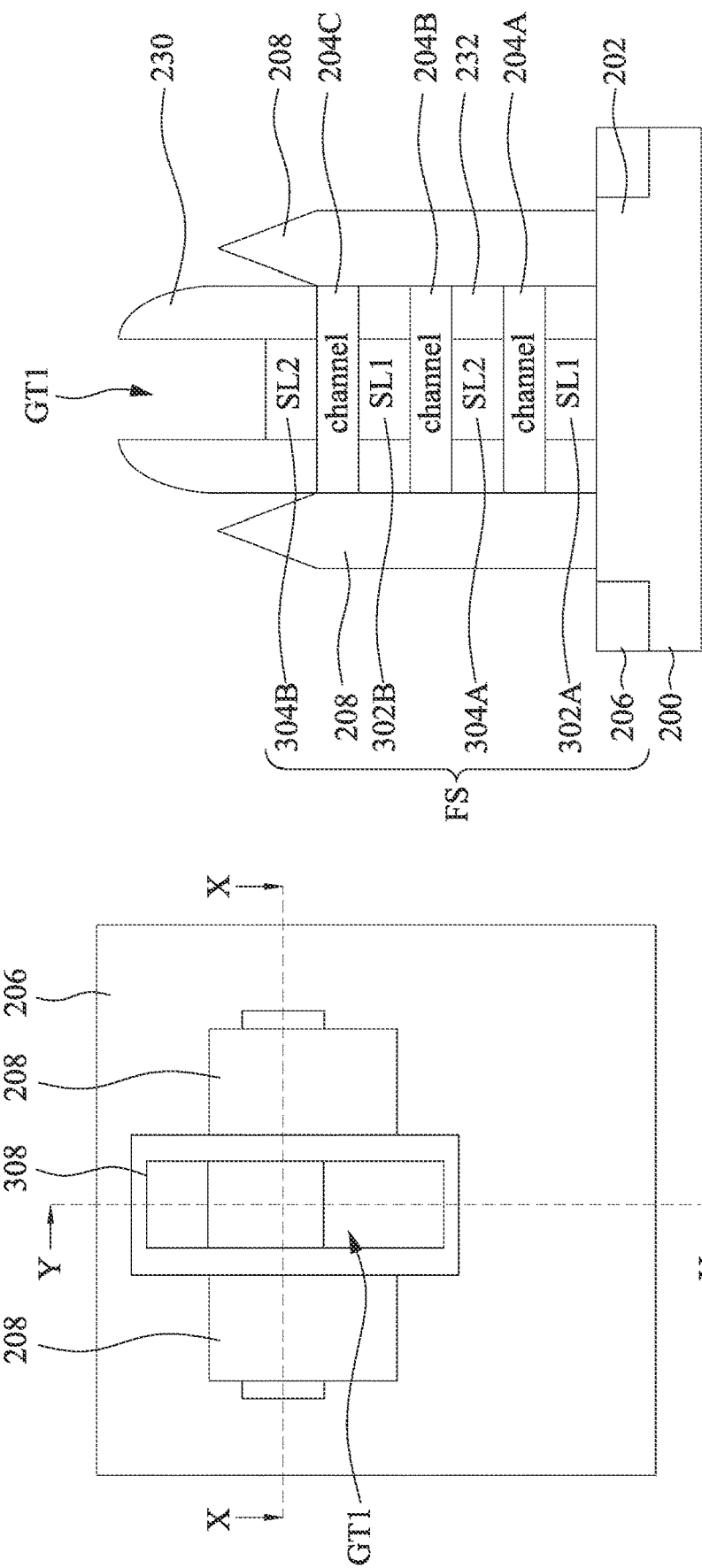

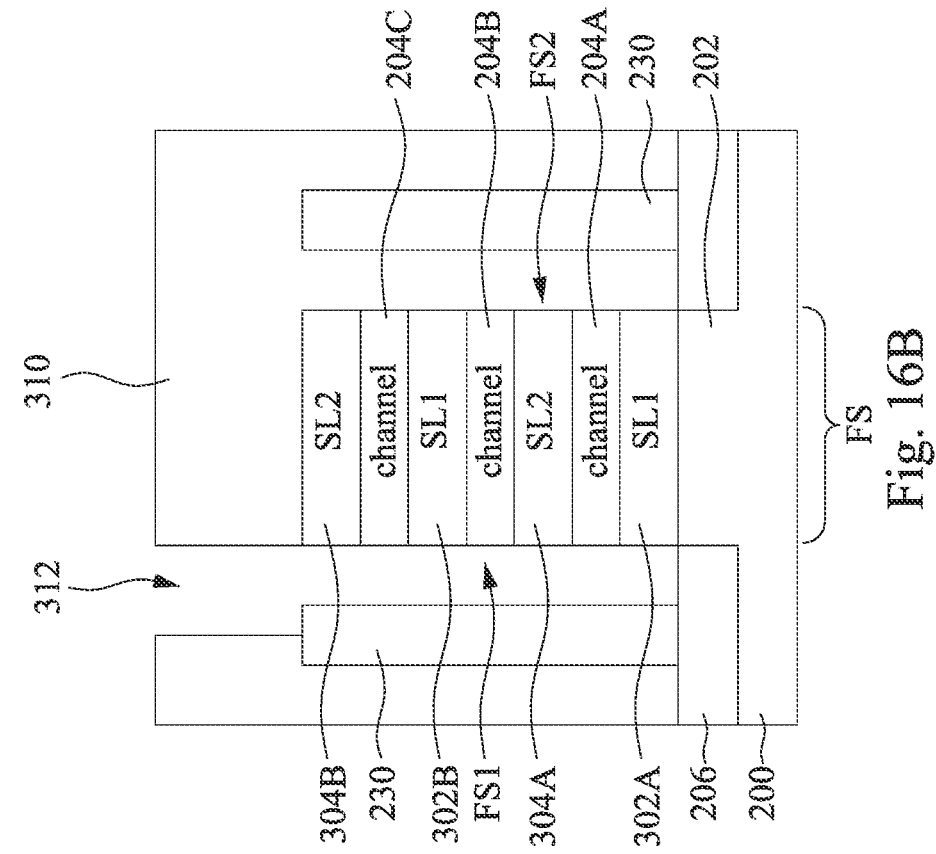
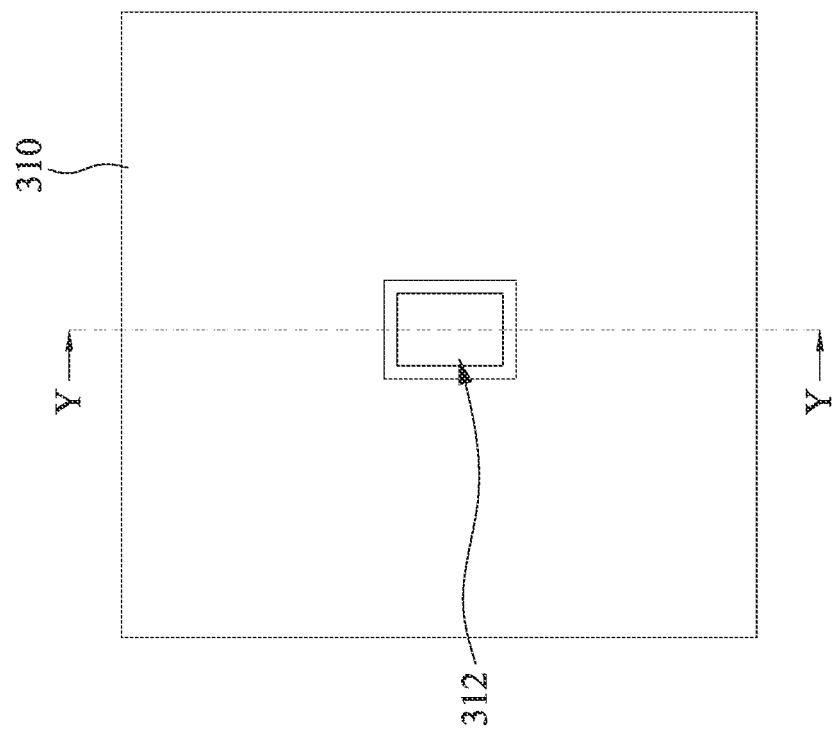
Fig. 16B
Fig. 16A

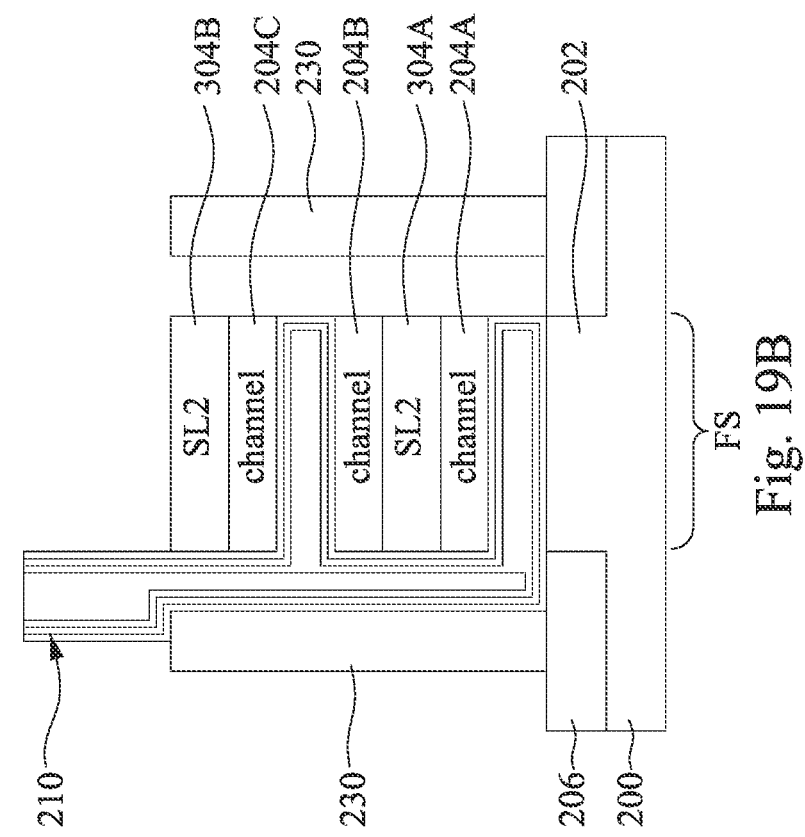
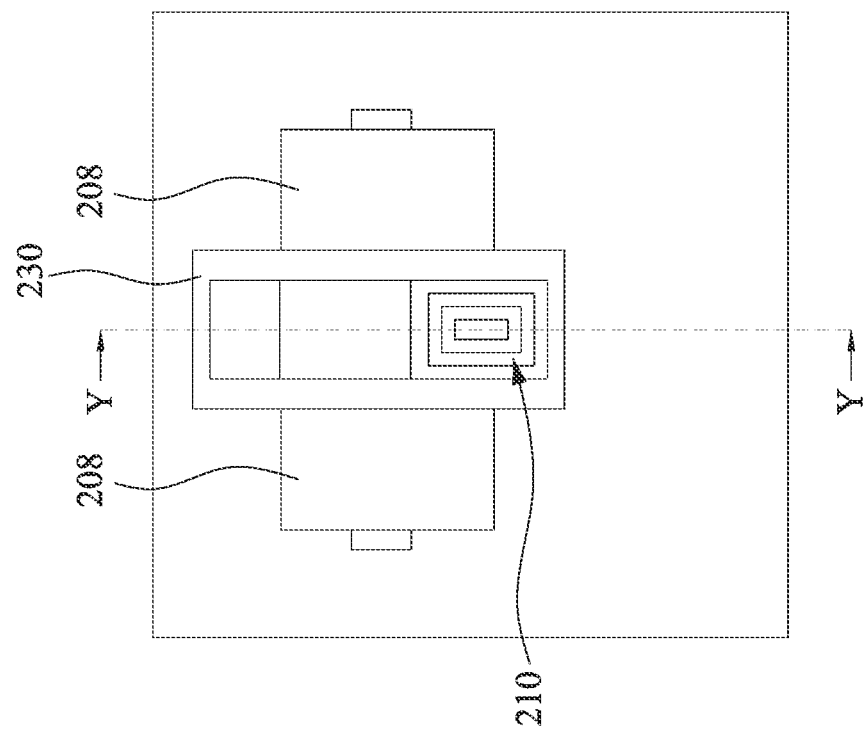
Fig. 19B
Fig. 19A

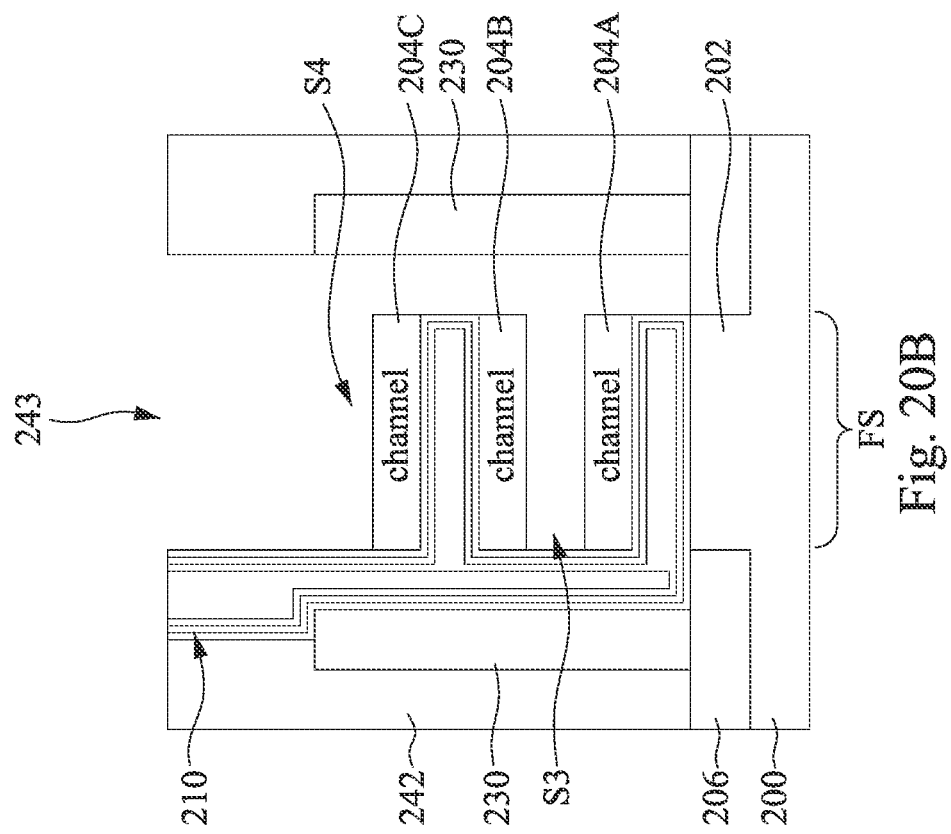
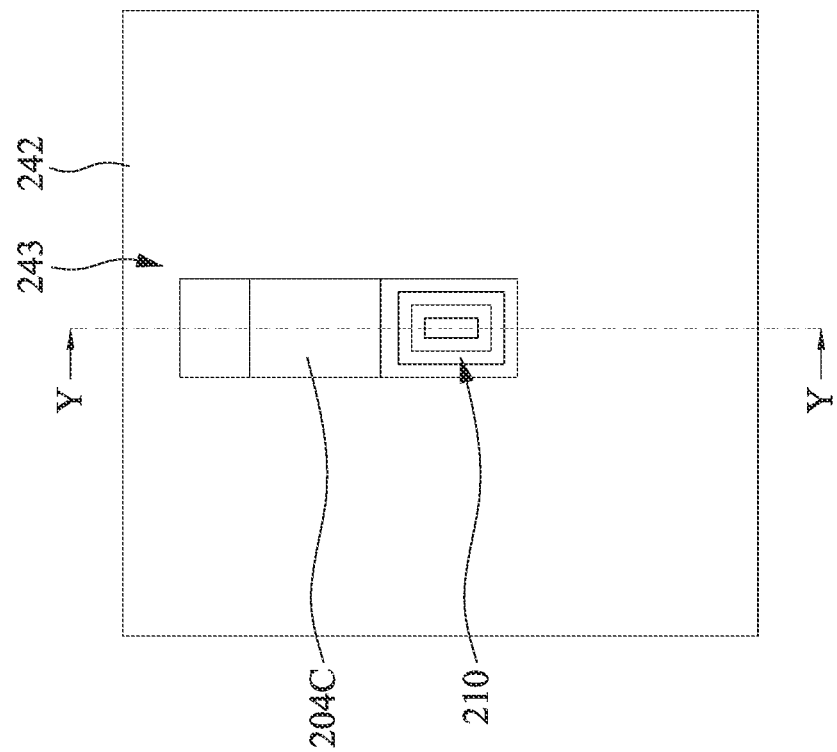
Fig. 20B
Fig. 20A

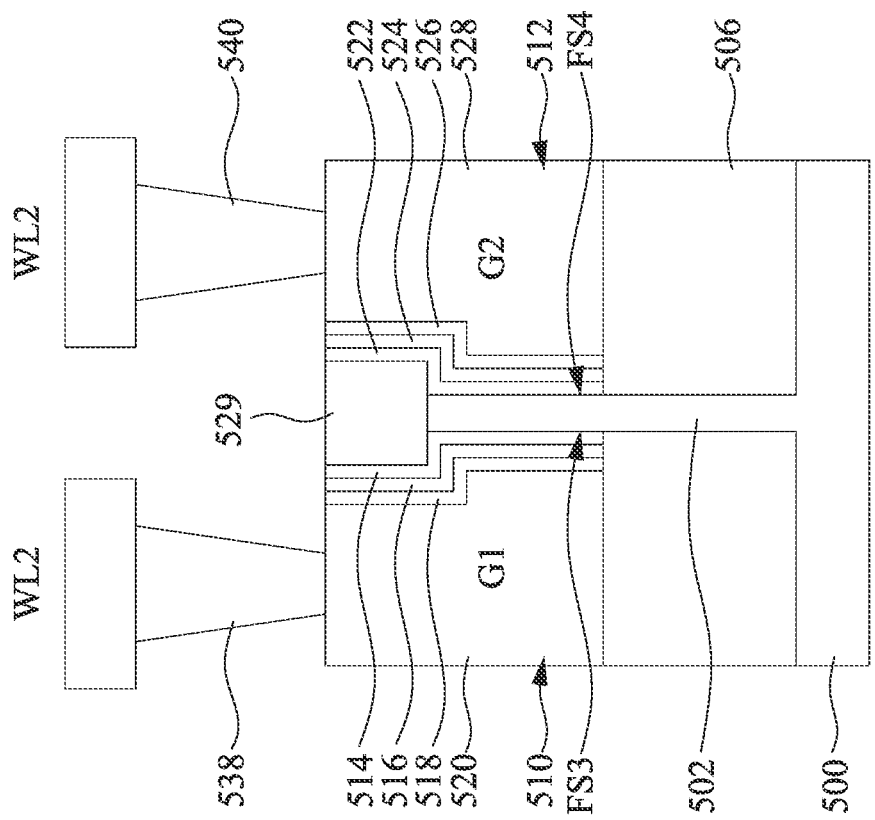
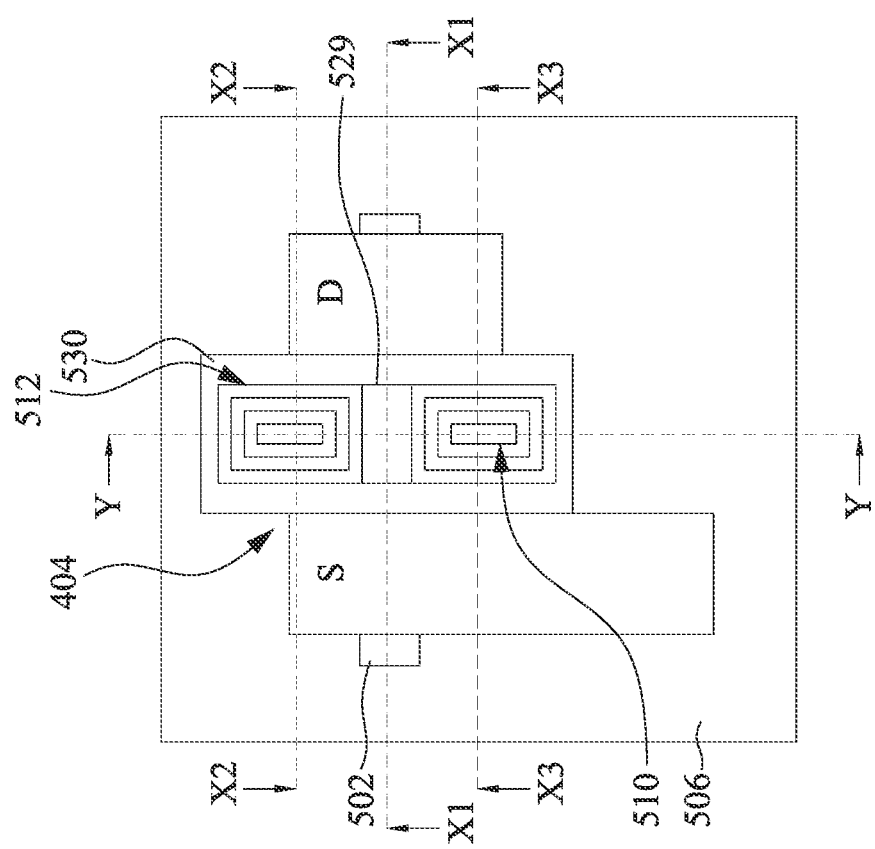
Fig. 30B
Fig. 30A

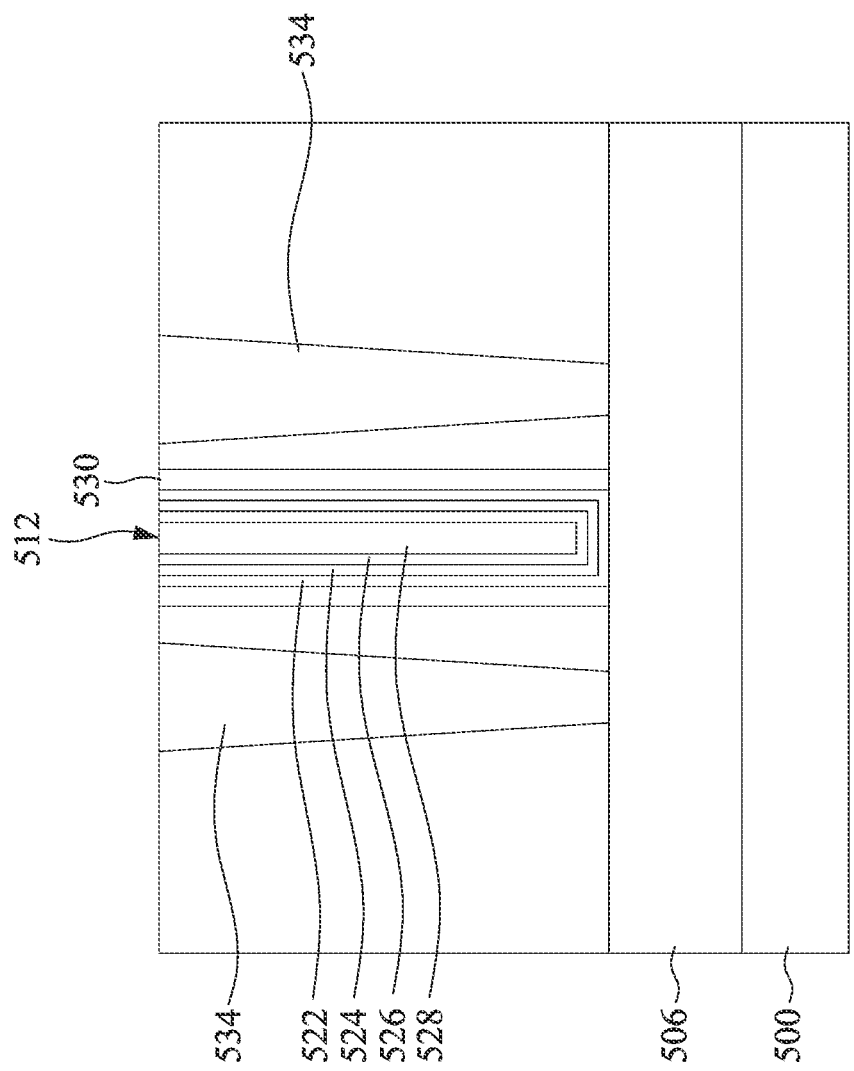

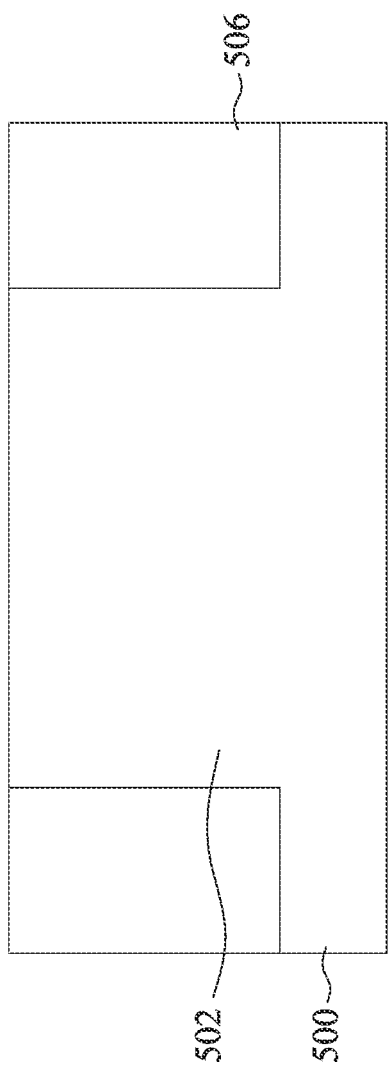

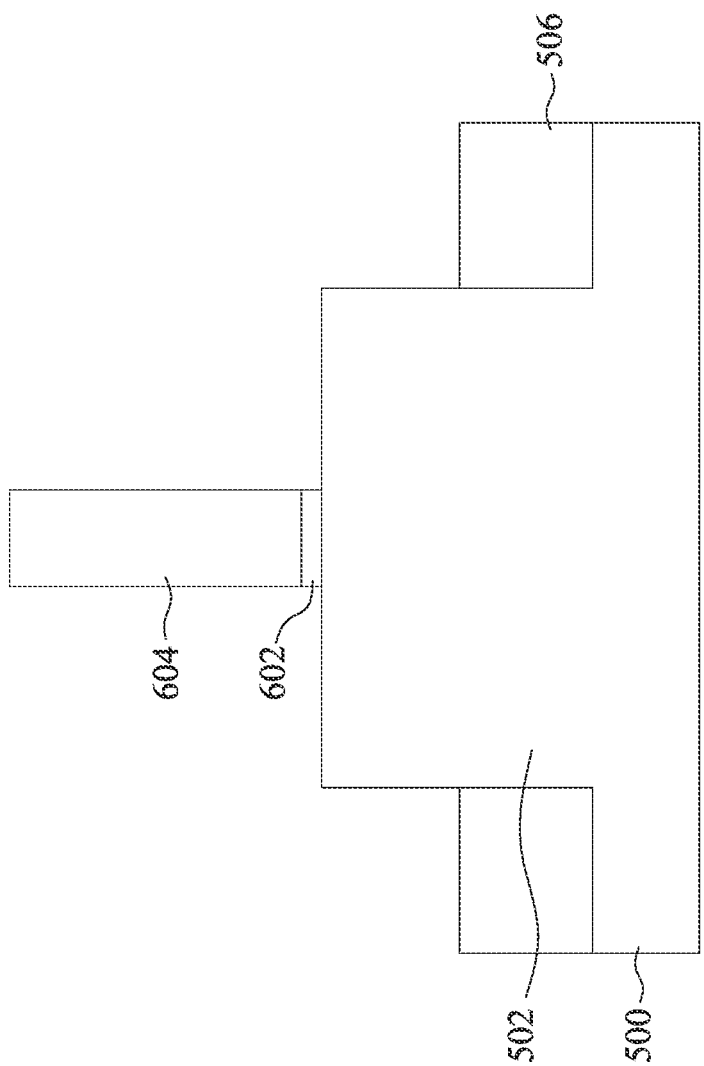

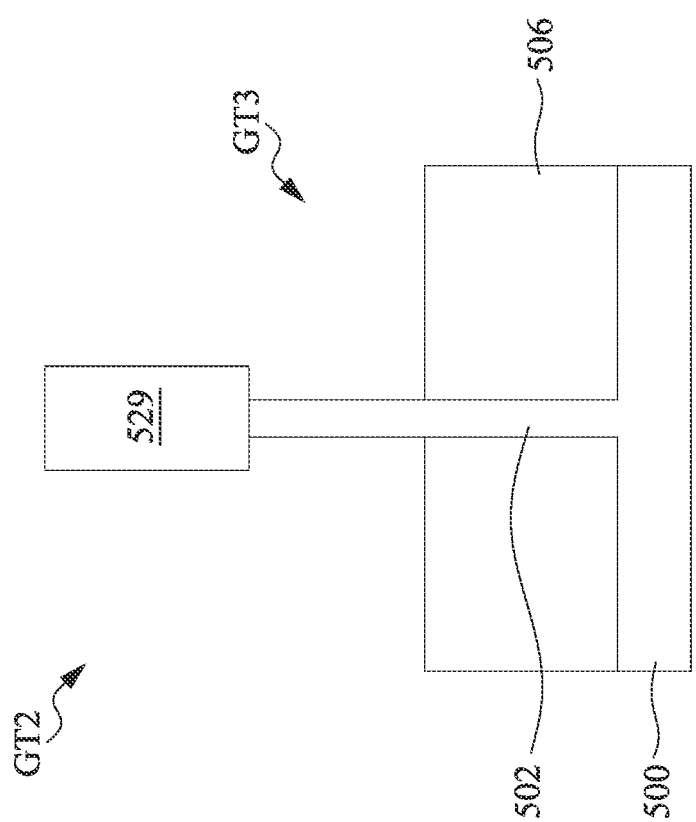

INTEGRATED CIRCUIT STRUCTURE AND FABRICATION THEREOF

PRIORITY CLAIM AND CROSS-REFERENCE

This application claims the benefit of U.S. Provisional Application No. 63/224,361, filed on Jul. 21, 2021, which application is hereby incorporated herein by reference in its entirety.

BACKGROUND

Magnetization switching using magnetic fields produced by current lines has been previously used for magnetic information storage or magnetic random access memory (MRAM) technology. More recently, magnetization switching by spin-polarized current (or by a mechanism called spin transfer) has been demonstrated for MRAM technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 illustrates a table about the AND gate logic function as shown in FIGS. 4A-4D.

FIG. 7 illustrates a table about the OR gate logic function as shown in FIGS. 6A-6D.

FIGS. 8A and 8B illustrate a refresh or initial operation of an MTJ cell in accordance with some embodiments of the present disclosure.

FIGS. 11A-29 are top views and cross-sectional views of intermediate stages in the manufacturing of an IC structure having 1T-1MTJ MRAM cells with logic functions, in accordance with some embodiments of the present disclosure.

FIG. 30A is a plan view of an integrated circuit (IC) structure zoomed-in to a fin-type MRAM access transistor, in accordance with some embodiments of the present disclosure.

FIG. 30B is a cross-sectional view of the IC structure of FIG. 30A obtained from a first cut, which is perpendicular to a longitudinal axis of the fin of the fin-type MRAM access transistor.

FIG. 30D is a cross-sectional view of the IC structure of FIG. 30A obtained from a third cut, which is along the longitudinal axis of the fin of the fin-type MRAM access transistor but offset from the fin.

DETAILED DESCRIPTION

Figure 1:
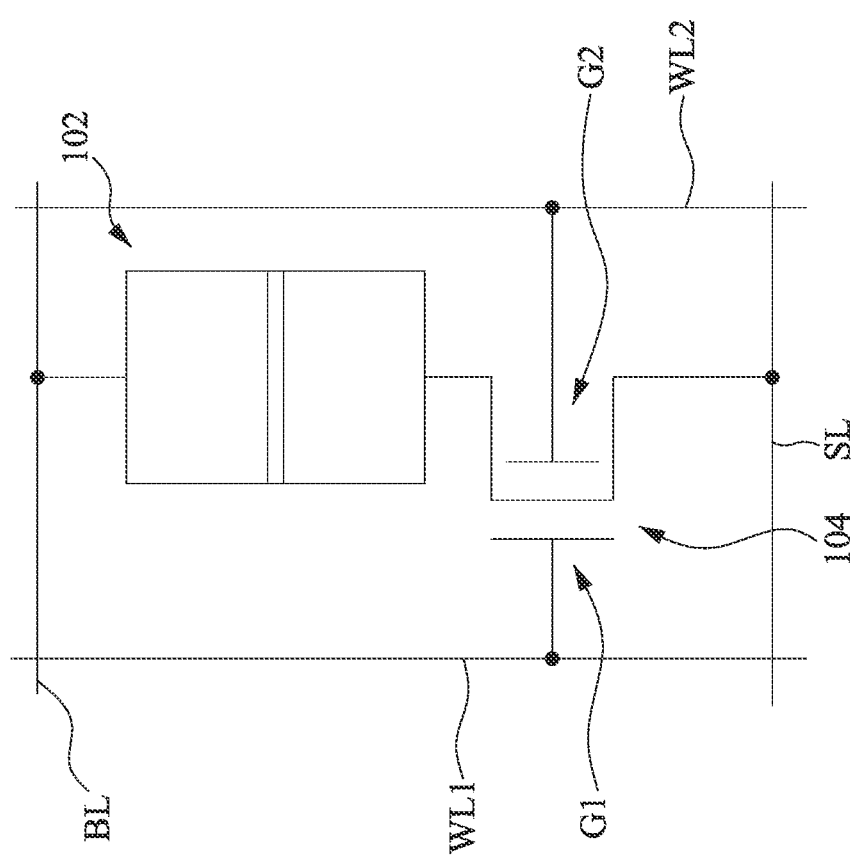
FIG. 1 illustrates a schematic view of an 1T-1MTJ MRAM memory cell in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may generally mean within 20 percent, or within 10 percent, or within 5 percent of a given value or range. Numerical quantities given herein are approximate, meaning that the term "around," "about," "approximately," or "substantially" can be inferred if not expressly stated. One skilled in the art will realize, however, that the values or ranges recited throughout the description are merely examples, and may be reduced with the down-scaling of the integrated circuits.

Magneto-resistive random-access memory (MRAM) cells each comprise a magnetic tunnel junction (MTJ) cell vertically arranged within an integrated chip back-end-of-the-line (BEOL) between conductive electrodes. An MTJ cell includes first and second ferromagnetic layers separated by a tunnel barrier layer. One of the ferromagnetic layers (often referred to as a "reference layer" or "pinned layer") has a fixed magnetization direction, while the other ferromagnetic layer (often referred to as a "free layer") has a variable magnetization direction. For MTJ cells with positive tunnelling magnetoresistance (TMR), if the magnetization directions of the reference layer and free layer are in a parallel orientation, it is more likely that electrons will tunnel through the tunnel barrier layer, such that the MTJ cell is in a low-resistance state. Conversely, if the magnetization directions of the reference layer and free layer are in an anti-parallel orientation, it is less likely that electrons will tunnel through the tunnel barrier layer, such that the MTJ cell is in a high-resistance state. Consequently, the MTJ cell can be switched between two states of electrical resistance, a first state with a low resistance ($R_P$: magnetization directions of reference layer and free layer are parallel) and a second state with a high resistance ($R_{AP}$: magnetization directions of reference layer and free layer are anti-parallel). It is noted that MTJ cells can also have a negative TMR, e.g., lower resistance for anti-parallel orientation and higher resistance for parallel orientation, and though the following description is written in the context of positive TMR based MTJ cells, it will be appreciated the present disclosure is also applicable to MTJ cells with a negative TMR.

Because of their binary nature, MTJ cells can be used to store digital data, with the low resistance state $R_P$ corresponding to a first data state (e.g., logical "0"), and the high-resistance state $R_{AP}$ corresponding to a second data state (e.g., logical "1"). In some embodiments, to read data from such an MRAM cell, the MTJ cell's resistance $R_{MTJ}$ (which can vary between $R_P$ and $R_{AP}$, depending on the data state that is stored) can be compared to a reference cell's resistance, $R_{Ref}$ (where $R_{Ref}$, for example, is designed to be in between $R_P$ and $R_{AP}$, for instance an average). In some techniques, a given read voltage $V_{Read}$ is applied to the MRAM cell and to the reference cell. This read voltage results in a read current flowing through the MTJ cell ($I_{read}$) and a reference current flowing through the reference cell ($I_{Ref}$). If the MTJ cell is in a parallel state, the read current $I_{read}$ has a first value ($I_{read-P}$) greater than $I_{Ref}$; while if the MTJ cell is in an anti-parallel state, the read current $I_{read}$ has a second value ($I_{read-AP}$) that is less than $I_{Ref}$. Thus, during a read operation, if $I_{Read}$ is greater than $I_{Ref}$, then a first digital value (e.g., "0") is read from the MRAM cell. On the other hand, if $I_{MTJ}$ is less than $I_{Ref}$ for the read operation, then a second digital value (e.g., "1") is read from the MRAM cell.

Each MRAM cell includes a MTJ cell and an access transistor serving to access the MTJ cell (e.g., to read data from the MTJ cell and/or write data to the MTJ cell). A Gate terminal of the access transistor is coupled to a word line, a source terminal of the access transistor is coupled to a source line, a drain terminal of the access transistor is coupled to one end of the MTJ cell, and another end of the MTJ cell is coupled to a bit line. To write data to an MRAM cell, a current greater than a critical current ($I_c$) required to switch a magnetization direction of free layer is provided through the MTJ cell. Currents that are not greater than the critical current will not cause a switching in the magnetization direction of free layer and therefore not write data to the MRAM cell. During a write operation, a voltage greater than a threshold voltage of the access transistor is applied to the word line, thereby turning on the access transistor to form a conductive path between the source line and the MTJ cell. The bit line voltage and the source line voltage thus form a potential difference that causes a current, which is greater than the critical current, to flow through the MTJ cell. During a read operation, a voltage is again applied to the word line to turn on the access transistor. The source line voltage and the bit line voltage thus form a potential difference that causes a read current to pass through the MTJ cell. The read current passing through the MTJ cell has a value that is dependent upon a resistance state of the MTJ cell. For example, if the MTJ cell is in a low-resistance state (e.g., storing a logical "0") the read current will be greater than if the MTJ cell is in a high-resistance state (e.g., storing a logical "1"). In this case, each MTJ cell is accessed by a single transistor, and thus this type of MRAM architecture is called 1T-1MTJ memory cell.

The present disclosure, in some embodiments, provides 1T-1MTJ MRAM cells with AND logic functions and/or OR logic functions, by using access transistors each having multiple independent gates coupled to different inputs. As a result, each 1T-1MTJ MRAM cell not only serves as a memory device for storing data, but also serves as a logic device for performing logic computation, which in turn realizes in-memory computing using a single 1T-1MTJ MRAM cell. Because logic operations can be performed using a single 1T-1MTJ MRAM cell, device numbers required for logic operations can be reduced. Moreover, the logic operation results of each MRAM cell can be stored in its MTJ cell, so that data transfer between memory devices and logic devices can be skipped.

FIG. 1 illustrates a schematic view of an 1T-1MTJ MRAM memory cell in accordance with some embodiments of the present disclosure. The MTJ memory cell includes a magnetic tunnel junction (MTJ) cell 102 and an access transistor 104. A bit line BL is coupled to one end of the MTJ cell 102, and a source line SL is coupled to an opposite end of the MTJ cell 102 through the access transistor 104. A first word line WL1 is coupled to a first gate terminal G1 of the access transistor 104. A second word line WL2 is coupled to a second gate terminal G2 of the access transistor 104. Thus, application of a suitable first word line voltage to the first gate terminal G1 and/or a suitable second word line voltage to the second gate terminal G2 of the access transistor 104 can turn on the access transistor 104, thereby allowing a current flowing though the MTJ cell 102.

When applying a given bit line voltage to the bit line BL and a given source line voltage to the source line SL, the current flowing through the MTJ cell 102 may depend on how many gates of the access transistor 104 are supplied with high voltage $V_{DD}$ by corresponding word lines. This may be due to that a drain current of the access transistor 104 is in positive correlation with an equivalent gate voltage of the access transistor 104 (i.e., net effect of voltages applied to gates terminals G1, G2). Once the current flowing through the MTJ cell 102 is greater than the critical current required to switch a magnetization direction of free layer in the MTJ cell 102, the magnetization direction of free layer can be switched, which in turn allows the MTJ cell 102 to be switched between two states of electrical resistance, a first state with a low resistance ($R_P$: magnetization directions of reference layer and free layer are parallel) and a second state with a high resistance ($R_{AP}$: magnetization directions of reference layer and free layer are anti-parallel). As a result, the resistance state of the MTJ cell 102 depends on the voltages applied to the first and second word lines WL1 and WL2, and therefore the voltages applied to the first and second word lines WL1 and WL2 can serve as two inputs of an AND gate or an OR gate, and the resistance state of the MTJ cell 102 can serve as an output of the AND gate or the OR gate. The 1T-1MTJ MRAM cell can thus perform an AND2 logic function or an OR2 logic function.

Figure 2B:
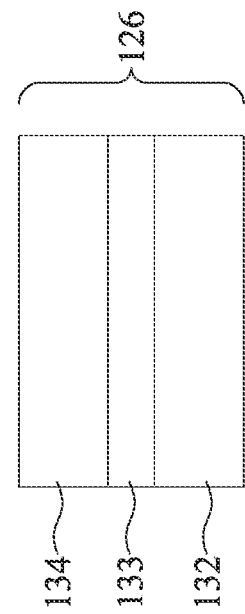
FIG. 2B is a cross-sectional view illustrating an SAF layer in the MTJ cell in accordance with some embodiments of the present disclosure.
Figure 2A:
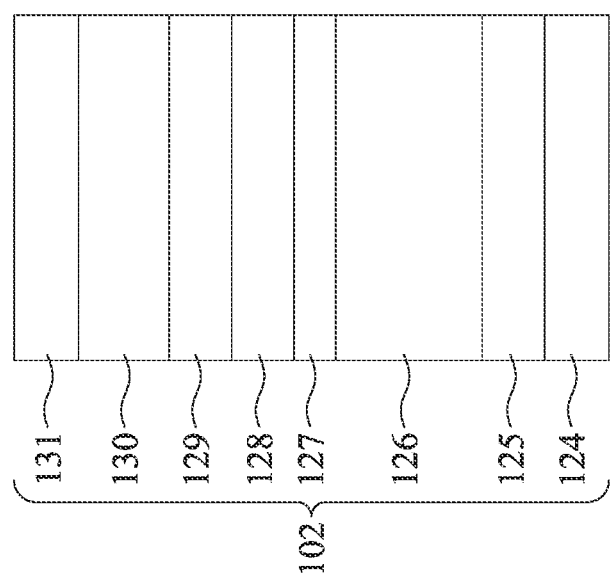
FIG. 2A is a cross-sectional view illustrating a film stack of an MTJ cell in accordance with some embodiments of the present disclosure.

FIG. 2A is a cross-sectional view illustrating a film stack of an MTJ cell 102 in accordance with some embodiments of the present disclosure. The MTJ cell 102 includes a bottom electrode 124 coupled to the drain terminal of the access transistor 104. In some embodiments, the bottom electrode 124 includes Ta, TaN, W, Ru, the like, and/or alloys thereof. The bottom electrode 124 has a thickness in a range from about 1 nm to about 50 nm. The MTJ cell 102 further includes a seed layer 125 over the bottom electrode 124. The seed layer 125 includes Pt, Ta, Ru, the like, and/or alloys thereof, and has a thickness in a range from about 1 nm to about 50 nm.

The MTJ cell 102 further includes a pinned layer 126 formed over the seed layer 125. In some embodiments, the pinned layer 126 is a synthetic anti-ferromagnetic (SAF) layer. The SAF layer 126 can serve to pin the magnetization direction of the reference layer 128 in a fixed direction. Pinning the magnetization direction of the reference layer 128 allows the MTJ cell 102 of to be toggled between the low-resistance state and the high-resistance state by changing the magnetization direction of the free layer 130 relative to the reference layer 128.

The SAF layer 126 may include multiple layers of different materials, in some embodiments. For example, the SAF layer 126 may comprise a stack of one or more ferromagnetic layers and one or more non-magnetic layers. For example, as illustrated in FIG. 2B, the SAF layer 126 may include two ferromagnetic layers 132 and 134 and a non-magnetic spacer layer 133 sandwiched between the ferromagnetic layers 132 and 134, or may be a stack of alternating non-magnetic layers and ferromagnetic layers. In some embodiments, the ferromagnetic layers 132 and 134 may be formed of a material such as Co, Pt, Fe, Ni, CoFe, NiFe, CoFeB, CoFeBW, alloys thereof, the like, or combinations thereof. For example, the ferromagnetic layers 132 and 134 each are a multilayer structure made of (Co/Pt)n, (Co/Ni)n or the like where n is the number of laminates (e.g., n ranges from about 1-10), and a total thickness of the multilayer structure is in a range from about 0.1 nm to about 50 nm. In some embodiments, the non-magnetic spacer layer 133 may be formed of material such as Ru, Ir, W, Ta, Mg, the like, or combinations thereof, and include a thickness in a range from about 0.1 nm to about 5 nm. In some embodiments, a thicker SAF layer 126 may have stronger antiferromagnetic properties, or may be more robust against external magnetic fields or thermal fluctuation.

The MTJ cell 102 further includes a metal spacer layer 127 formed over the pinned layer 126. In some embodiments, the metal spacer layer 127 may be formed of material such as Ta, W, Mo, the like, or combinations thereof, and include a thickness in a range from about 0.1 nm to about 1 nm. The MTJ cell 102 includes a reference layer 128 formed over the metal spacer layer 127. The reference layer 128 may be formed of a ferromagnetic material, such as one or more layers of CoFe, NiFe, CoFeB, CoFeBW, alloys thereof, the like, or combinations thereof. The reference layer 128 has a thickness in a range from about 0.1 nm to about 5 nm. The ferromagnetic reference layer 128 has a magnetization direction that is "fixed," because the magnetization direction of the reference layer 128 is pinned by the pinned layer 126.

The MTJ cell 102 includes a tunnel barrier layer 129 formed over the reference layer 128. The tunnel barrier layer 129 is thin enough to allow quantum mechanical tunneling of current between the ferromagnetic reference layer 128 and the ferromagnetic free layer 130. In some embodiments, the tunnel barrier layer 129 can comprise crystalline barrier, such as manganese oxide (MgO) or spinel ($MgAl_2O_4$ a.k.a. MAO); or an amorphous barrier, such as aluminum oxide ($AlO_x$) or titanium oxide ($TiO_x$) In some embodiments, the tunnel barrier layer 129 has a thickness in a range from about 0.1 nm to about 10 nm.

The MTJ cell 102 includes a free layer 130 having a magnetization direction which is free to be switched by a spin transfer process when MTJ cell 102 receives a current higher than or equal to a critical current that is sufficient to switch the magnetization direction of the free layer 130. Therefore, the free layer 130 is capable of changing its magnetization direction between one of two magnetization states, which cause two different MTJ resistances that correspond to the binary output of the AND gate logic or the OR gate logic. In some embodiments, the free layer 130 can comprise a magnetic metal, such as iron, nickel, cobalt and alloys thereof, for example. For instance, in some embodiments, the free layer 130 can comprise cobalt, iron, and boron, such as a CoFeB ferromagnetic free layer. In some embodiments, the free layer 130 is a multilayer structure including a stack of a CoFeB layer, a metal spacer layer, and another CoFeB layer. The MTJ cell 102 further includes a capping layer 131 formed over the free layer 130. In some embodiments, the capping layer 131 includes Ta, Ru, MgO, the like, or combinations thereof.

Figure 3A:
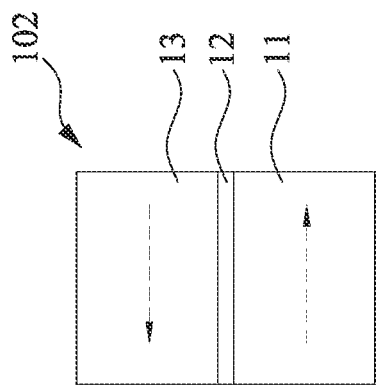
FIGS. 3A and 3B show operations of an MTJ cell having in-plane easy magnetization axes, in accordance with some embodiments of the present disclosure.
Figure 3B:
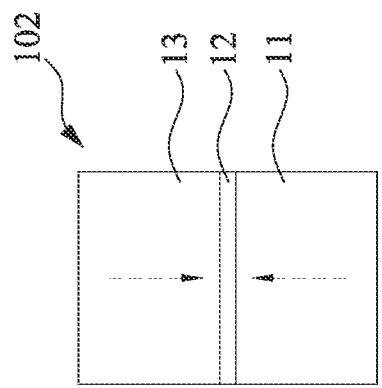

FIGS. 3A and 3B show an operation of the MTJ cell 102. As shown in FIGS. 3A and 3B, the MTJ cell 102 includes a reference layer 11 having a fixed magnetization direction, a tunnel barrier layer 12 and a free magnetic layer 13 having a variable magnetization direction. The reference layer 11 corresponds to the reference layer 128 or a combination of the pinned layer 126, the metal spacer layer 127 and the reference layer 128 of FIG. 2A. The tunnel barrier layer 12 corresponds to the tunnel barrier layer 129 of FIG. 2A and the free layer 13 corresponds to the free layer 130 of FIG. 2A.

Figure 3C:
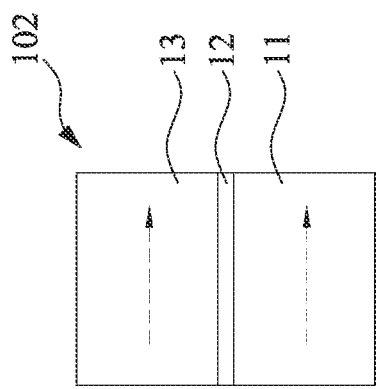
FIGS. 3C and 3D show operations of an MTJ cell having perpendicular easy magnetization axes, in accordance with some embodiments of the present disclosure.
Figure 3D:
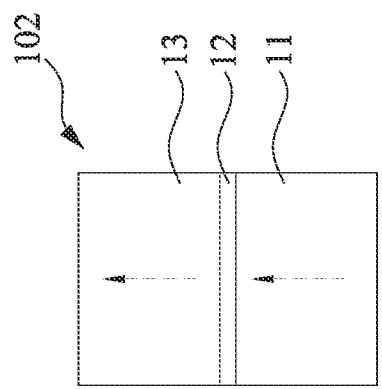

In FIG. 3A, the reference layer 11 and the free layer 13 are magnetically oriented in a same direction, which means the magnetization directions of the reference layer 11 and free layer 13 are parallel. In FIG. 3B, the reference layer 11 and the free layer 13 are magnetically oriented in opposite directions, which means the magnetization directions of the reference layer 11 and free layer 13 are anti-parallel. In FIGS. 3A and 3B, the magnetization directions are horizontal (parallel to the surfaces of the MTJ layers) and the magnetization direction of the free magnetic layer 13 changes between the left-to-right direction (as shown in FIG. 3A) and the right-to-left direction (as shown in FIG. 3B). That is, directions of easy magnetization axes of the reference layer 11 and the free layer 13 are in-plane. In other embodiments, as illustrated in FIGS. 3C and 3D, the magnetization directions are perpendicular to the surfaces of the MTJ layers, and the magnetization direction of the free layer 13 changes between the upward direction (as shown in FIG. 3C) and the downward direction (as shown in FIG. 3D).

When a current passes in a perpendicular direction through a plane of the reference layer 11 and the free layer 13. The reference layer 11 polarizes the spin of the electrons that are transmitted through the layer, and this flow of incoming spins transfers the transverse part of the spin angular momentum to the local magnetization of the free layer 13. When the current is sufficiently large, it pumps a precessional motion of the free layer 13 magnetization, which can be switched to either parallel (as shown in FIG. 3A or 3C) or antiparallel (as shown in FIG. 3B or 3D) to the reference layer 11 magnetization, depending on the magnitude and polarity of the current. The resistance of a same-oriented MTJ cell shown in FIG. 3A or 3C is less than the resistance of an opposite-oriented MTJ cell shown in FIG. 3B or 3D, and thus the MTJ cell have a low resistance state $R_P$ corresponding to a first data state (e.g., logical "0"), and a high-resistance state $R_{AP}$ corresponding to a second data state (e.g., logical "1"). Such binary logic data ("0" and "1") can serve as output of an AND gate or an OR gate and be stored in the MTJ cell. Further, since the stored data does not require a storage energy source, the logic operation result is non-volatile.

FIGS. 4A-4D illustrate AND gate logic operations performed using an 1T-1MTJ MRAM cell in accordance with some embodiments of the present disclosure. In some embodiments, an initial state of the magnetization directions of the pinned layer 11 and the free layer 13 are parallel. A false state for a word line input voltage $V_{WL1}, V_{WL2}$ is 0 Volt (V) and a true state for a word line input voltage $V_{WL1}, V_{WL2}$ is $V_{DD}$ (e.g., about 0.3V-5V) higher than 0V. A false state for the MTJ output resistance $R_{MTJ}$ is a first binary value of "0" or a low resistance $R_P$, and a true state for the MTJ output resistance $R_{MTJ}$ is a second binary value of "1" or a high resistance $R_{AP}$. In other embodiments, true and false states as described above may be reversed from one another without departing from the scope of the present disclosure. The logic operations in FIGS. 4A-4D are performed when applying 0V to the bit line and $V_{DD}$ to the source line.

Figure 4A:
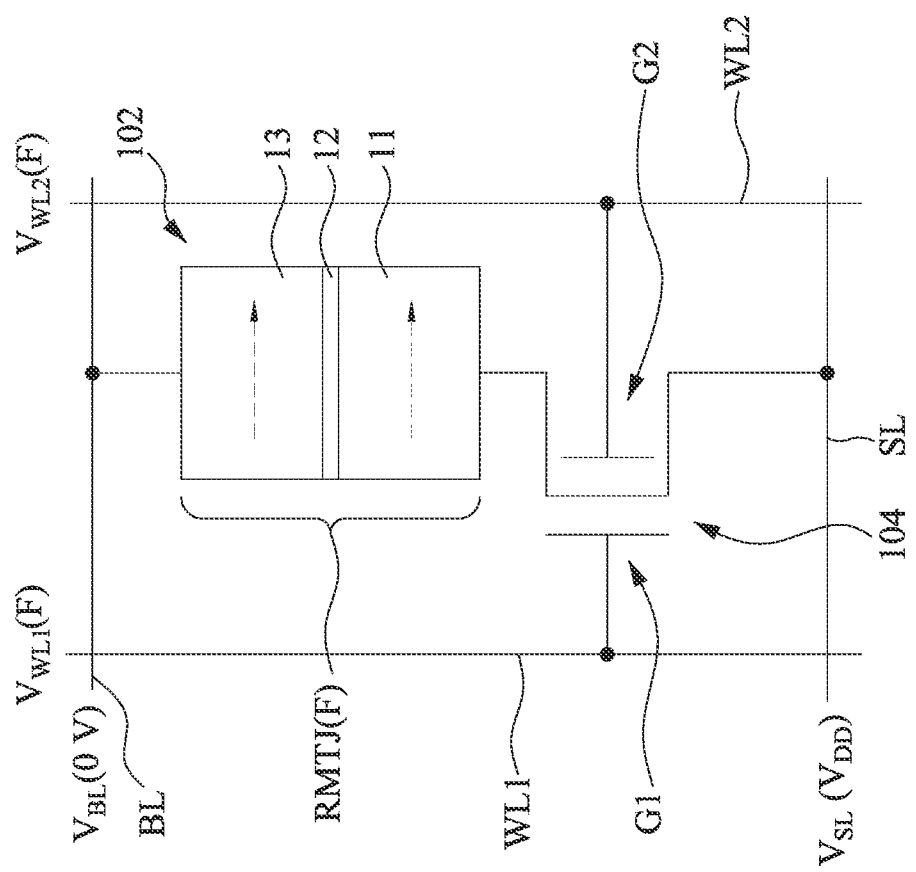
FIGS. 4A-4D illustrate AND gate logic operations performed using an 1T-1MTJ MRAM cell in accordance with some embodiments of the present disclosure.

In FIG. 4A, when the first and second input voltages $V_{WL1}, V_{WL2}$ applied to the first and second word lines WL1 and WL2 are 0V, the access transistor 104 is not turned on, and thus the magnetization direction of the free layer 13 is unchanged and thus not switched, so that the magnetization directions of the reference layer 11 and the free layer 13 remain parallel. In this case, the output resistance $R_{MTJ}$ of the MTJ cell is a first binary level or a low resistance $R_P$. In other words, the input voltages $V_{WL1}, V_{WL2}$ may each be a false state or a binary value of "0," and the output resistance $R_{MTJ}$ may be a false state or a binary value of "0."

Figure 4B:
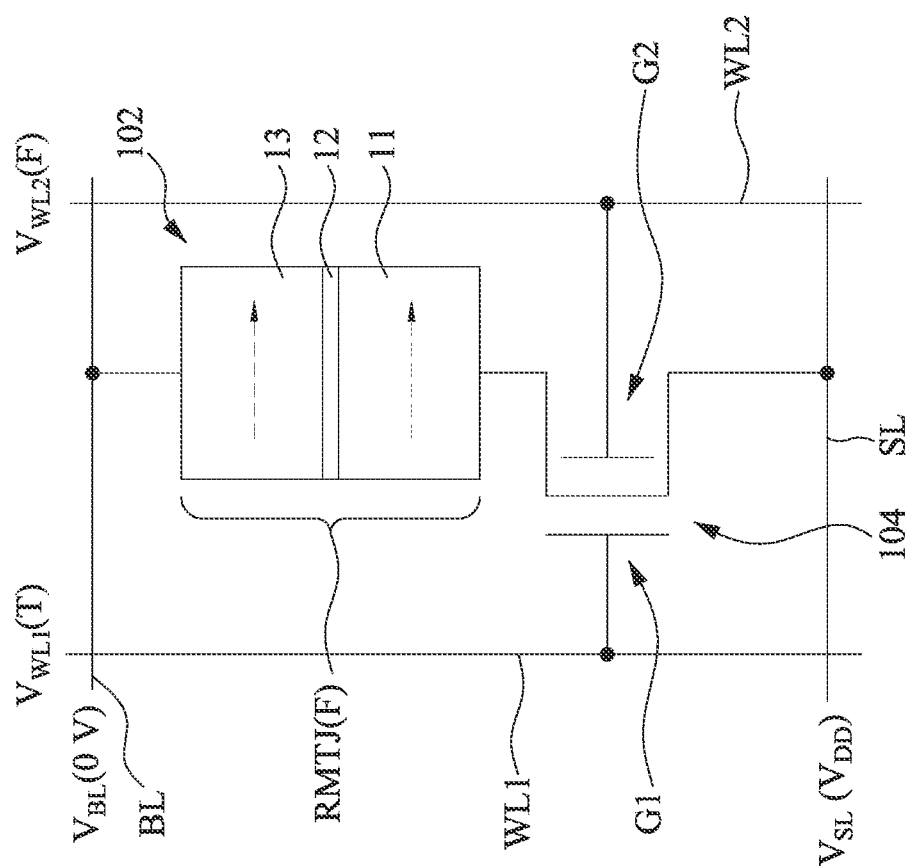

In FIG. 4B, when the first input voltage $V_{WL1}$ applied to the first word line WL1 is $V_{DD}$ greater than the threshold voltage of the access transistor 104, and the second input voltage $V_{WL2}$ applied to the second word line WL2 is 0V, the magnetization direction of the free layer 13 may not be switched because the current flowing through the MTJ cell 102 may be less than the critical current required to switch the magnetization direction of the free layer 13. In some embodiments, the critical current is in a range from about 1 µA to about 100 mA. Therefore, the magnetization directions of the reference layer 11 and the free layer 13 remain parallel. In this case, the output resistance $R_{MTJ}$ of the MTJ cell is a first binary level or a low resistance $R_P$. In other words, the first input voltage $V_{WL1}$ may be a true state or a binary value of "1," and the second input voltage $V_{WL2}$ may be a false state or a binary value of "0," and the output resistance $R_{MTJ}$ may be a false state or a binary value of "0."

Figure 4C:
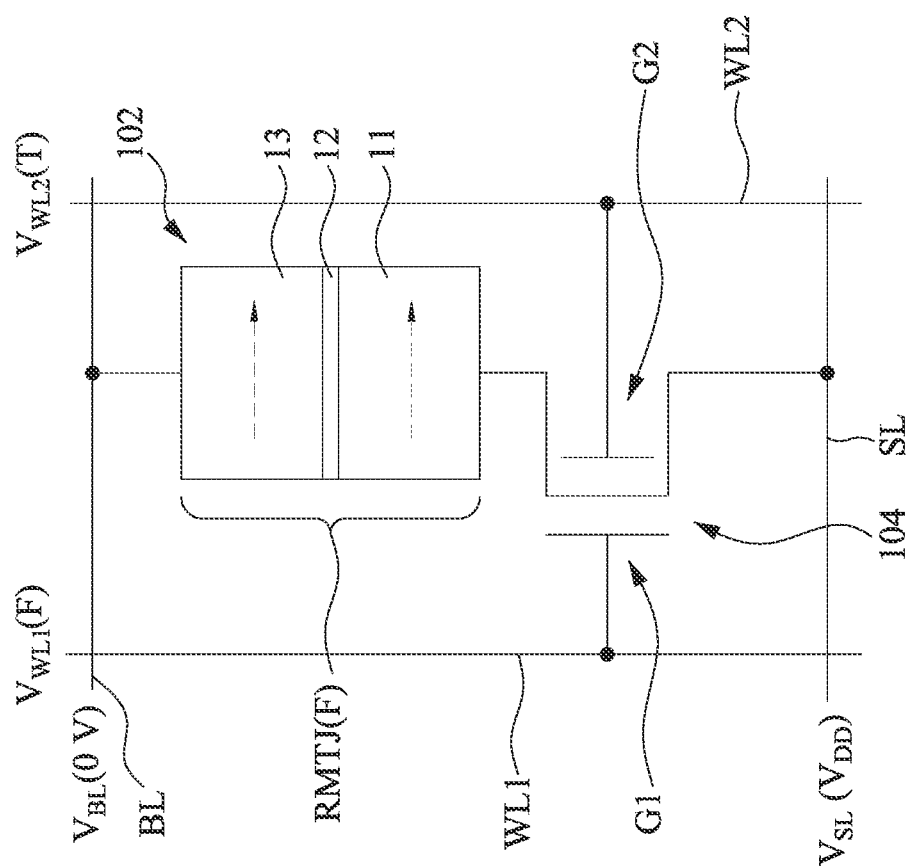

In FIG. 4C, when the first input voltage $V_{WL1}$ applied to the first word line WL1 is 0V, and the second input voltage $V_{WL2}$ applied to the second word line WL2 is $V_{DD}$ greater than the threshold voltage of the access transistor 104, the magnetization direction of the free layer 13 may not be switched because the current flowing through the MTJ cell 102 may be less than the critical current required to switch the magnetization direction of the free layer 13. Therefore, the magnetization directions of the reference layer 11 and the free layer 13 remain parallel. In this case, the output resistance $R_{MTJ}$ of the MTJ cell is a first binary level or a low resistance $R_P$. In other words, the first input voltage $V_{WL1}$ may be a false state or a binary value of "0," and the second input voltage $V_{WL2}$ may be a true state or a binary value of "1," and the output resistance $R_{MTJ}$ may be a false state or a binary value of "0."

Figure 4D:
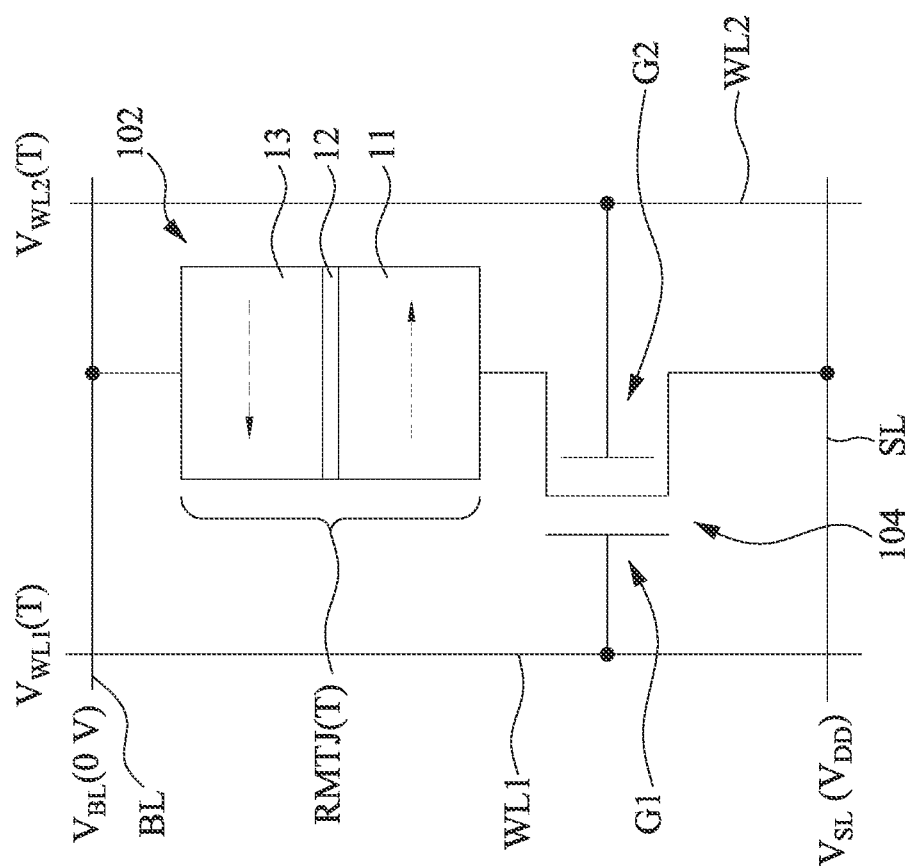

In FIG. 4D, when the first and second input voltages $V_{WL1}, V_{WL2}$ applied to the first and second word lines WL1 and WL2 are both $V_{DD}$ greater than the threshold voltage of the access transistor 104, the access transistor 104 is turned on and the magnetization direction of the free layer 13 is switched, because the current flowing through the MTJ cell 102 is greater than or equal to the critical current required to switch the magnetization direction of the free layer 13. Therefore, the magnetization directions of the reference layer 11 and the free layer 13 become anti-parallel. In this case, the output resistance $R_{MTJ}$ of the MTJ cell 102 is a second binary level or a high resistance $R_{AP}$. In other words, the input voltages $V_{WL1}, V_{WL2}$ may each be a true state or a binary value of "1," and the output resistance $R_{MTJ}$ may be a true state or a binary value of "1."

In the logic operations in FIGS. 4A-4D as discussed above, the output resistance $R_{MTJ}$ of the MTJ cell 102 follows an AND gate logic, as illustrated in the table in FIG. 5. As illustrated in FIG. 5, a false output (logic "0") results if either input is false. A true output (logic "1") results only if both input voltages to the word lines WL1, WL2 are true inputs (logic "1"). The AND gate logic function effectively finds the minimum between two binary digits, and thus the output is 0 except when the inputs are each 1.

FIGS. 6A-6D illustrate OR gate logic operations performed using an 1T-1MTJ MRAM cell in accordance with some embodiments of the present disclosure. In some embodiments, an initial state of the magnetization directions of the pinned layer 11 and the free layer 13 are parallel. A false state for a word line input voltage $V_{WL1}, V_{WL2}$ is 0 Volt (V) and a true state for a word line input voltage $V_{WL1}, V_{WL2}$ is $V_{DD}$ higher than 0V. A false state for the MTJ output resistance $R_{MTJ}$ is a first binary value of "0" or a low resistance $R_P$, and a true state for the MTJ output resistance $R_{MTJ}$ is a second binary value of "1" or a high resistance $R_{AP}$. In other embodiments, true and false states as described above may be reversed from one another without departing from the scope of the present disclosure. The logic operations in FIGS. 6A-6D are performed when applying 0V to the bit line and $V_{DD}$ to the source line.

Figure 6A:
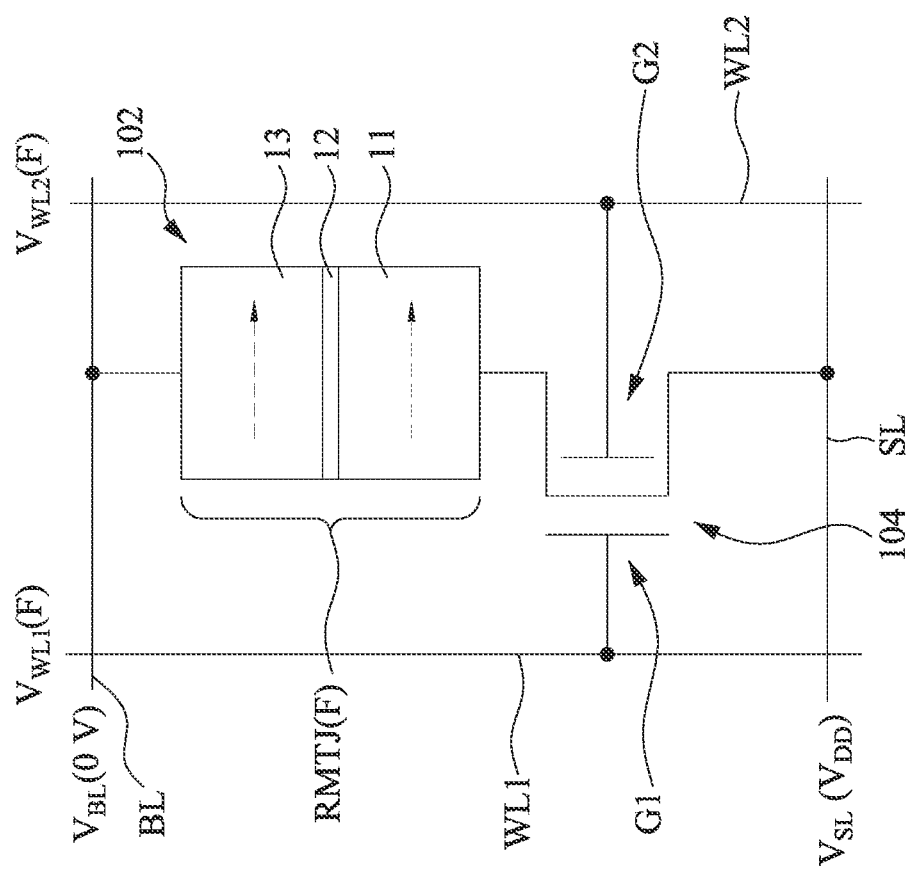
FIGS. 6A-6D illustrate OR gate logic operations performed using an 1T-1MTJ MRAM cell in accordance with some embodiments of the present disclosure.

In FIG. 6A, when the first and second input voltages $V_{WL1}, V_{WL2}$ applied to the first and second word lines WL1 and WL2 are 0V, the access transistor 104 is not turned on, and thus the magnetization direction of the free layer 13 is not switched, so that the magnetization directions of the reference layer 11 and the free layer 13 remain parallel. In this case, the output resistance $R_{MTJ}$ of the MTJ cell is a first binary level or a low resistance $R_P$. In other words, the input voltages $V_{WL1}, V_{WL2}$ may each be a false state or a binary value of "0," and the output resistance $R_{MTJ}$ may be a false state or a binary value of "0."

Figure 6B:
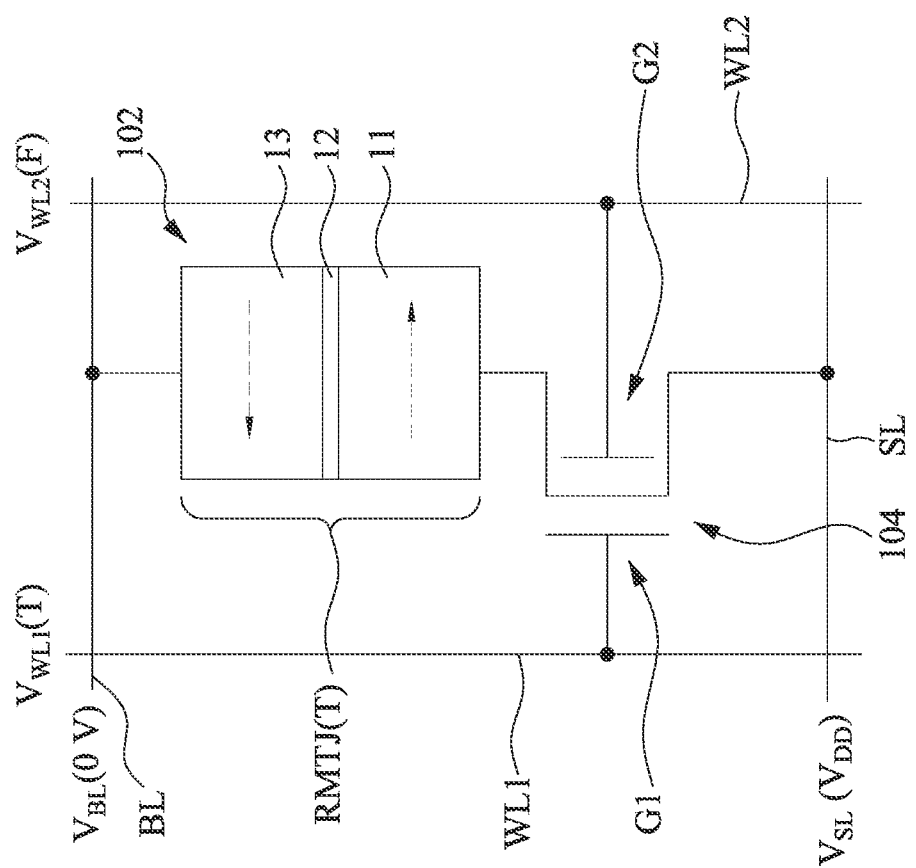

In FIG. 6B, when the first input voltage $V_{WL1}$ applied to the first word line WL1 is $V_{DD}$ greater than the threshold voltage of the access transistor 104, and the second input voltage $V_{WL2}$ applied to the second word line WL2 is 0V, the magnetization direction of the free layer 13 may be switched because the current flowing through the MTJ cell 102 may be greater than or equal to the critical current required to switch the magnetization direction of the free layer 13. Therefore, the magnetization directions of the reference layer 11 and the free layer 13 become anti-parallel. In this case, the output resistance $R_{MTJ}$ of the MTJ cell is a second binary level or a high resistance $R_{AP}$. In other words, the first input voltage $V_{WL1}$ may be a true state or a binary value of "1," and the second input voltage $V_{WL2}$ may be a false state or a binary value of "0," and the output resistance $R_{MTJ}$ may be a true state or a binary value of "1." In some embodiments, the critical current is in a range from about 1 μA to about 100 mA.

Figure 6C:
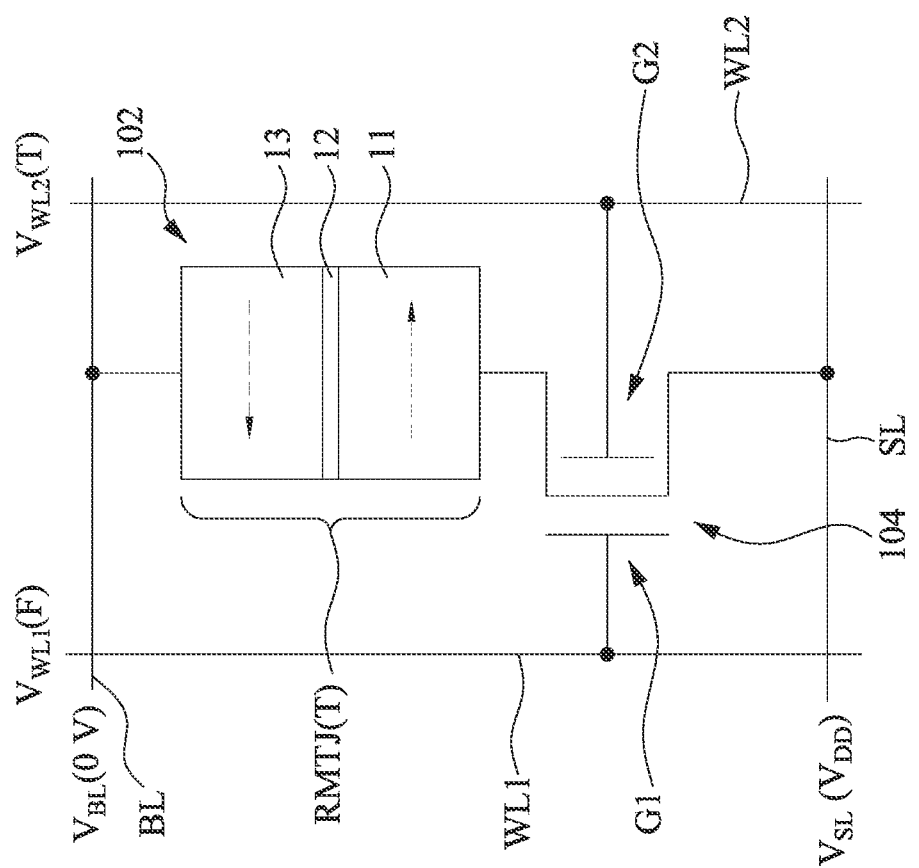

In FIG. 6C, when the first input voltage $V_{WL1}$ applied to the first word line WL1 is 0V, and the second input voltage $V_{WL2}$ applied to the second word line WL2 is $V_{DD}$ greater than the threshold voltage of the access transistor 104, the magnetization direction of the free layer 13 may be switched because the current flowing through the MTJ cell 102 may be greater than or equal to the critical current required to switch the magnetization direction of the free layer 13. Therefore, the magnetization directions of the reference layer 11 and the free layer 13 become anti-parallel. In this case, the output resistance $R_{MTJ}$ of the MTJ cell is a second binary level or a high resistance $R_{AP}$. In other words, the first input voltage $V_{WL1}$ may be a false state or a binary value of "0," and the second input voltage $V_{WL2}$ may be a true state or a binary value of "1," and the output resistance $R_{MTJ}$ may be a true state or a binary value of "1."

Figure 6D:
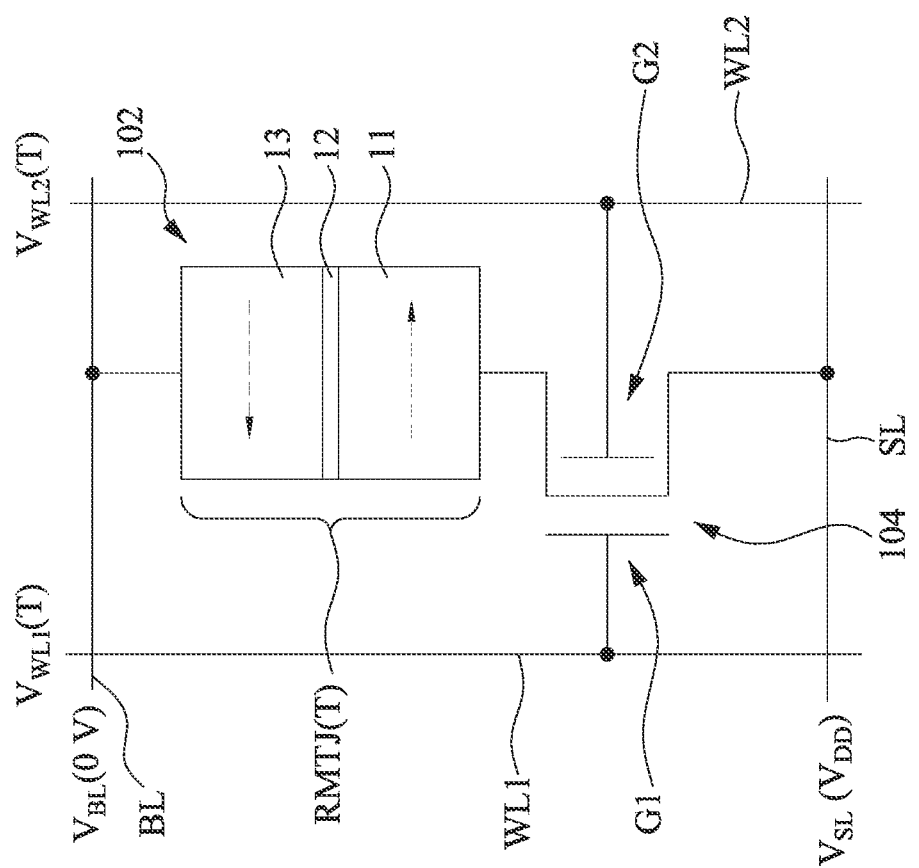

In FIG. 6D, when the first and second input voltages $V_{WL1}, V_{WL2}$ applied to the first and second word lines WL1 and WL2 are both $V_{DD}$ greater than the threshold voltage of the access transistor 104, the access transistor 104 is turned on and the magnetization direction of the free layer 13 is switched, because the current flowing through the MTJ cell 102 is greater than the critical current required to switch the magnetization direction of the free layer 13. Therefore, the magnetization directions of the reference layer 11 and the free layer 13 become anti-parallel. In this case, the output resistance $R_{MTJ}$ of the MTJ cell 102 is a second binary level or a high resistance $R_{AP}$. In other words, the input voltages $V_{WL1}, V_{WL2}$ may each be a true state or a binary value of "1," and the output resistance $R_{MTJ}$ may be a true state or a binary value of "1."

In the logic operations in FIGS. 6A-6D as discussed above, the output resistance $R_{MTJ}$ of the MTJ cell 102 follows an OR gate logic, as illustrated in the table in FIG. 7. As illustrated in FIG. 7, a true output (logic "1") results if either input is true. A false output (logic "0") results only if both input voltages to the word lines WL1, WL2 are false inputs (logic "0"). The OR gate logic function effectively finds the maximum between two binary digits, and thus the output is 1 except when the inputs are each 0.

When the MTJ cell has a small critical current, it is more likely that the magnetization direction of the free layer and hence the resistance state of the MTJ cell will be switched. Conversely, if the MTJ cell has a large critical current, then it is less likely that the magnetization direction of the free layer and hence the resistance state of the MTJ cell will be switched. Because OR gate logic function requires the magnetization direction of the free layer to be switched as long as one word line voltage is $V_{DD}$, and AND gate logic function requires the magnetization direction of the free layer to be switched when both word line voltages are $V_{DD}$, an MTJ cell suitable for performing OR gate logic operations may have a smaller critical current than an MTJ cell suitable for performing AND gate logic operations.

FIGS. 8A and 8B illustrate a refresh or initial operation of an MTJ cell in accordance with some embodiments of the present disclosure. Before each logic operation (e.g., each of the logic operations illustrated in FIGS. 4A-4D and FIGS. 6A-6D), the refresh operation is performed by applying $V_{DD}$ to the bit line, the first and second word lines, and applying 0V to the source line. FIG. 8A illustrates a refresh current $I_{refresh}$ applied to the MTJ cell 102 when the magnetization directions of the reference layer 11 and the free layer 13 are parallel. During the refresh operation, the first and second word lines supplied with $V_{DD}$ turn on the access transistor, and the bit line voltage and the source line voltage thus form a potential difference that causes a refresh current $I_{refresh}$ to flow through the MTJ cell 102. In this case as shown in FIG. 8A, the refresh current is a reverse electron flow from the free layer 13 and causes the magnetization directions of the reference layer 11 and the free layer 13 to remain parallel.

FIG. 8B illustrates a refresh current $I_{refresh}$ applied to the MTJ cell 102 when the magnetization directions of the reference layer 11 and the free layer 13 are anti-parallel. During the refresh operation, the first and second word lines supplied with $V_{DD}$ turn on the access transistor, and the bit line voltage and the source line voltage thus form a potential difference that causes a refresh current $I_{refresh}$, which is greater than the critical current, to flow through the MTJ cell 102. In this case as shown in FIG. 8B, the refresh current is a reverse electron flow from the free layer 13, and the refresh current switches the magnetization direction of the free layer 13 to refresh the magnetization directions of the reference layer 11 and free layer 13 to an initial state of parallel.

Figure 9:
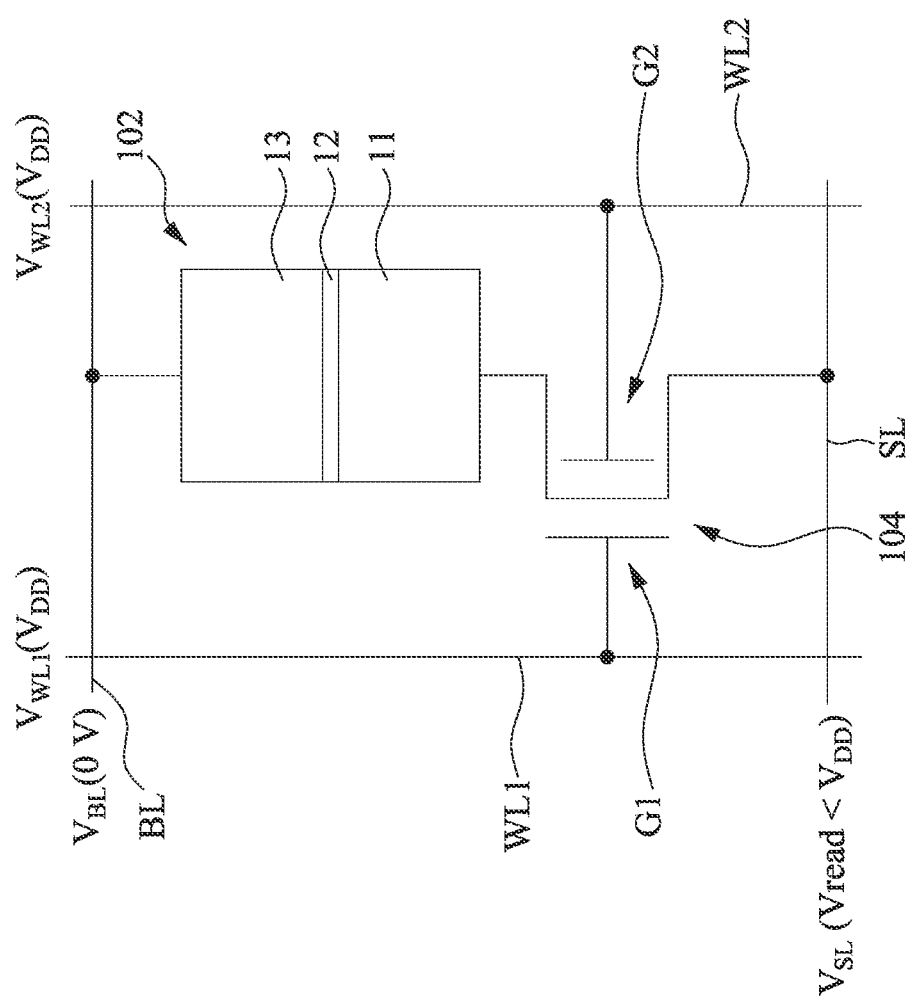
FIG. 9 illustrates a read operation of an MTJ cell in accordance with some embodiments of the present disclosure.

FIG. 9 illustrates a read operation of an MTJ cell in accordance with some embodiments of the present disclosure. The read operation is performed by applying $V_{DD}$ to the first and second word lines, applying 0V to the bit line, and applying a read voltage Vread to the source line. The read voltage Vread is less than $V_{DD}$ so as to prevent read disturbance. For example, if the read voltage $V_{read}$ is equal to $V_{DD}$, the read current flowing through the MTJ cell 102 may be greater than or equal to the critical current required to switch the magnetization direction of the free layer 13, which in turn may switch the magnetization direction of the free layer 13, thereby leading to read disturbance that causes the date stored in the MTJ cell 102 to be lost. During the read operation, the first and second word lines WL1 and WL2 turn on the access transistor 104, the source line and the bit line thus form a potential difference that causes a read current to pass through the MTJ cell 102. The read current passing through the MTJ cell 102 has a binary value depending on the resistance state of the MTJ cell 102, and thus the logic operation result as discussed above can be read out. In some embodiments, the read voltage $V_{read}$ is in a range from about 0.05V to about 5V.

Figure 10A:
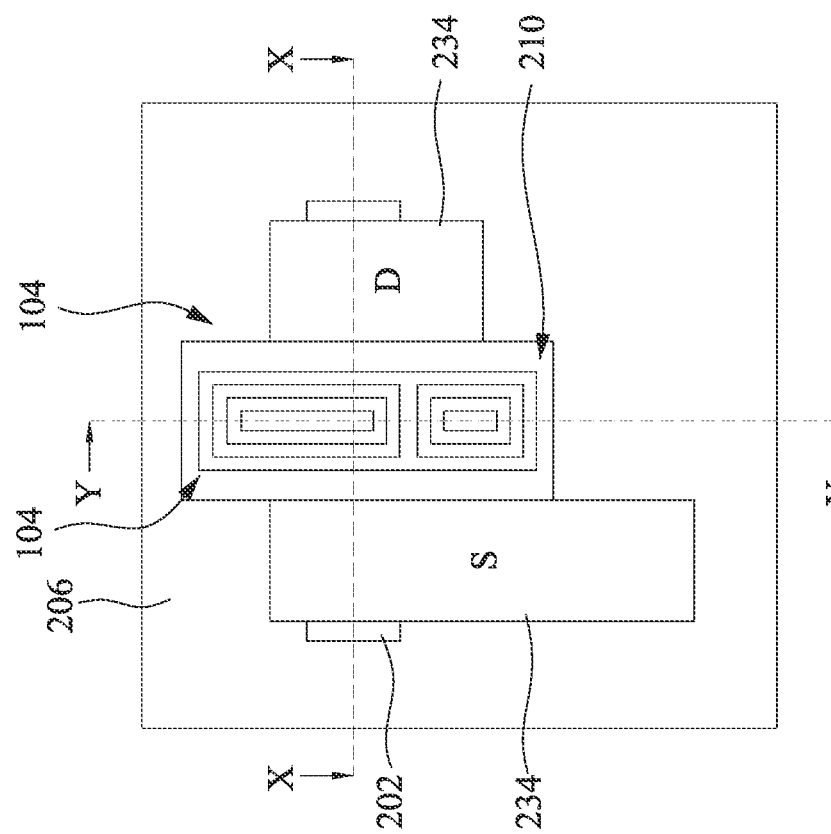
FIG. 10A is a plan view of an integrated circuit (IC) structure zoomed-in to an MRAM access transistor in accordance with some embodiments of the present disclosure.
Figure 10B:
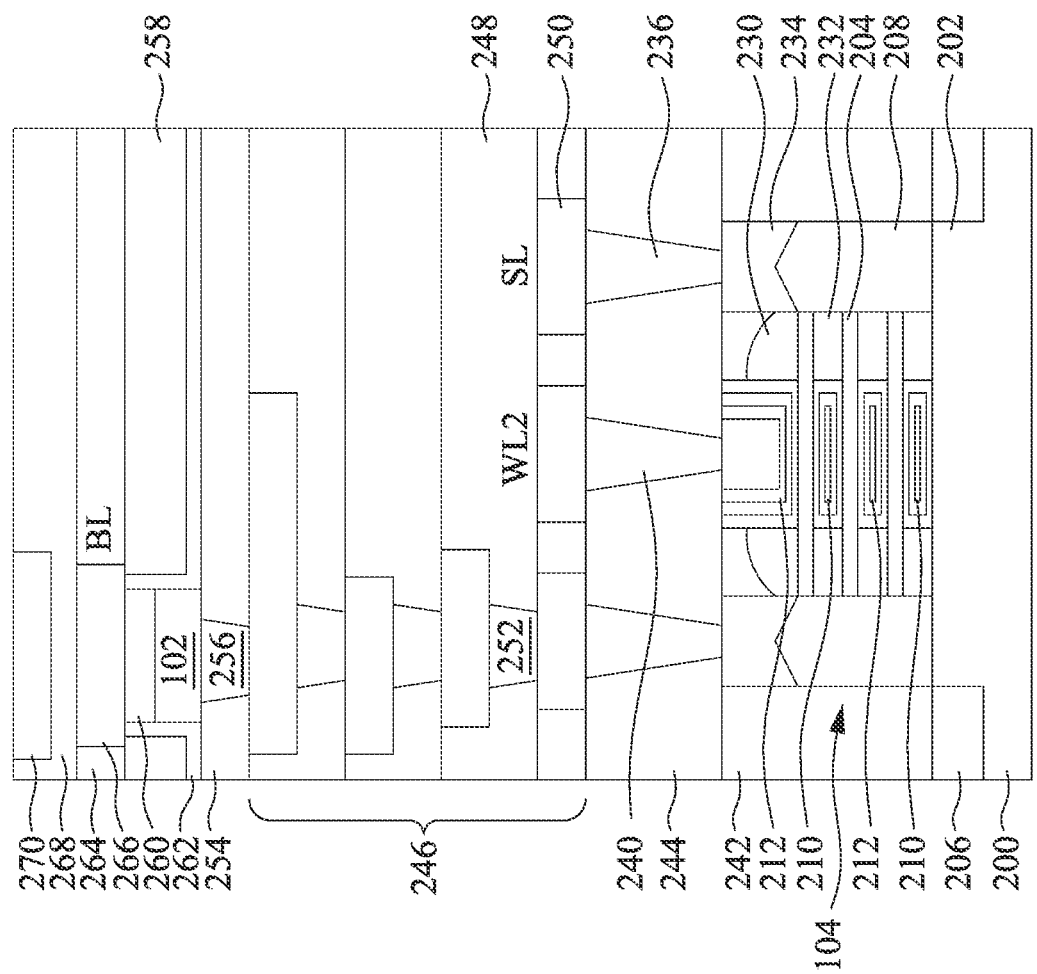
FIG. 10B is a cross-sectional view of the IC structure of FIG. 10A obtained from a first cut, which is along a direction of current flow between source/drain regions of the MRAM access transistor.
Figure 10C:
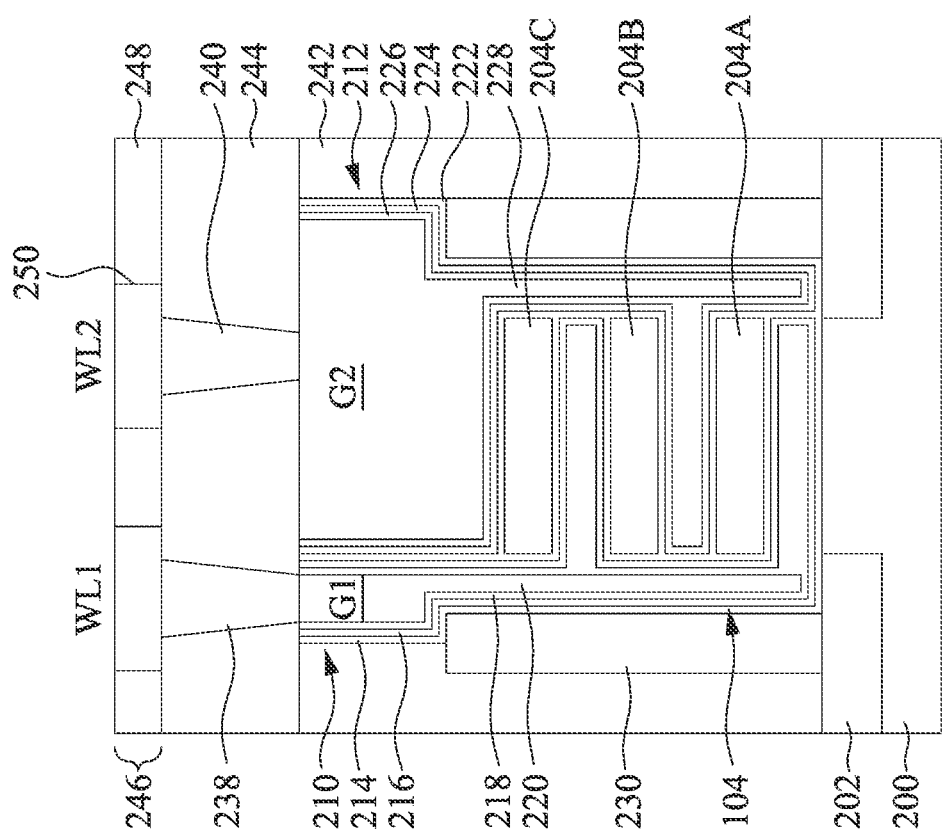
FIG. 10C is a cross-sectional view of the IC structure of FIG. 10A, wherein the cross-sectional view is obtained from a second cut, which is along a direction perpendicular to the direction of current flow between source/drain regions of the MRAM access transistor.

FIG. 10A is a plan view of an integrated circuit (IC) structure zoomed-in to an MRAM access transistor 104 having independent gates coupled to different word lines, in accordance with some embodiments of the present disclosure. FIG. 10B is a cross-sectional view of the IC structure obtained from a first cut (e.g., cut X-X in FIG. 10A), which is along a direction of current flow between source/drain regions of the MRAM access transistor 104. FIG. 10C is a cross-sectional view of the IC structure zoomed-in to the MRAM access transistor 104, wherein the cross-sectional view is obtained from a second cut (e.g., cut Y-Y in FIG. 10A), which is along a direction perpendicular to the direction of current flow between source/drain regions of the MRAM access transistor 104.

In some embodiments, the MRAM access transistor 104 is a gate-all-around (GAA) transistor that comprises channel layers 204A-C over a fin 202 on a substrate 200 (e.g., a semiconductor substrate), wherein the channel layers 204A-C (collectively referred to as channel layers 204) act as channel regions for the MRAM access transistor 104. In some embodiments, the channel layers 204A-C are nanosheets, nanowires, nanorings, nanoslabs, or other structures having nano-scale size (e.g., a few nanometers). The channel layers 204 may include p-type channel layers, n-type channel layers, or a combination thereof. In some embodiments, the geometry of each channel layer 204 can be square, rectangular, diamond, or the like.

Isolation regions 206 are disposed between adjacent fins 202, which may protrude above and from between neighboring isolation regions 206. Although the isolation regions 206 are described/illustrated as being separate from the substrate 200, as used herein, the term "substrate" may refer to the semiconductor substrate alone or a combination of the semiconductor substrate and the isolation regions. Additionally, although a bottom portion of the fin 202 are illustrated as being single, continuous materials with the substrate 200, the bottom portion of the fin 202 and/or the substrate 200 may comprise a single material or a plurality of materials. In this context, the fin 202 refers to the portion extending between the neighboring isolation regions 206.

The MRAM access transistor 104 includes epitaxial source and drain (collectively referred to as source/drain or S/D in the present disclosure) regions 208 disposed on the fin 202 and on opposite ends of the channel layers 204. The MRAM access transistor 104 further includes a first gate structure 210 and a second gate structure 212 laterally between the epitaxial source/drain regions 208. In FIG. 10C, the first gate structure 210 extends to between the channel layers 204B and 204C, and also extends along a bottom surface of the channel layer 204A. The second gate structure 212 extends to between the channel layers 204A and 204B, and also extends along a top surface of the channel layer 204C. As a result, the first gate structure 210 controls a lower channel region of the channel layer 204A, an upper channel region of the channel layer 204B, and a lower channel region of the channel layer 204C; and the second gate structure 212 controls an upper channel region of the channel layer 204A, a lower channel region of the channel layer 204B, and an upper channel region of the channel layer 204C.

The first gate structure 210 includes an interfacial layer 214, a high-k dielectric layer 216 over the interfacial layer 214, a work function metal layer 218 over the high-k dielectric layer 216, and a gate fill metal 220 over the work function metal layer 218. The second gate structure 212 also includes an interfacial layer 222, a high-k dielectric layer 224 over the interfacial layer 222, a work function metal layer 226 over the high-k dielectric layer 224, and a gate fill metal 228 over the work function metal layer 226. The first and second gate structures 210 and 212 are electrically isolated by the interfacial layers 214, 222, and the high-k dielectric layers 216, 224, and thus the first and second gate structures 210 and 212 can serve as two independent gate terminals G1 and G2 that are independently controlled by different word lines WL1 and WL2.

Gate spacers 230 are disposed around sidewalls of the first and second gate structure 210 and 212 from a top view as illustrated in FIG. 10A. Inner spacers 232 are disposed vertically between adjacent two of the channel layers 204 and the fin 202, as illustrated in the cross-sectional view in FIG. 10B. The gate spacers 230 and inner spacers 232 may serve to electrically isolate the first, second gate structures 210, 212 from the epitaxial source/drain regions 208.

Source/drain contacts 234 are disposed on the epitaxially source/drain regions 208, respectively. Source/drain vias 236 are respectively disposed on the source/drain contacts 234. First and second gate contact 238 and 240 are disposed on the first and second gate structures 210 and 212, respectively. The first and second gate contacts 238 and 240, the source/drain contacts 234 and the source/drain vias 236 can be referred to as middle-end-of-line (MEOL) conductive features that electrically connect front-end-of-line (FEOL) conductive features (e.g., first and second gate structures 210 and 212, and source/drain regions 208 of the MRAM access transistor 104) to back-end-of-line (BEOL) features (e.g., first and second word lines WL1, WL2, the source line SL, and the MTJ cell 102), which in turn allows the MRAM access transistor 104 being electrically coupled to the MTJ cell 102 to perform AND/OR logic operations as discussed previously.

First and second interlayer dielectric (ILD) layers 242 and 244 are arranged over the substrate 200. The first ILD layer 242 laterally surrounds the MRAM access transistor 104 and the source/drain contacts 234. The second ILD layer 244 is disposed over the first ILD layer 242 and laterally surrounds the gate contacts 238, 240 and the source/drain vias 236.

A multilevel interconnect structure 246 is formed over the second ILD layer 244. The multilevel interconnect structure 246 electrically interconnects one or more active and/or passive devices to form functional electrical circuits within the IC structure. The multilevel interconnect structure 246 comprises a plurality of inter-metal dielectric (IMD) layers 248. The multilevel interconnect structure 246 further comprises one or more horizontal interconnects such as metal lines 250, and/or one or more vertical interconnects such as metal vias 252. The metal lines 250 have longest dimensions extending laterally, and the metal vias 252 have longest dimensions extending vertically, and thus the metal vias 252 conduct currents vertically and are used to electrically connect two metal lines 250 located at vertically adjacent levels, whereas the metal lines 250 conduct currents laterally and are used to distribute electrical signals and power within one level.

A metal line 250 in the multilevel interconnect structure 246 serves as the source line SL coupled to the source region 208 of the MRAM access transistor 104, and two metal lines 250 in the multilevel interconnect structure 246 respectively serve as the first and second word lines WL1 and WL2 that are respectively coupled to the first and second gate structures 210 and 212 of the MRAM access transistor 104. In some embodiments, the source line SL and the first and second word lines WL1 and WL2 are within a same interconnect level, such as in a bottommost IMD layer 248 that is immediately above the gate contacts 238, 240 and the source/drain vias 236. Therefore, the first gate contact 238 electrically connects the first word line WL1 to the first gate structure 210, the second gate contact 240 electrically connects the second word line WL2 to the second gate structure 212, and the source via 236 electrically connects the source line SL to the source contact 234 that is formed on the epitaxial source region 208. When the MRAM access transistor 104 is turned on by applying suitable voltage to one or both of the word lines WL1 and WL2, the source line SL is electrically coupled to the bottom end of the MTJ cell 102 through the turned-on transistor 104.

In some embodiments, a dielectric layer 254 is disposed on the multilevel interconnect structure 246, and a bottom electrode via (BEVA) 256 extends through the dielectric layer 254 to make electrical connection to the multilevel interconnect structure 246. In some embodiments, another dielectric layer 258 is disposed over the dielectric layer 254. An MTJ cell 102 is disposed in the dielectric layer 258 and makes electrical connection to the BEVA 256. In the depicted embodiments, the MTJ cell 102 is disposed on the BEVA and thus formed in an "on-via" arrangement. In some other embodiments, the MTJ cell 102 is disposed on a metal line 250 and thus is formed in an "on-metal-line" arrangement. In some embodiments, the geometry of MTJ cell 102 can be circular, elliptical, rectangular, square, or the like. In some embodiments, the junction size of the MTJ cell 102 is in a range from about 1 nm to about 1 mm.

In some embodiments, a metal hard mask 260 is disposed in the dielectric layer 258 and covers a top surface of the MTJ cell 102. In some embodiments, a passivation layer 262 extends along sidewalls of the MTJ cell 102 and sidewalls of the metal hard mask 260. The passivation layer 262 further extends along a top surface of the dielectric layer 254. In some embodiments, another dielectric layer 264 is disposed over the dielectric layer 258, and a metal line 266 extends in the dielectric layer 264 to make electrical connection to the MTJ cell 102 via the metal hard mask 260. The metal line 266 thus serves as a bit line BL electrically coupled to the top end of the MTJ cell. In some embodiments, another dielectric layer 268 is disposed over the dielectric layer 264, and a magnetic field induced layer 270 is disposed within the dielectric layer 268 directly above the bit line 266, but spaced apart from the bit line 266.

FIGS. 11A-29 are top views and cross-sectional views of intermediate stages in the manufacturing of an IC structure having 1T-1MTJ MRAM cells with logic functions, in accordance with some embodiments of the present disclosure. The manufacturing process steps can be used to fabricate the IC structure as illustrated in FIGS. 10A-10C. It is understood that additional operations can be provided before, during, and after processes shown by FIGS. 11A-29, and some of the operations described below can be replaced or eliminated, for additional embodiments of the method. The order of the operations/processes may be interchangeable.

Figure 11B:
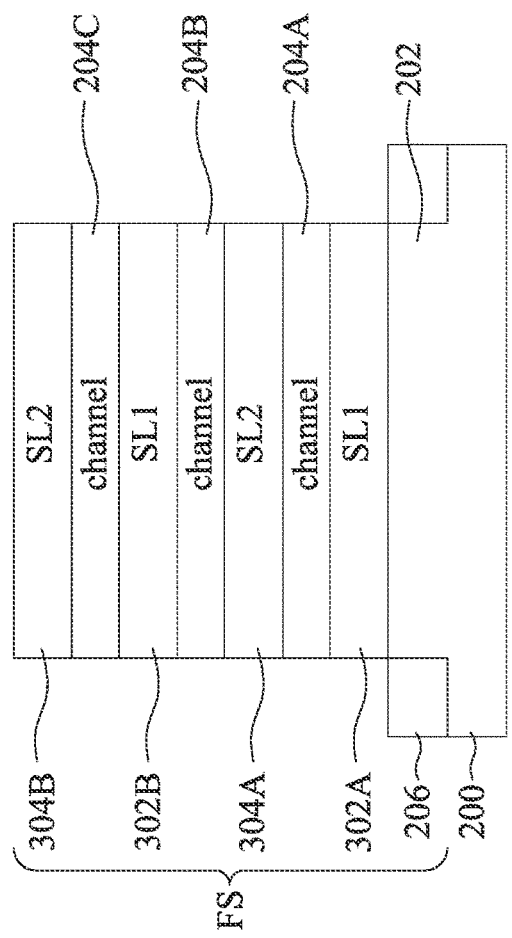
Figure 11A:
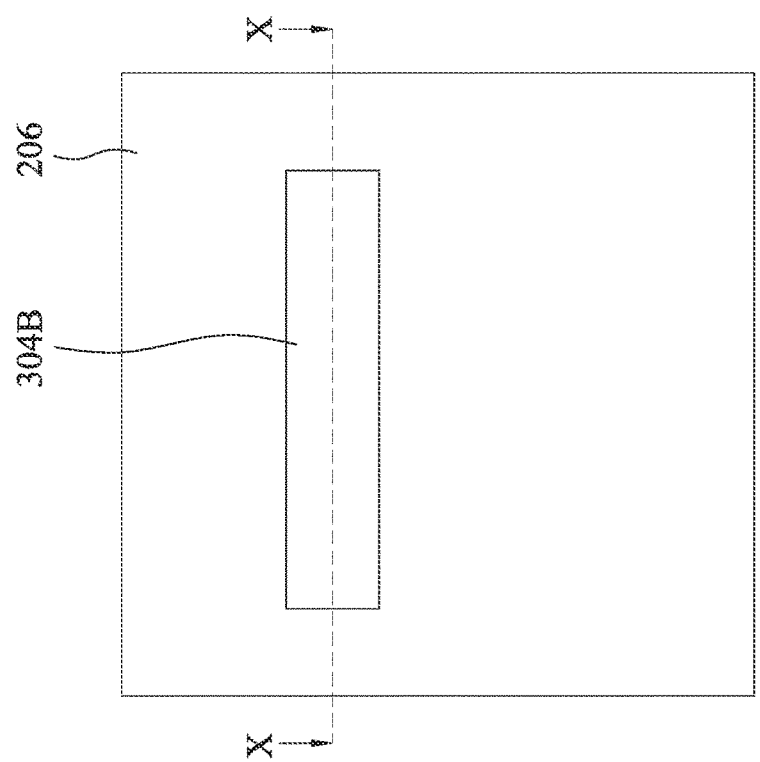

FIG. 11A is a top view of an intermediate stage in manufacturing of an IC structure, and FIG. 11B is a cross-sectional view obtained from cut X-X in FIG. 11A. In FIGS. 11A and 11B, a semiconductor substrate 200 is illustrated. In some embodiments, the substrate 200 may be a semiconductor substrate, such as a bulk semiconductor substrate, a semiconductor-on-insulator (SOI) substrate, a multi-layered or gradient substrate, or the like. The substrate 200 may include a semiconductor material, such as an elemental semiconductor including Si and Ge; a compound or alloy semiconductor including SiC, SiGe, GeSn, GaAs, GaP, GaAsP, AlInAs, AlGaAs, GaInAs, InAs, GaInP, InP, InSb, GaInAsP; a combination thereof, or the like. The substrate 200 may be doped or substantially un-doped. In a specific example, the substrate 200 is a bulk silicon substrate, which may be a wafer.

The substrate 200 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP.

Impurity ions (interchangeably referred to as dopants) are implanted into the substrate 200 to form a well region (not shown). The ion implantation is performed to prevent a punch-through effect. The substrate 200 may include various regions that have been suitably doped with impurities (e.g., p-type or n-type conductivity). The dopants are, for example, boron ($BF_2$) for an n-type FET and phosphorus for a p-type FET.

FIGS. 11A and 11B also illustrate a layer stack formed over the substrate 200. A first semiconductor layer (first sacrificial layer denoted as "SL1") 302A is formed over the substrate 200. A second semiconductor layer (channel layer denoted as "channel") 204A is formed over the first semiconductor layer 302A. A third semiconductor layer (second sacrificial layer denoted as "SL2") 304A is formed over the second semiconductor layer 204A. Another second semiconductor layer (channel layer) 204B is formed over the third semiconductor layer 304A. Another first semiconductor layer (first sacrificial layer) 302B is formed over the second semiconductor layer (channel layer) 204B. Another second semiconductor layer (channel layer) 204C is formed over the first semiconductor layer (first sacrificial layer) 302B. Another third semiconductor layer (second sacrificial layer) 304B is formed over the second semiconductor layer 204C.

In some embodiments, the first, second and third semiconductor layers are alternately stacked such that there are more than two layers each of the first, second and third semiconductor layers. In some embodiments, the number of second semiconductor layers is from 1 to 20. In some embodiments, the first and third semiconductor layers will be removed in subsequent processing and thus are referred to as sacrificial layers, and the second semiconductor layers will become nanosheets, nanowires, nanoslabs or nanorings and remain in a final IC product to serve as transistor channel regions. In some embodiments, the lattice constant of the second semiconductor layers is greater than the lattice constant of the first and third semiconductor layers. In other embodiments, the lattice constant of the second semiconductor layers is smaller than the lattice constant of the first and third semiconductor layers.

In some embodiments, the first, second, and third semiconductor layers are made of different materials selected from the group consisting of Si, Ge, SiGe, GeSn, Si/SiGe/Ge/GeSn, SiGeSn, and combinations thereof. In some embodiments, the first, second, and third semiconductor layers are formed by epitaxy. In some embodiments, the SiGe is $Si_{1-x}Ge_x$, where $0<x<1$.

In some embodiments, the first semiconductor layers 302A and 302B (collectively referred to as first semiconductor layers 302) are formed of a first semiconductor material. In some embodiments, the first semiconductor material includes a first Group IV element and a second Group IV element. The Group IV elements are selected from the group consisting of C, Si, Ge, Sn, and Pb. In some embodiments, the first Group IV element is Si and the second Group IV element is Ge. In certain embodiments, the first semiconductor material is $Si_{1-x}Ge_x$, wherein $0<x<1$. For example, x may be 0.85, and thus the first semiconductor material is $Si_{0.15}Ge_{0.85}$.

In some embodiments, the second semiconductor layers 204A-204C (collectively referred to as second semiconductor layers 304) are formed of a second semiconductor material. In some embodiments, the second semiconductor material is silicon. Stated another way, the second semiconductor material is pure silicon free of germanium in some embodiments. In some embodiments, the second semiconductor material includes a first Group IV element and a second Group IV element. In some embodiments, the first Group IV element is Si and the second Group IV element is Ge. In some embodiments, the atomic ratio of the first Group IV element to second Group IV element in the second semiconductor material is different than that in the first semiconductor material. For example, Ge atomic percentage in the first semiconductor material may be greater than the Ge atomic percentage in the second semiconductor material. In some other embodiments, the second semiconductor material includes a Group III element and a Group V element.

In some embodiments, the third semiconductor layers 304A and 304B (collectively referred to as third semiconductor layers 304) are formed of a third semiconductor material. In some embodiments, the third semiconductor material includes a first Group IV element and a second Group IV element. The Group IV elements are selected from the group consisting of C, Si, Ge, Sn, and Pb. In some embodiments, the first Group IV element is Si and the second Group IV element is Ge. In some embodiments, the atomic ratio of the first Group IV element to second Group IV element in the third semiconductor material is different than that in the first semiconductor material. For example, Ge atomic percentage in the first semiconductor material may be greater than the Ge atomic percentage in the third semiconductor material. In certain embodiments, if the first semiconductor material is $Si_{1-x}Ge_x$, then the third semiconductor material is $Si_xGe_{1-x}$, wherein $0<x<1$. For example, x may be 0.85, and thus the first semiconductor material is $Si_{0.15}Ge_{0.85}$, and the third semiconductor material is $Si_{0.85}Ge_{0.15}$.

The first semiconductor layers 302, the second semiconductor layers 204, and the third semiconductor layers 304 may be formed by one or more epitaxy or epitaxial (epi) processes. The epitaxy processes include CVD deposition techniques (e.g., vapor-phase epitaxy (VPE) and/or ultra-high vacuum CVD (UHV-CVD)), molecular beam epitaxy (MBE), and/or other suitable processes. Thickness of the first and third semiconductor layers 302, 304 depends on a target distance between the channel layers 204 and a target distance between the bottommost channel layer 204A and the isolation region 206. For example, the thickness of first and third semiconductor layers 302, 304 is in a range from about 5 nm to about 50 nm. Thickness of the second semiconductor layers 204 depends on a target thickness of transistor channels. For example, the thickness of second semiconductor layers 204 is in a range from about 5 nm to about 50 nm.

After the epitaxial growth process of the layer stack is complete, a patterning process is performed on the layer stack to form a fin structure FS, as illustrated in FIGS. 11A and 11B. In some embodiments, the patterning process comprises a photolithography process for forming a patterned mask, followed by one or more etching processes using the patterned mask as an etch mask. The one or more etching processes may include wet etching processes, anisotropic dry etching processes, or combinations thereof, and may use one or more etchants that etch the first, second, and third semiconductor layers 302, 204, 304 at a faster etch rate than it etches the patterned mask. Although the fin structure FS illustrated in FIG. 11B has vertical sidewalls, the etching process may lead to tapered sidewalls in some other embodiments.

Once the fin structure FS has been formed, shallow trench isolation (STI) regions 206 (interchangeably referred to as isolation insulation layer) are formed around a lower portion of the fin structure FS are illustrated in FIGS. 11A and 11B. STI regions 206 may be formed by depositing one or more dielectric materials (e.g., silicon oxide) to completely fill the trenches around the fin structures FS and then recessing the top surface of the dielectric materials. The dielectric materials of the STI regions 206 may be deposited using a high density plasma chemical vapor deposition (HDP-CVD), a low-pressure CVD (LPCVD), sub-atmospheric CVD (SACVD), a flowable CVD (FCVD), spin-on coating, and/or the like, or a combination thereof. After the deposition, an anneal process or a curing process may be performed. In some cases, the STI regions 206 may include a liner such as, for example, a thermal oxide liner grown by oxidizing the silicon surface or silicon germanium surface of the fin structure FS and the substrate 200. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI regions 206 such that an upper portion of the fin structure FS protrudes from surrounding insulating STI regions 206.

FIG. 12A is a top view of an intermediate stage in manufacturing of an IC structure, and FIG. 12B is a cross-sectional view obtained from cut X-X in FIG. 12A. In FIGS. 12A and 12B, a sacrificial dielectric layer 306 is blanket deposited over the substrate 200, and then a dummy gate structure 308 is formed across the fin structure FS. The dummy gate structure 308 has a longitudinal axis perpendicular to the longitudinal axis of the fin structure FS. The sacrificial dielectric layer 306 may be, for example, silicon oxide, silicon nitride, a combination thereof, or the like, and may be deposited or thermally grown according to acceptable techniques. The dummy gate structure 308 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate structure 308 is formed by, for example, depositing a layer of dummy gate material over the sacrificial dielectric layer 306, followed by patterning the layer of dummy gate material into separate dummy gate structures 308 by using suitable photolithography and etching techniques.

FIG. 13A is a top view of an intermediate stage in manufacturing of an IC structure, and FIG. 13B is a cross-sectional view obtained from cut X-X in FIG. 13A. In FIGS. 13A and 13B, exposed portions of the sacrificial dielectric layer 306 and underlying portions of the fin structure FS that extend laterally beyond the dummy gate structure 308 are removed, for example, in an anisotropic etch step until the substrate 200 is exposed. In some embodiments, the etching is performed using an etchant that attacks fin structure FS, and hardly attacks the dummy gate structure 308. Stated differently, the dummy gate structure 308 has higher etch resistance to the etching process than that of the fin structure FS. Accordingly, in the etching step, the height of dummy gate structure 308 is substantially not reduced. After etching the fin structure FS is complete, a cleaning process is optionally performed on the exposed substrate 200 to remove any possible oxide formation on the silicon surface by using, for example, a diluted hydrofluoric acid (HF) solution.

Then, in FIGS. 13A and 13B, gate spacers 230 are formed on sidewalls of the dummy gate structure 308. In some embodiments of the spacer formation step, a spacer material layer is deposited on the substrate 200. The spacer material layer may be a conformal layer that is subsequently etched back to form gate sidewall spacers. In the illustrated embodiment, a spacer material layer is disposed conformally on top and sidewalls of the dummy gate structure 308. The spacer material layer may include a dielectric material such as silicon oxide, silicon nitride, silicon carbide, silicon oxynitride, SiCN films, silicon oxycarbide, SiOCN films, and/or combinations thereof. The spacer material layer may be formed by depositing a dielectric material over the dummy gate structure 308 using processes such as, CVD process, a subatmospheric CVD (SACVD) process, a flowable CVD process, an ALD process, a PVD process, or other suitable process. An anisotropic etching process is then performed on the deposited spacer material layer to expose portions of the fin structure FS not covered by the dummy gate structure 308 (e.g., in source/drain regions of the fin structure FS). Portions of the spacer material layer directly above the dummy gate structure 308 may be completely removed by this anisotropic etching process. Portions of the spacer material layer on sidewalls of the dummy gate structure 308 may remain, forming gate sidewall spacers, which is denoted as the gate spacers 230, for the sake of simplicity.

After the gate spacers 230 are formed, sidewalls of the layers of the fin structure FS formed of the first and third semiconductor materials (e.g., the first and second sacrificial layers 302 and 304) are etched to form sidewall recesses 231 between corresponding channel layers 204. Although sidewalls of the first and second sacrificial layers 302 and 304 in recesses 231 are illustrated as being straight in FIG. 13B, the sidewalls may be concave or convex. The sidewalls may be etched using isotropic etching processes, such as wet etching or the like. In some embodiments in which the first and second sacrificial layers 302 and 304 include, e.g., SiGe, and the channel layers 204 include, e.g., Si, a dry etch process with tetramethylammonium hydroxide (TMAH), ammonium hydroxide ($NH_4OH$), or the like may be used to etch sidewalls of the first and second sacrificial layers 302 and 304.

After the first and second sacrificial layers 302 and 304 are laterally recessed, inner spacers 232 are formed in the sidewall recess 231. The inner spacers 232 act as isolation features between subsequently formed source/drain regions and gate structure. As will be discussed in greater detail below, source/drain regions will be formed on the exposed surface of the substrate 200, and the first and second sacrificial layers 302 and 304 will be replaced with first and second gate structures 210 and 212 in following processing.

Inner spacers 232 are formed from an inner spacer layer that is deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the inner spacers 232. Although outer sidewalls of the inner spacers 232 are illustrated as being flush with sidewalls of the channel layers 204, the outer sidewalls of the inner spacers 232 may extend beyond or be recessed from sidewalls of the channel layers 204. Moreover, although the outer sidewalls of the inner spacers 232 are illustrated as being straight in FIG. 13B, the outer sidewalls of the inner spacers 232 may be concave or convex. The inner spacer layer may be etched by an anisotropic etching process, such as RIE, NBE, or the like. The inner spacers 232 may be used to prevent damage to subsequently formed source/drain regions (such as the epitaxial source/drain regions 208, discussed below with respect to FIGS. 14A-14B) caused by subsequent etching processes, such as etching processes used to form gate structures.

Figure 14C:
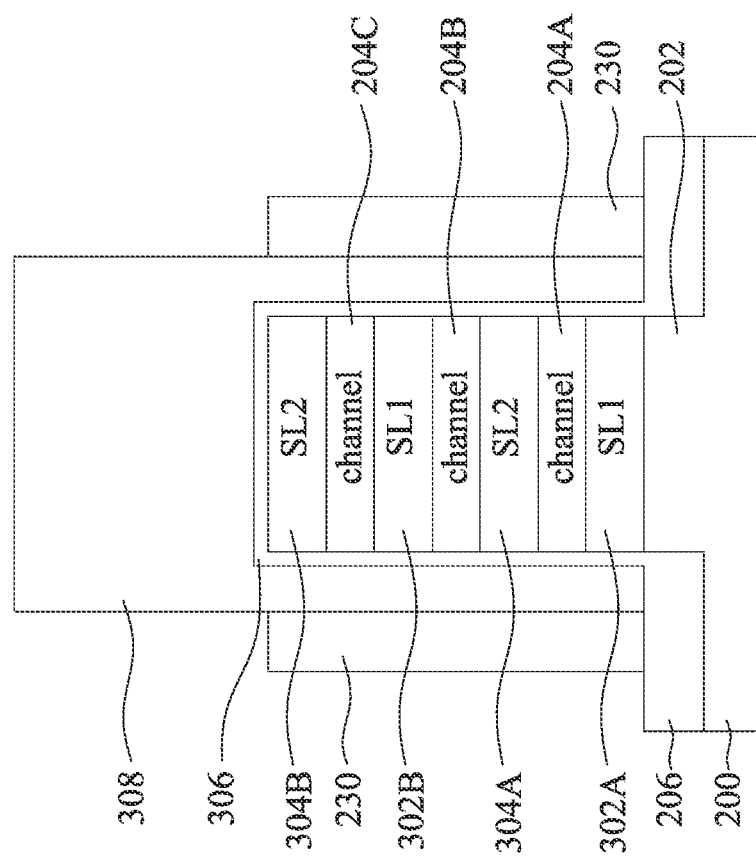

FIG. 14A is a top view of an intermediate stage in manufacturing of an IC structure, FIG. 14B is a cross-sectional view obtained from cut X-X in FIG. 14A, and FIG. 14C is a cross-sectional view obtained from cut Y-Y in FIG. 14A. In FIGS. 14A-14C, epitaxial source/drain regions 208 are formed on the exposed surface of the substrate 200 and at opposite sides of the channel layers 204. In some embodiments, the source/drain regions 208 may exert stress on the channel layers 204, thereby improving device performance. As illustrated in FIG. 14B, the dummy gate structure 308 is disposed between respective neighboring pairs of the epitaxial source/drain regions 208. In some embodiments, the gate spacers 230 are used to separate the epitaxial source/drain regions 208 from the dummy gate structures 308, and the inner spacers 232 are used to separate the epitaxial source/drain regions 208 from the first and second sacrificial layers 302 and 304 by an appropriate lateral distance so that the epitaxial source/drain regions 208 do not short out with subsequently formed gates of the resultant MRAM access transistor.

In some embodiments, the epitaxial source/drain regions 208 may include any acceptable material appropriate for n-type FETs. For example, if the channel layers 204 are silicon, the epitaxial source/drain regions 208 may include materials exerting a tensile strain on the channel layers 204, such as silicon carbide, phosphorous doped silicon carbide, silicon phosphide, or the like. In some embodiments, the epitaxial source/drain regions 208 may include any acceptable material appropriate for p-type FETs. For example, if the channel layers 204 are silicon, the epitaxial source/drain regions 208 may comprise materials exerting a compressive strain on the channel layers 204, such as silicon germanium, boron doped silicon germanium, germanium, germanium tin, or the like. The epitaxial source/drain regions 208 may have surfaces raised from respective the upper surface of the upper channel layer 204C and may have facets. In some embodiments, the epitaxial source/drain regions 208 include Si, Ge, Sn, $Si_{1-x}Ge_x$, $Si_{1-x-y}Ge_xSn_y$, or the like.

The epitaxial source/drain regions 208 may be implanted with dopants to form source/drain regions, followed by an anneal process. The source/drain regions may have an impurity concentration of between about $1\times10^{17}$ atoms/$cm^3$ and about $1\times10^{22}$ atoms/$cm^3$. The n-type and/or p-type impurities for source/drain regions may be any of the impurities previously discussed. In some embodiments, the epitaxial source/drain regions 208 may be in situ doped during growth.

Figure 15C:
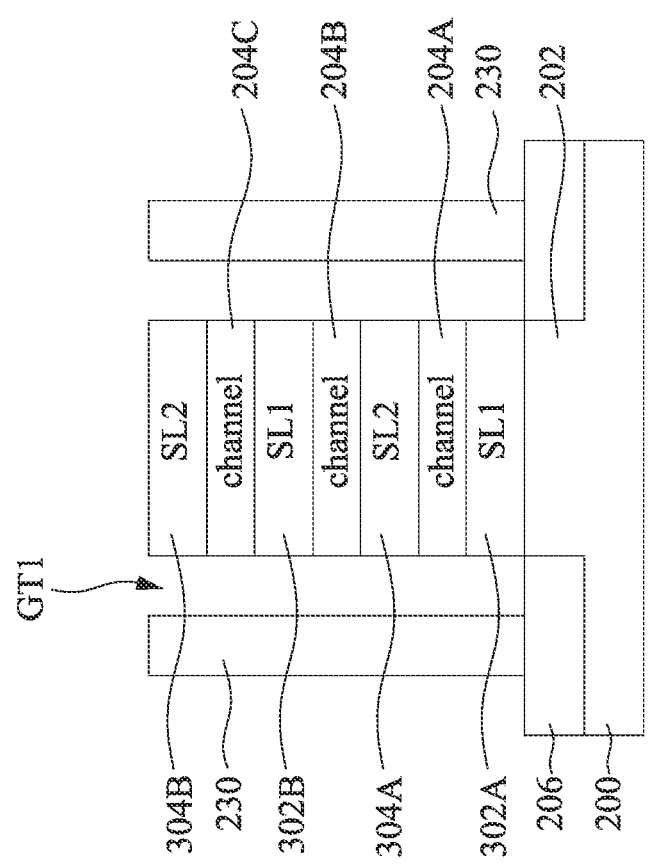

FIG. 15A is a top view of an intermediate stage in manufacturing of an IC structure, FIG. 15B is a cross-sectional view obtained from cut X-X in FIG. 15A, and FIG. 15C is a cross-sectional view obtained from cut Y-Y in FIG. 15A. In FIGS. 15A-15C, the dummy gate structure 308 and the sacrificial dielectric layer 306 are removed in one or more etching steps, so that a gate trench GT1 is formed and enclosed by the gate spacer 230. In some embodiments, the dummy gate structure 308 and the sacrificial dielectric layer 306 are removed by an anisotropic dry etch process. For example, the etching process may include a dry etch process using reaction gas(es) that selectively etch the dummy gate structure 308 at a faster rate than etching the gate spacers 230. Gate trench GT1 exposes and/or overlies portions of channel layers 204, which act as channel regions in subsequently completed transistor. The channel layers 204 which act as the channel regions are disposed between neighboring pairs of the epitaxial source/drain regions 208. During the removal, the sacrificial dielectric layer 306 may be used as an etch stop layer when the dummy gate structure 308 is etched. The sacrificial dielectric layer 306 may then be removed after the removal of the dummy gate structure 308.

FIG. 16A is a top view of an intermediate stage in manufacturing of an IC structure, and FIG. 16B is a cross-sectional view obtained from cut Y-Y in FIG. 16A. In FIGS. 16A and 16B, a patterned hard mask 310 is formed over the substrate 200. The patterned mask 310 has an opening 312 exposing a first side FS1 of the fin structure FS, and a second side FS2 of the fin structure FS is covered by the patterned mask 310, as shown in the cross-sectional view of FIG. 16B. In some embodiments, the patterned mask 310 includes silicon oxycarbide (SiOC), silicon nitride ($Si_3N_4$), silicon oxide, the like, or combinations thereof. The patterned mask 310 may be formed by, for example, depositing a layer of mask material (e.g., silicon nitride) over the substrate 200, coating a photoresist layer over the layer of mask material, patterning the photoresist layer into a photoresist mask by using a photolithography process, and etching the layer of mask material to form the patterned mask 310 having the opening 312 by using the photoresist mask as an etch mask.

Figure 17B:
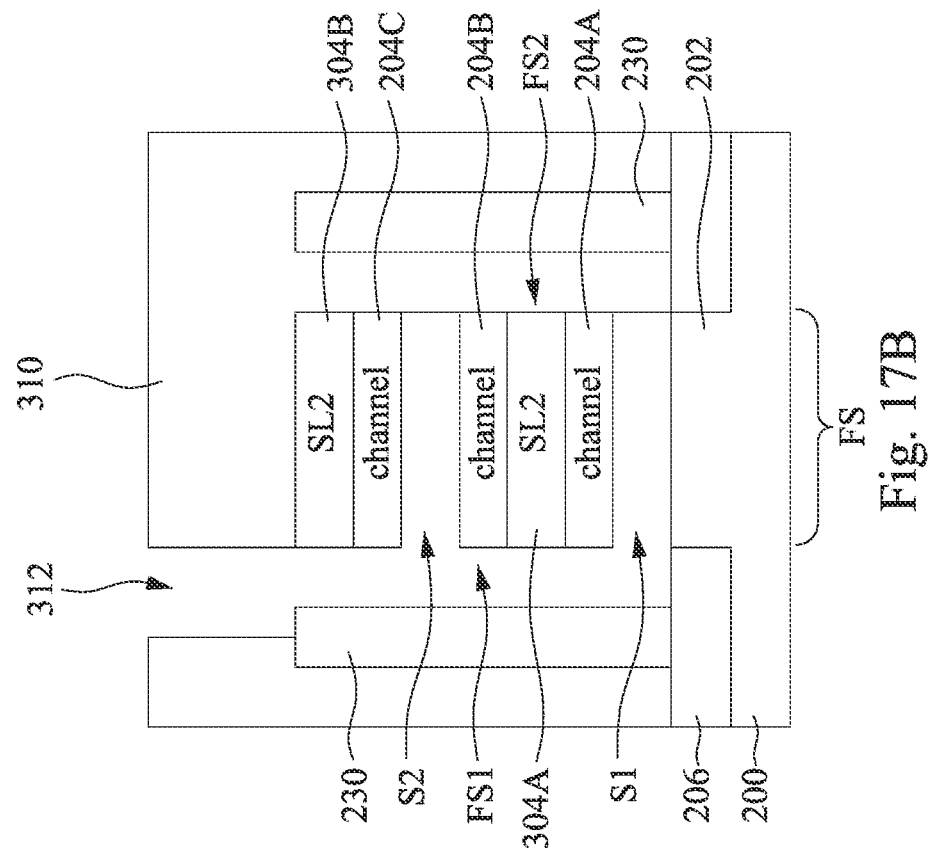
Figure 17A:
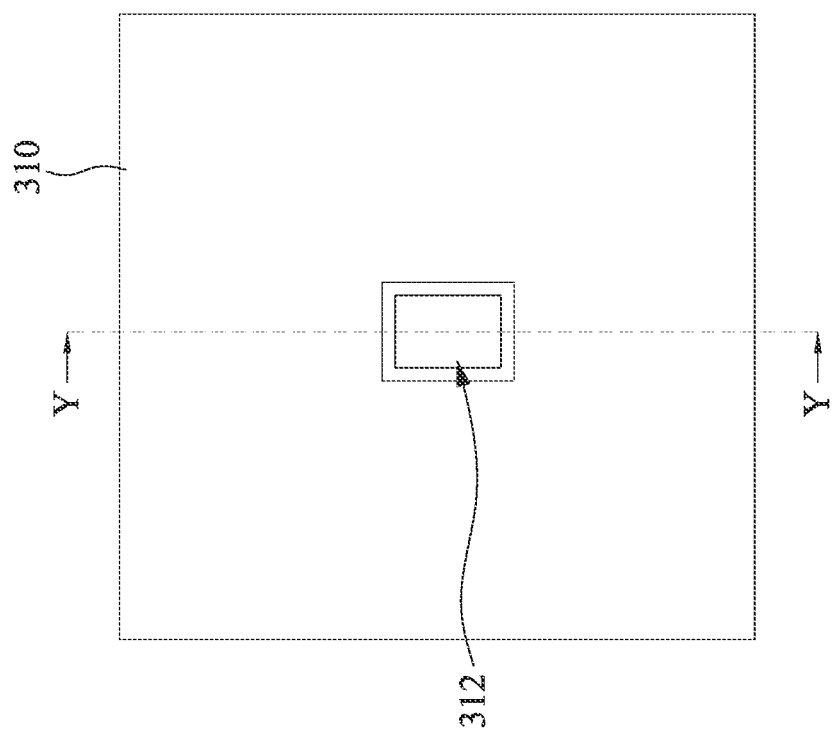

FIG. 17A is a top view of an intermediate stage in manufacturing of an IC structure, and FIG. 17B is a cross-sectional view obtained from cut Y-Y in FIG. 17A. In FIGS. 17A and 17B, a selective etching process is performed to selectively etch the first sacrificial layers 302 exposed in the opening 312 of the patterned mask 310. This etching step forms a space S1 below the channel layer 204A and a space S2 between the channel layers 204B and 204C. In some embodiments, the etching step selectively etches the first sacrificial layers 302 at a faster etch rate than it etches the second sacrificial layers 304 and the channel layers 204. Therefore, the second sacrificial layers 304 and the channel layers 204 may remain substantially intact after the selective etching step is complete.

Figure 18B:
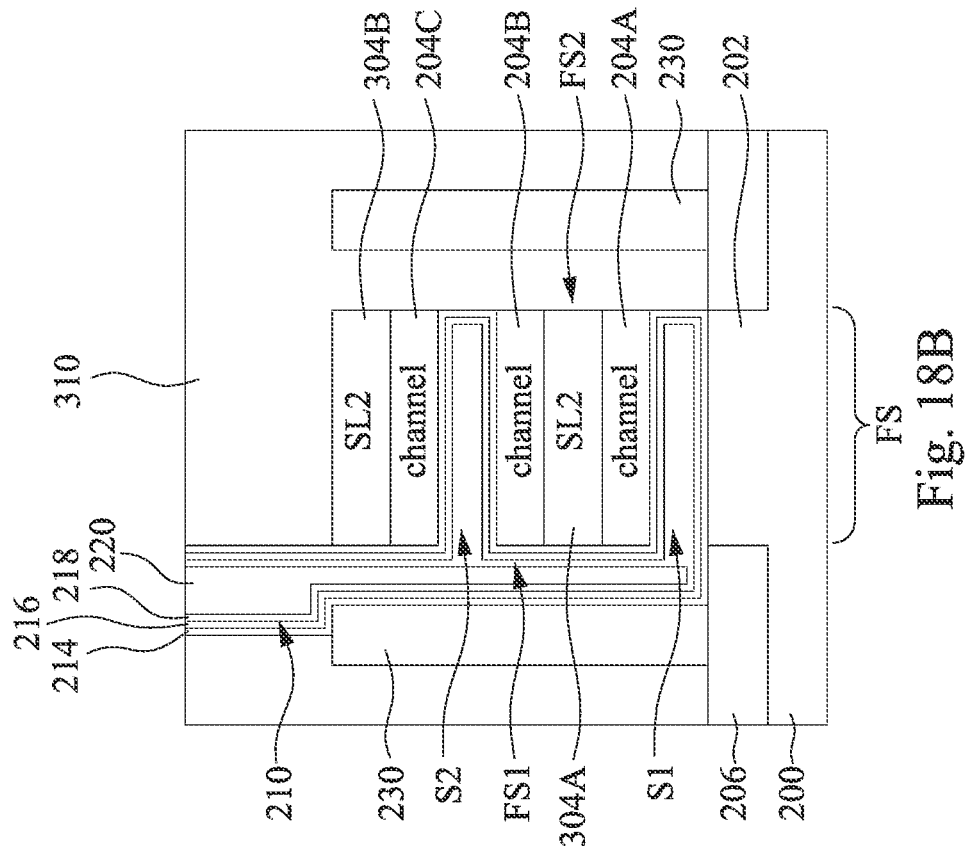
Figure 18A:
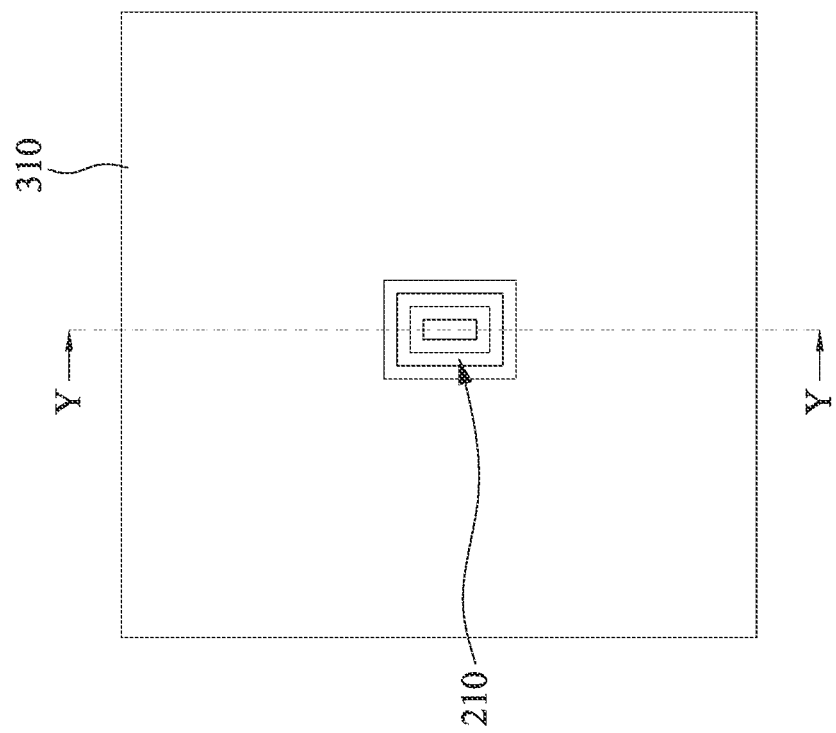
Figure 18C:
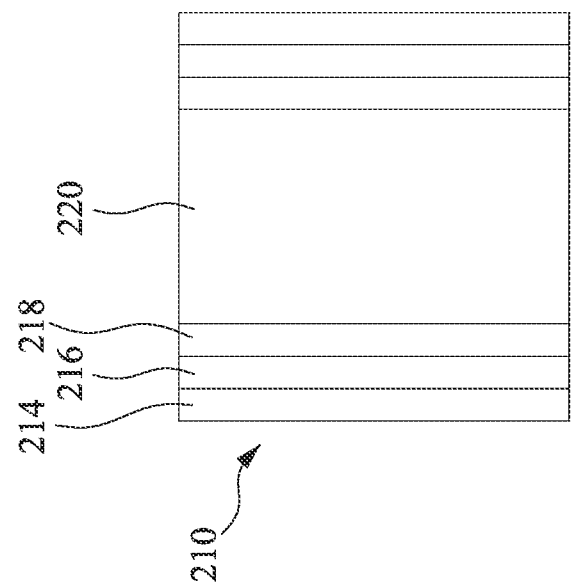

FIG. 18A is a top view of an intermediate stage in manufacturing of an IC structure, FIG. 18B is a cross-sectional view obtained from cut Y-Y in FIG. 18A, and FIG. 18C is a zoomed-in top view of the first gate structure as shown in FIG. 18A. In FIGS. 18A-18C, a first gate structure 210 is formed at the first side FS1 of the fin structure FS and extends into the space Si below the channel layer 204A and the space S2 between the channel layers 204B and 204C. In some embodiments, the first gate structure 210 is a high-k/metal gate (HKMG) structure and may be formed by, for example, depositing an interfacial layer 214 over the substrate 200, a high-k dielectric layer 216 over the interfacial layer 214, a work function metal layer 218 over the high-k dielectric layer 216, and a gate fill metal 220 over the work function metal layer 218, and then performing a CMP process on these deposited materials until the mask 310 is exposed.

In some embodiments, the interfacial layer 214 is silicon oxide and may be formed by, for example, chemical oxidation, thermal oxidation, atomic layer deposition (ALD), chemical vapor deposition (CVD), and/or other suitable method. In some embodiments, the high-k dielectric layer 216 has a high dielectric constant, for example, greater than that of thermal silicon oxide (~3.9). The high-k dielectric layer 216 may include hafnium oxide ($HfO_2$). Alternatively, the high-k dielectric layer 216 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

In some embodiments, the work function metal layer 218 may include one or more work function metals to provide a suitable work function for the high-k/metal gate structure 210. For an n-type FET, the work function metal layer 218 may include one or more n-type work function metals (N-metal), which has a work function lower than a mid-gap work function (about 4.5 eV) that is in the middle of the valance band and the conduction band of silicon. The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type FET, the work function metal layer 218 may include one or more p-type work function metals (P-metal) having a work function higher than the mid-gap work function of silicon. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the gate fill metal 220 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials. In some embodiments as illustrated in FIG. 18B, the gate fill metal 220 does not extend into the space S1 below the channel layer 204A and the space S2 between the channel layers 204B and 204C, because these small spaces S1, S2 are already filled with the work function metal layer 218. However, in some other embodiments, if the spaces S1 and S2 are large enough or the work function metal layer 218 is thin enough, then the gate fill metal 220 may extend into the spaces S1 and S2.

FIG. 19A is a top view of an intermediate stage in manufacturing of an IC structure, and FIG. 19B is a cross-sectional view obtained from cut Y-Y in FIG. 19A. In FIGS. 19A and 19B, the hard mask 310 is removed by using a selective etching process that etches the material of the hard mask 310 at a faster etch rate than etching other materials on the substrate 200.

FIG. 20A is a top view of an intermediate stage in manufacturing of an IC structure, and FIG. 20B is a cross-sectional view obtained from cut Y-Y in FIG. 20A. In FIGS. 20A and 20B, a first ILD layer 242 is deposited over the structure illustrated in FIGS. 19A-19B. The first ILD layer 242 is formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. Then, a planarization process, such as a CMP, may be performed to level the top surface of the first ILD layer 242 with the top surface of the first gate structure 210. The first ILD layer 242 is then etched by using suitable photolithography and etching techniques to form an opening 243 exposing the second sacrificial layers 304.

Next, a selective etching process is performed to selectively etch the second sacrificial layers 304 exposed in the opening 243 in the first ILD layer 242. This etching step forms a space S3 between the channel layers 204A and 204B and a space S4 above the channel layer 204C. In some embodiments, the etching step selectively etches the second sacrificial layers 304 at a faster etch rate than it etches the channel layers 204. Therefore, the channel layers 204 may remain substantially intact after the selective etching step is complete.

Figure 21B:
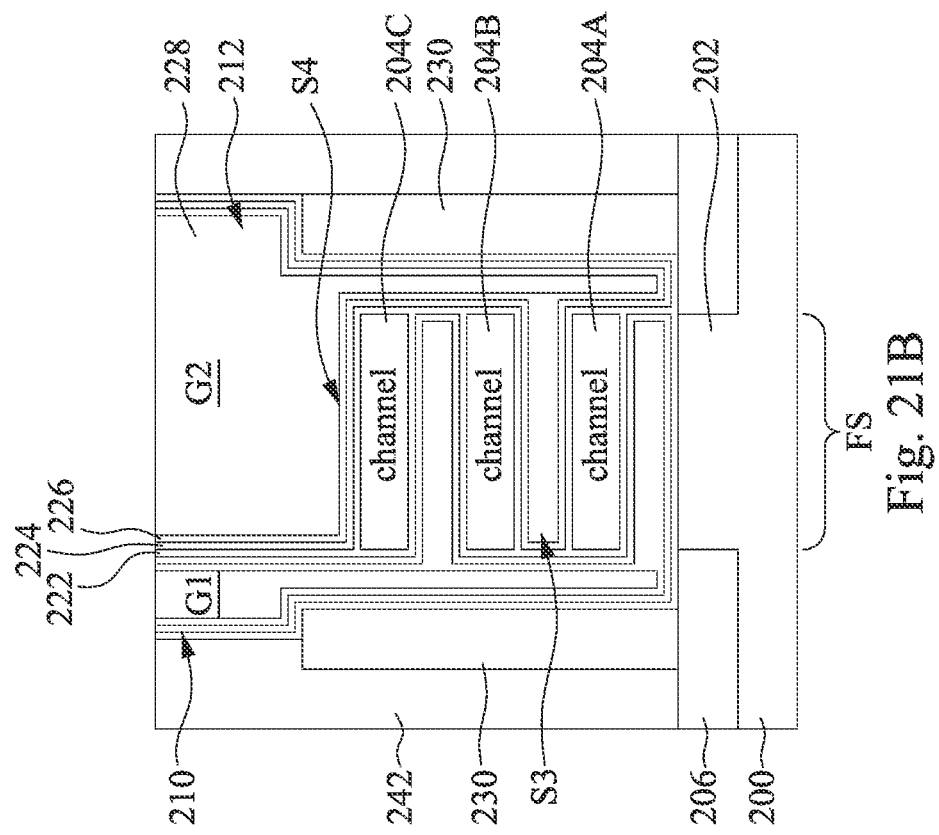
Figure 21A:
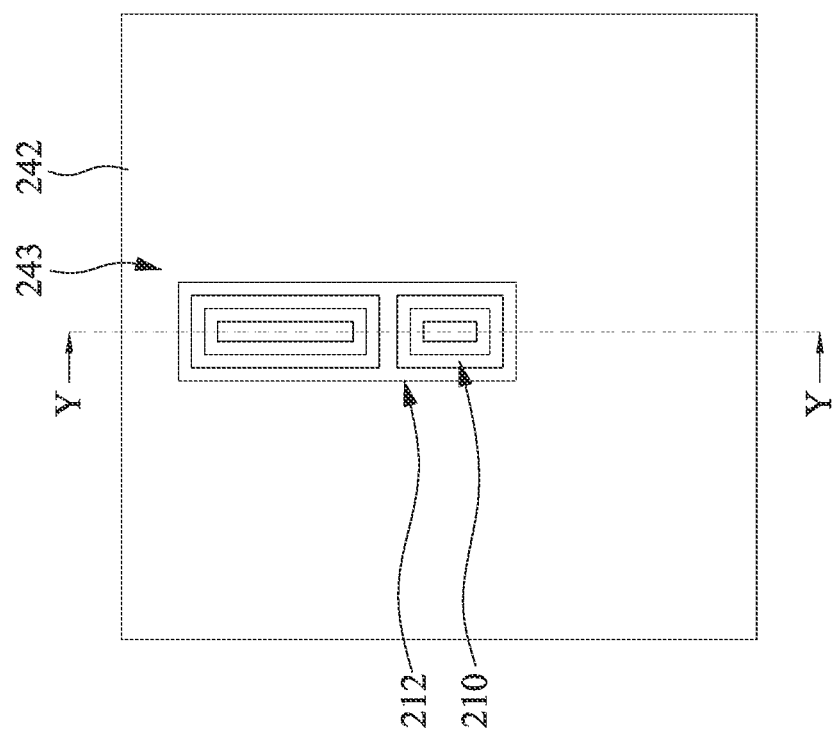

FIG. 21A is a top view of an intermediate stage in manufacturing of an IC structure, and FIG. 21B is a cross-sectional view obtained from cut Y-Y in FIG. 21A. In FIGS. 21A-21B, a second gate structure 212 is formed in the opening in the first ILD layer 242 and extends into the space S3 between the channel layers 204A and 204B and the space S4 above the channel layer 204C. In some embodiments, the second gate structure 212 is a high-k/metal gate (HKMG) structure and may be formed by, for example, depositing an interfacial layer 222 over the substrate 200, a high-k dielectric layer 224 over the interfacial layer 222, a work function metal layer 226 over the high-k dielectric layer 224, and a gate fill metal 228 over the work function metal layer 226, and then performing a CMP process on these deposited materials until the first ILD layer 242 is exposed.

In some embodiments, the interfacial layer 222 is silicon oxide and may be formed by, for example, chemical oxidation, thermal oxidation, atomic layer deposition (ALD), chemical vapor deposition (CVD), and/or other suitable method. The second gate structure 212 is electrically isolated from the first gate structure 210 at least by the interfacial layers 214 and 222. In some embodiments where the interfacial layer 214 of the first gate structure 210 and the interfacial layer 222 of the second gate structure 212 are both silicon oxide, they may have no distinguishable interface therebetween. In some embodiments, the high-k dielectric layer 224 has a high dielectric constant, for example, greater than that of thermal silicon oxide (~3.9). Promising candidates of the material of the high-k dielectric layer 224 are similar to that of the high-k dielectric layer 216 of the first gate structure 210, and thus they are not repeated for the sake of brevity. In some embodiments, the high-k dielectric layer 224 has a same high-k dielectric material as the high-k dielectric layer 216 of the first gate structure 210. In some other embodiments, the high-k dielectric layer 224 has a different high-k dielectric material from the high-k dielectric layer 216 of the first gate structure 210.

In some embodiments, the work function metal layer 226 may include one or more work function metals to provide a suitable work function for the high-k/metal gate structure 212, and the gate fill metal 228 serves to fill a remainder of the opening in the ILD layer 242. Promising candidates of the materials of the work function metal layer 226 and the gate fill metal 228 are similar to that of the work function metal layer 218 and the gate fill metal 220 of the first gate structure 210, and thus they are not repeated for the sake of brevity. In some embodiments, the work function metal layer 226 has same one or more work function metals as the work function metal layer 218 of the first gate structure 210. In some other embodiments, the work function metal layer 226 has a different work function metal from the work function metal layer 218 of the first gate structure 210. In some embodiments, the gate fill metal 228 has a same metal as the gate fill metal 220 of the first gate structure 210. In some other embodiments, the gate fill metal 228 has a different metal from the gate fill metal 220 of the first gate structure 210.

Figure 22B:
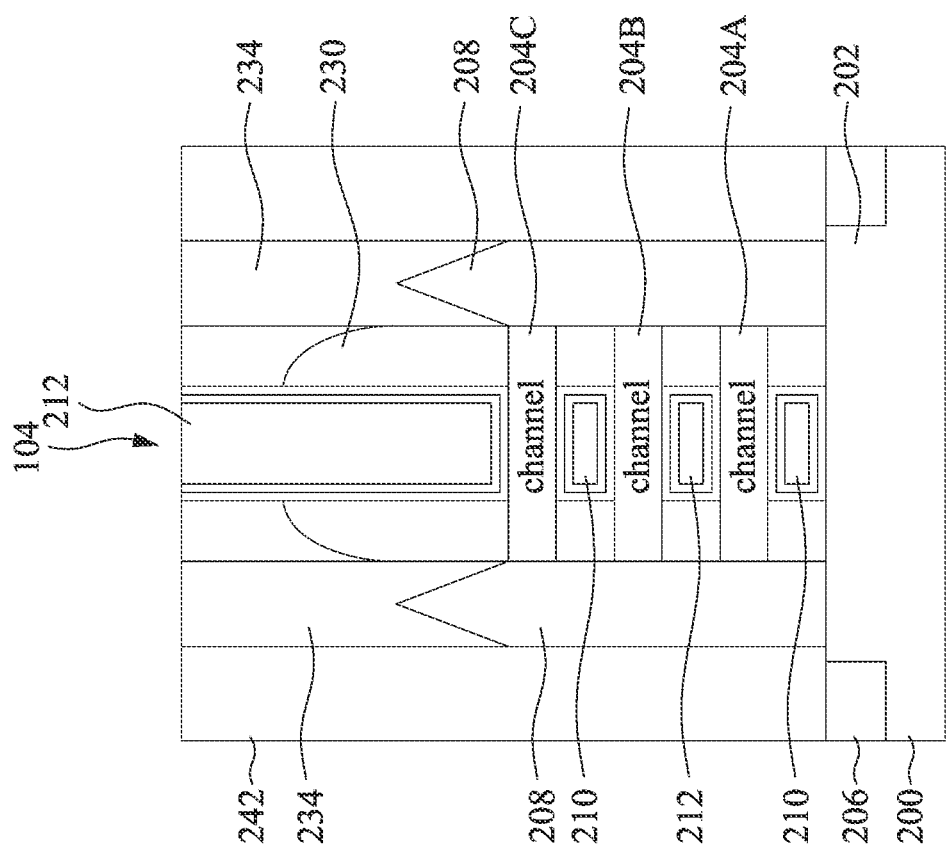
Figure 22A:
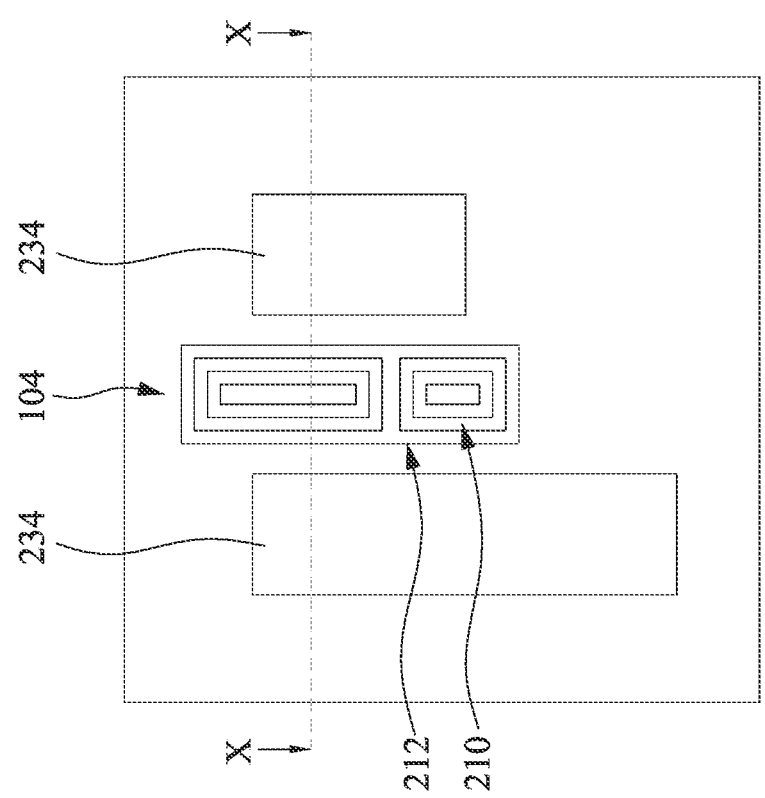

FIG. 22A is a top view of an intermediate stage in manufacturing of an IC structure, and FIG. 22B is a cross-sectional view obtained from cut X-X in FIG. 22A. In FIGS. 22A-22B, source/drain contacts 234 are formed in the first ILD layer 242 and over the epitaxial source/drain regions 208. Formation of the source/drain contacts 234 includes, by way of example and not limitation, performing one or more etching processes to form contact openings extending through the first ILD layer 242 to expose the source/drain regions 208, depositing one or more metal materials (e.g., titanium nitride, tungsten, cobalt, copper, the like or combinations thereof) overfilling the contact openings by using suitable deposition techniques (e.g., CVD, PVD, ALD, the like or combinations thereof), and then performing a CMP process to remove excessive metal materials outside the contact openings. The fabrication of the MRAM access transistor 104 and source/drain contacts 234 on source/drain regions of the transistor 104 is complete. Fabrication of the MRAM access transistor 104 can be called a front-end-of-line (FEOL) process.

Figure 23:
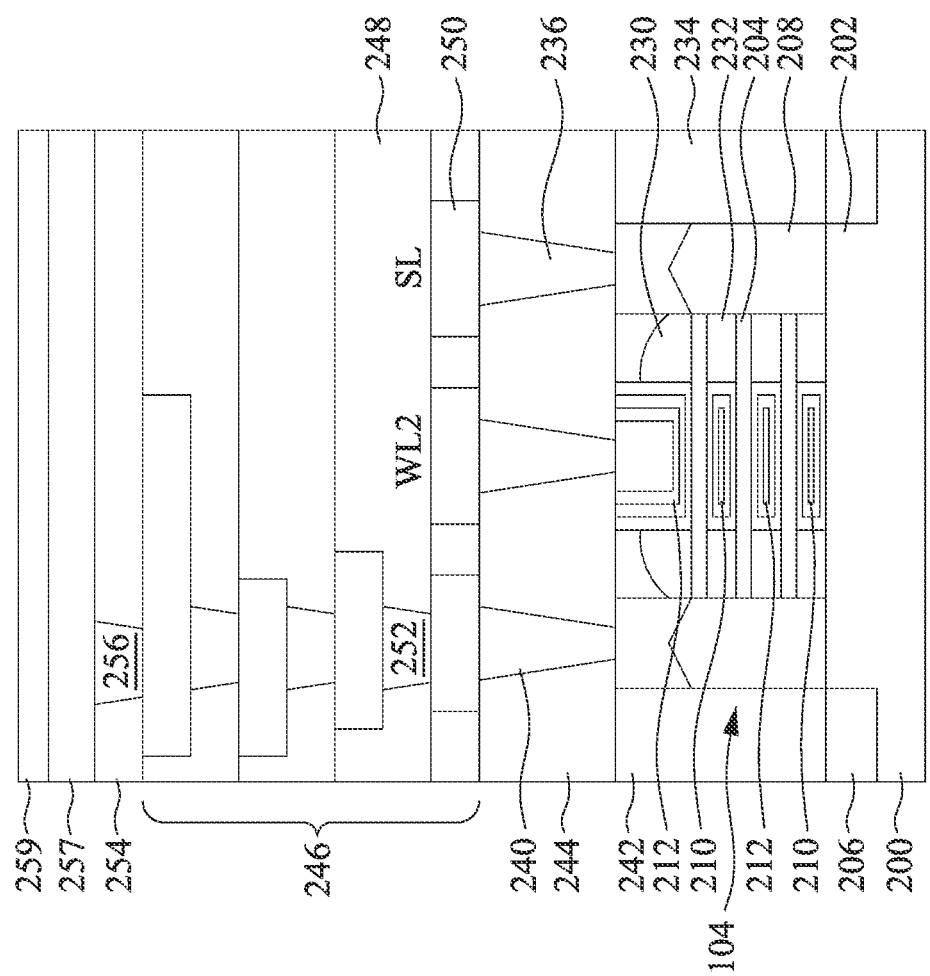

In FIG. 23, after the source/drain contacts 234 are formed, a second ILD layer 244 is deposited over the first ILD layer 242 by using suitable deposition techniques. Promising candidates of the material of the second ILD layer 244 are similar to that of the first ILD layer 242, and thus they are not repeated for the sake of brevity. First and second gate contacts 238, 240 (as illustrated in FIG. 10) and source/drain vias 236 are formed in the second ILD layer 244 by etching openings in the second ILD layer 244, depositing one or more metal materials in the openings, and performing a CMP process to remove excess materials outside the openings. Fabrication of the source/drain contacts 234, gate contacts 238, 240, and source/drain vias 236 can be called a middle-end-of-line (MEOL) process.

A back-end-of-line (BEOL) process is then performed to form a multilevel interconnect structure 246 over the second ILD layer 244 and the MEOL conductive features. The multilevel interconnect structure 246 includes a plurality of inter-metal dielectric (IMD) layers 248 formed using suitable deposition techniques, one or more metal lines 250 and one or more metal vias 252 formed in the respective IMD layers 248, by using any suitable method, such as a single damascene process, a dual damascene process, or the like. In some embodiments, the IMD layers 248 may include low-k dielectric materials having k values, for example, lower than about 4.0 or even 2.0 disposed between such conductive features. In some embodiments, the IMD layers may be made of, for example, phosphosilicate glass (PSG), boro-phosphosilicate glass (BPSG), fluorosilicate glass (FSG), SiOxCy, Spin-On-Glass, Spin-On-Polymers, silicon oxide, silicon oxynitride, combinations thereof, or the like, formed by any suitable method, such as spin-on coating, chemical vapor deposition (CVD), plasma-enhanced CVD (PECVD), or the like. The metal lines 250 and the metal vias 252 may comprise conductive materials such as copper, aluminum, tungsten, combinations thereof, or the like. In some embodiments, the metal lines 250 and the metal vias 252 may further comprise one or more barrier/adhesion layers (not shown) to protect the respective IMD layers 248 from metal diffusion (e.g., copper diffusion) and metallic poisoning. The one or more barrier/adhesion layers may comprise titanium, titanium nitride, tantalum, tantalum nitride, or the like, and may be formed using physical vapor deposition (PVD), CVD, ALD, or the like.

A dielectric layer 254 is deposited over the multilevel interconnect structure 246 by using suitable deposition techniques. In some embodiments, the dielectric layer 254 may include low-k dielectric materials as discussed previously with respect to the IMD layers 248, and may have a thickness in a range from about 1 nm to about 1 μm. Next, a bottom electrode via (BEVA) 256 is formed in the dielectric layer 254 by etching an via opening in the dielectric layer 254, depositing one or more metal materials in the openings, and performing a CMP process to remove excess materials outside the opening. An MTJ layer stack 257 is then deposited over the dielectric layer 254. The MTJ layer stack 257 includes, as illustrated in FIGS. 2A-2B, a bottom electrode layer 124, a seed layer 125, a pinned layer 126, metal spacer layer 127, a reference layer 128, a tunnel barrier layer 129, a free layer 130, and a capping layer 131. Details about these layers are discussed previously with respect to FIGS. 2A and 2B, and thus they are not repeated for the sake of brevity.

A metal hard mask layer 259 is deposited over the MTJ layer stack 257. In some embodiments, the metal hard mask layer 259 includes Ta, TiN, other suitable metals, or combinations thereof. The metal hard mask layer 259 has a thickness in a range from about 10 nm to about 500 nm.

Figure 24:
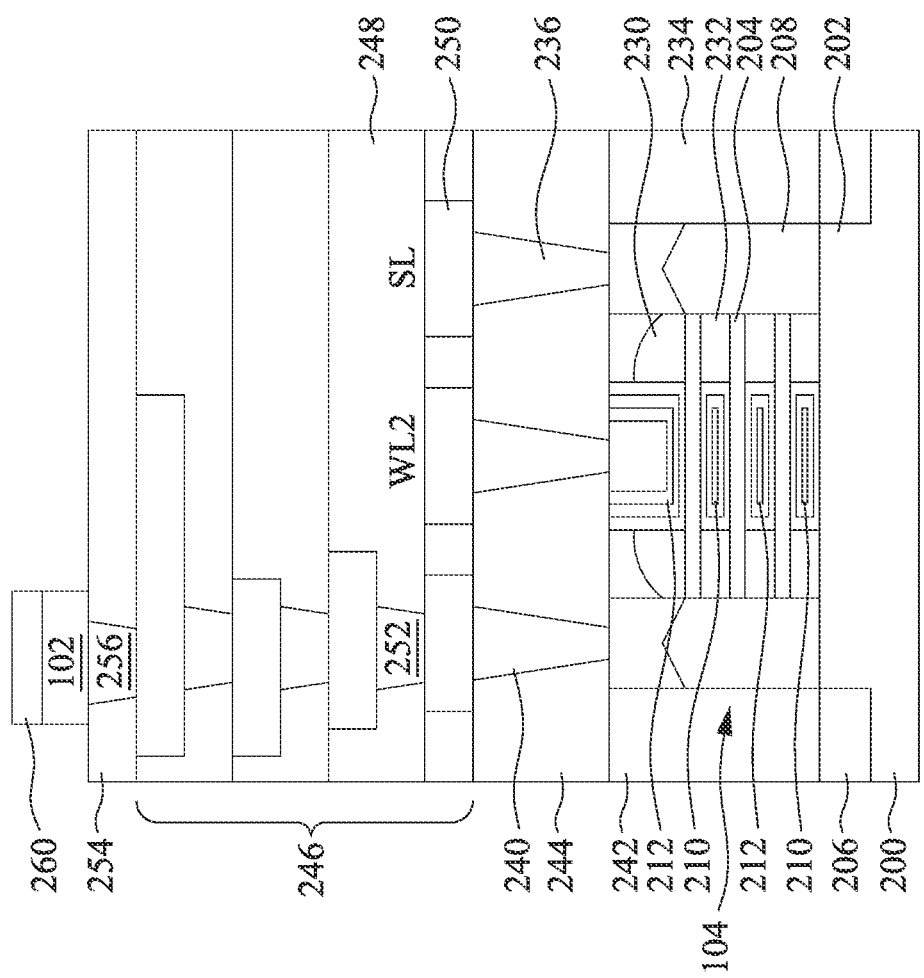

In some embodiments as illustrated in FIG. 24, the metal hard mask layer 259 and the MTJ layer stack 257 are patterned to form a metal hard mask 260 and an MTJ cell 102 below the metal hard mask 260 by using suitable photolithography and etching techniques.

Figure 25:
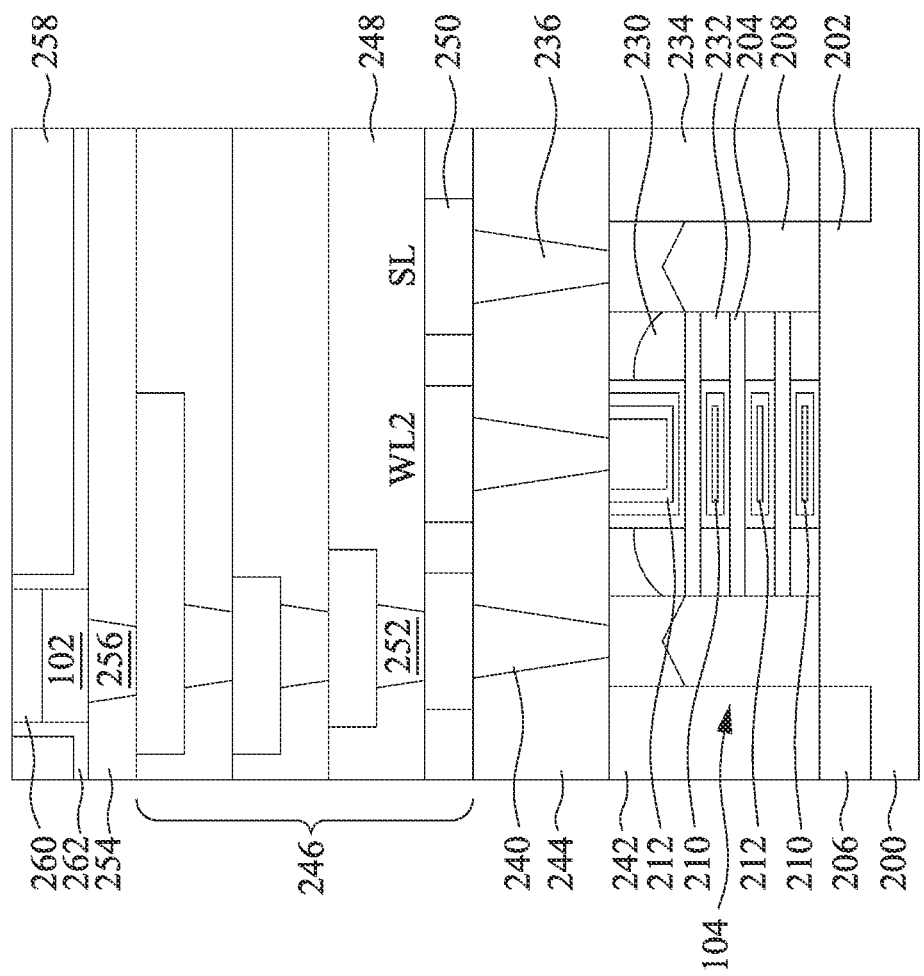

In some embodiments as illustrated in FIG. 25, a passivation layer 262 is conformally deposited over the metal hard mask and the MTJ cell 102, a dielectric layer 258 is deposited over the passivation layer 262, and a CMP process is performed on the dielectric layer 258 and the passivation layer 262 until the metal hard mask 260 is exposed. In some embodiments, the passivation layer 262 includes silicon nitride or other suitable dielectric materials and has a thickness in a range from about 1 nm to about 50 nm. In some embodiments, the dielectric layer 258 includes a low-k dielectric material as discussed previously with respect to the IMD layers 248.

Figure 26:
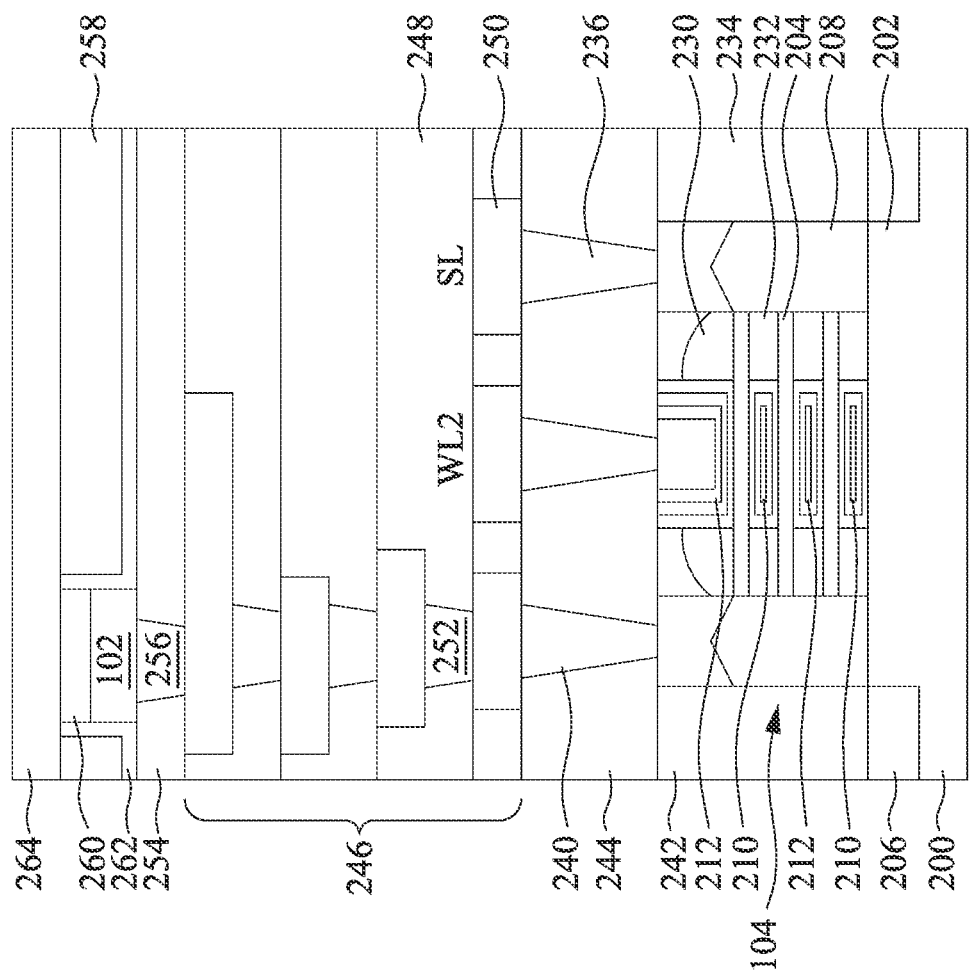
Figure 27:
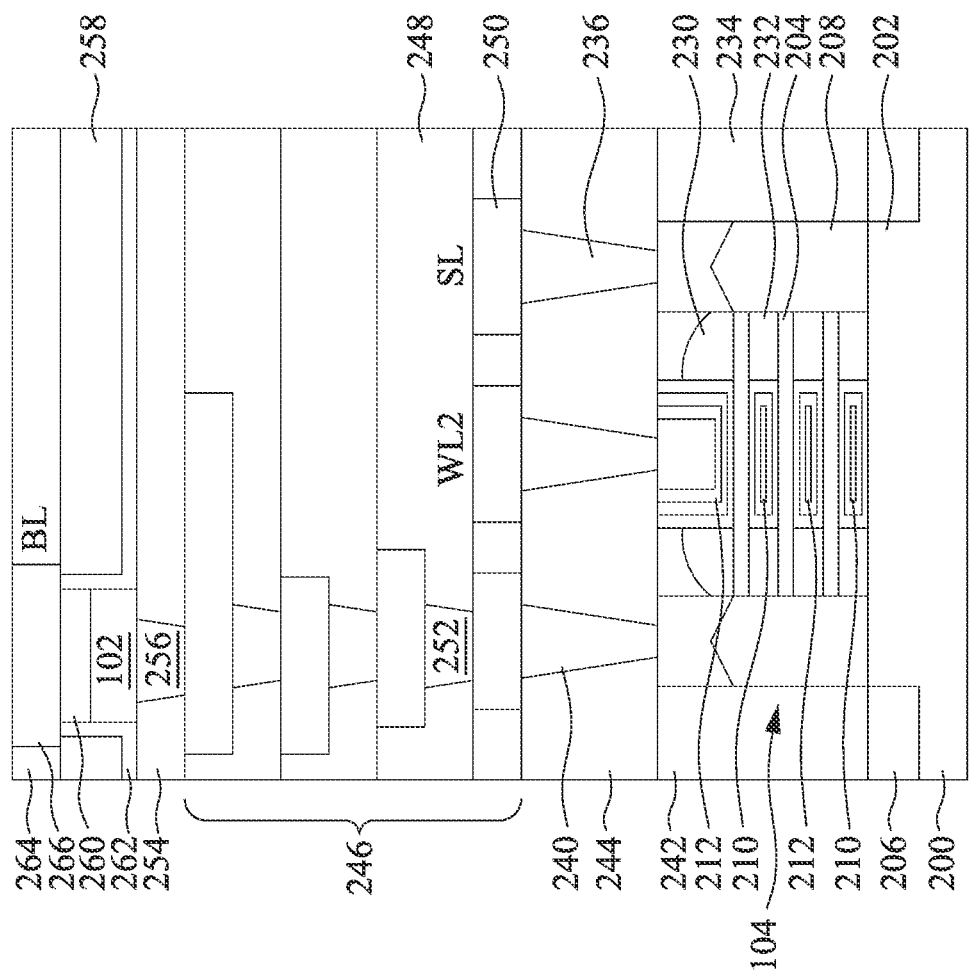

In some embodiments as illustrated in FIG. 26, another dielectric layer 264 is deposited over the dielectric layer 258 and the metal hard mask 260 by using suitable deposition techniques. The dielectric layer 264 includes a low-k dielectric material as discussed previously with respect to the IMD layers 248. In some embodiments, a total thickness of the dielectric layers 264 and 258 is in a range from about 10 nm to about 500 nm. Then, in FIG. 27, a metal line 266 is formed in the dielectric layer 264 to serve as a bit line BL for the MTJ cell 102. The metal line 266 can be formed by, for example, etching a trench in the dielectric layer 264 by using suitable photolithography and etching techniques, depositing one or more metal materials (e.g., copper) in the trench, and then performing a CMP process to remove excess metal materials outside the trench of the dielectric layer 264.

Figure 28:
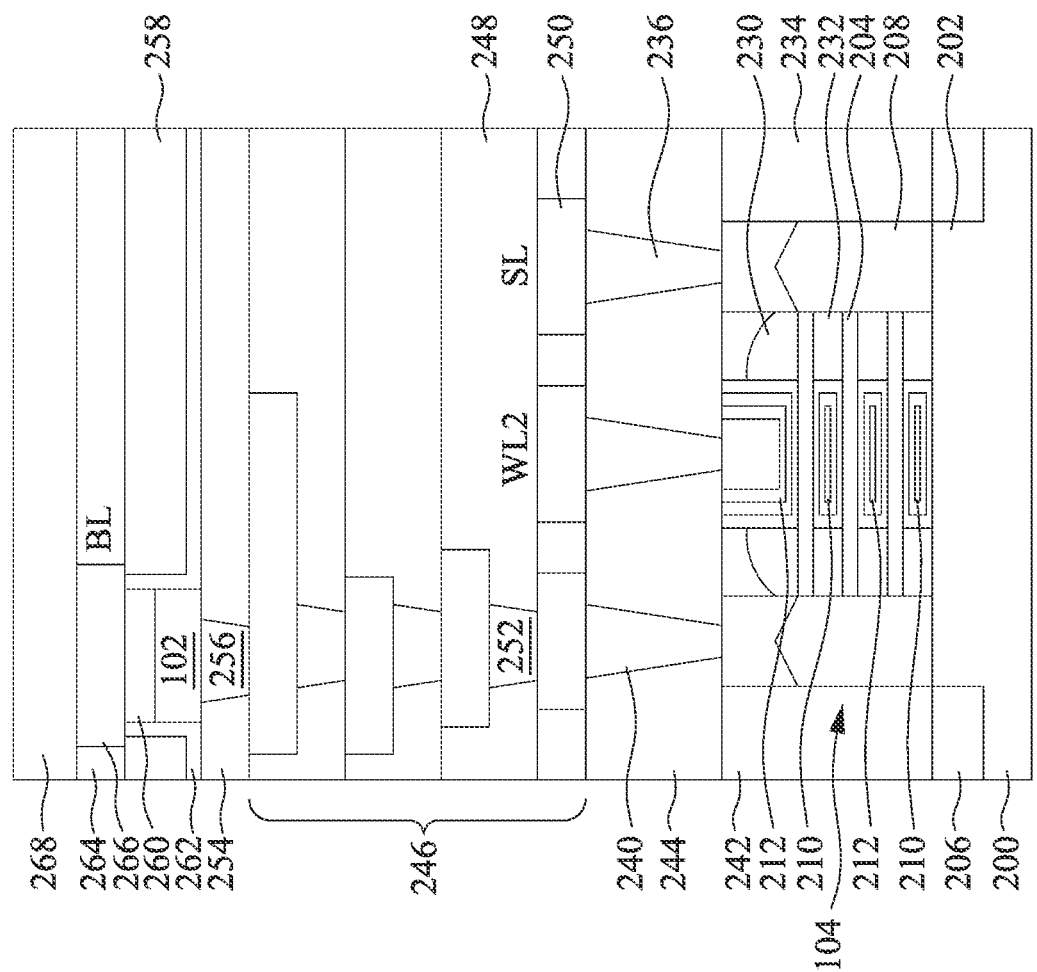
Figure 29:
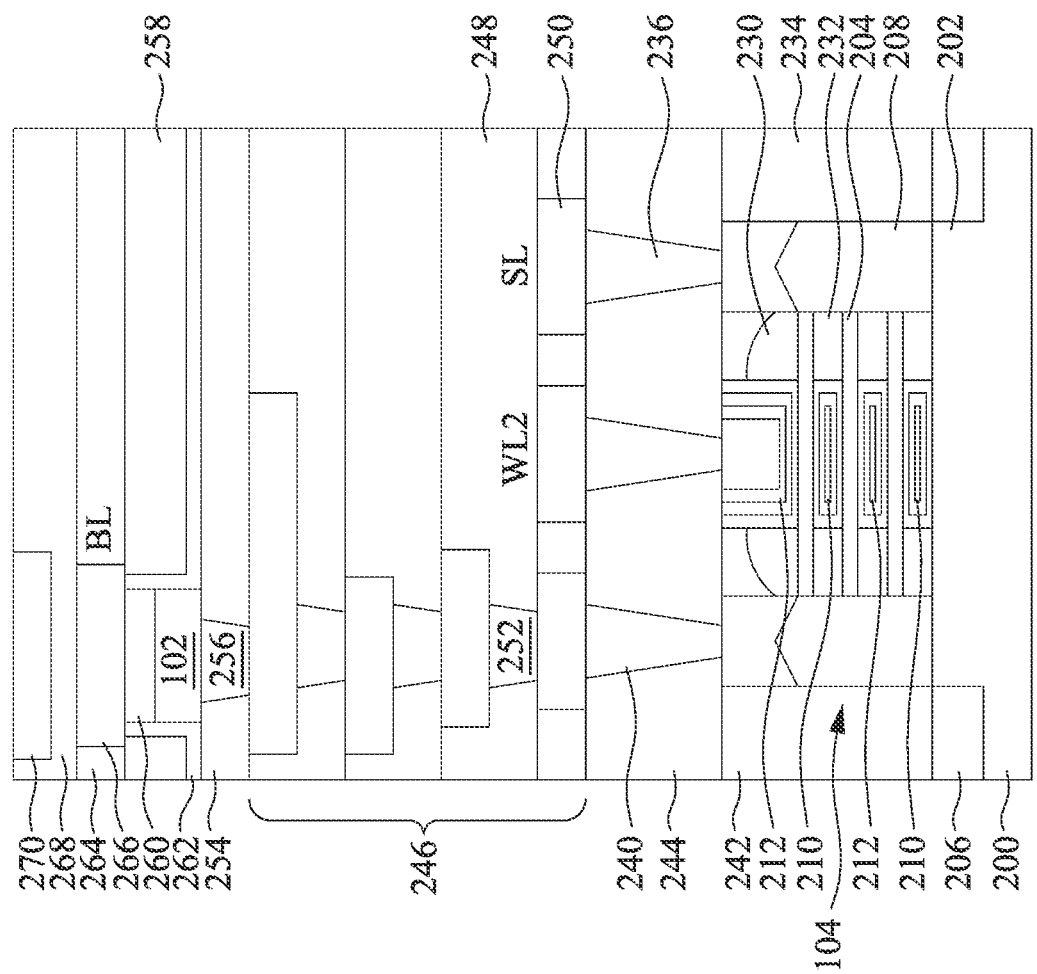

In some embodiments as illustrated in FIG. 28, another dielectric layer 268 is deposited over the dielectric layer 264 and the metal line 266 by using suitable deposition techniques. The dielectric layer 268 includes a low-k dielectric material as discussed previously with respect to the IMD layers 248, and has a thickness in a range from about 10 nm to about 500 nm. Then, in FIG. 29, a magnetic field induced layer 270 is formed in the dielectric layer 268 by, for example, etching a recess in the dielectric layer 268 by using suitable photolithography and etching techniques, depositing one or more metal materials in the recess, and then performing a CMP process to remove excess metal materials outside the recess of the dielectric layer 268. In some embodiments, the magnetic field induced layer 270 includes cobalt or other suitable metals and has a thickness in a range from about 1 nm to about 100 nm. After forming the magnetic field induced layer 270, the BEOL process continues to form one or more interconnect layers over the dielectric layer 268 to complete fabrication of the IC structure.

Figure 30C:
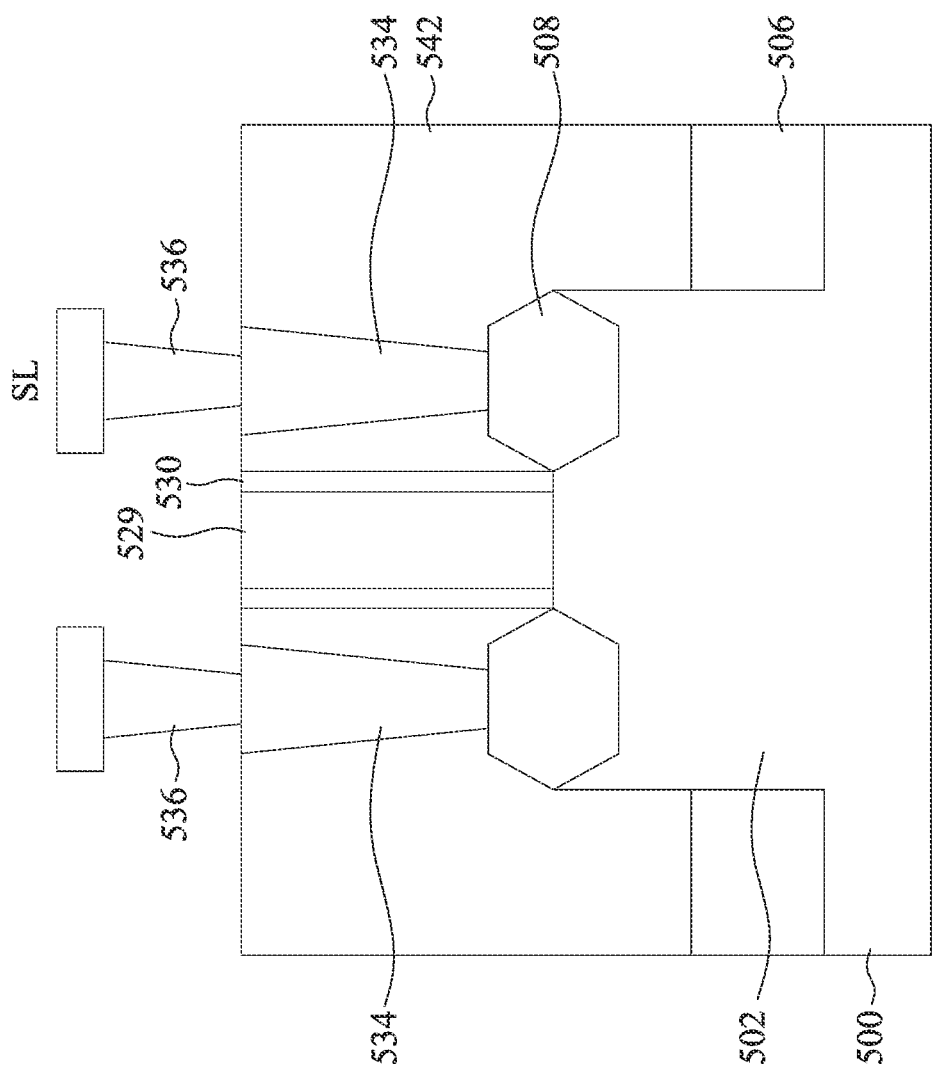
FIG. 30C is a cross-sectional view of the IC structure of FIG. 30A obtained from a second cut, which is along the longitudinal axis of the fin of the fin-type MRAM access transistor.
Figure 30E:
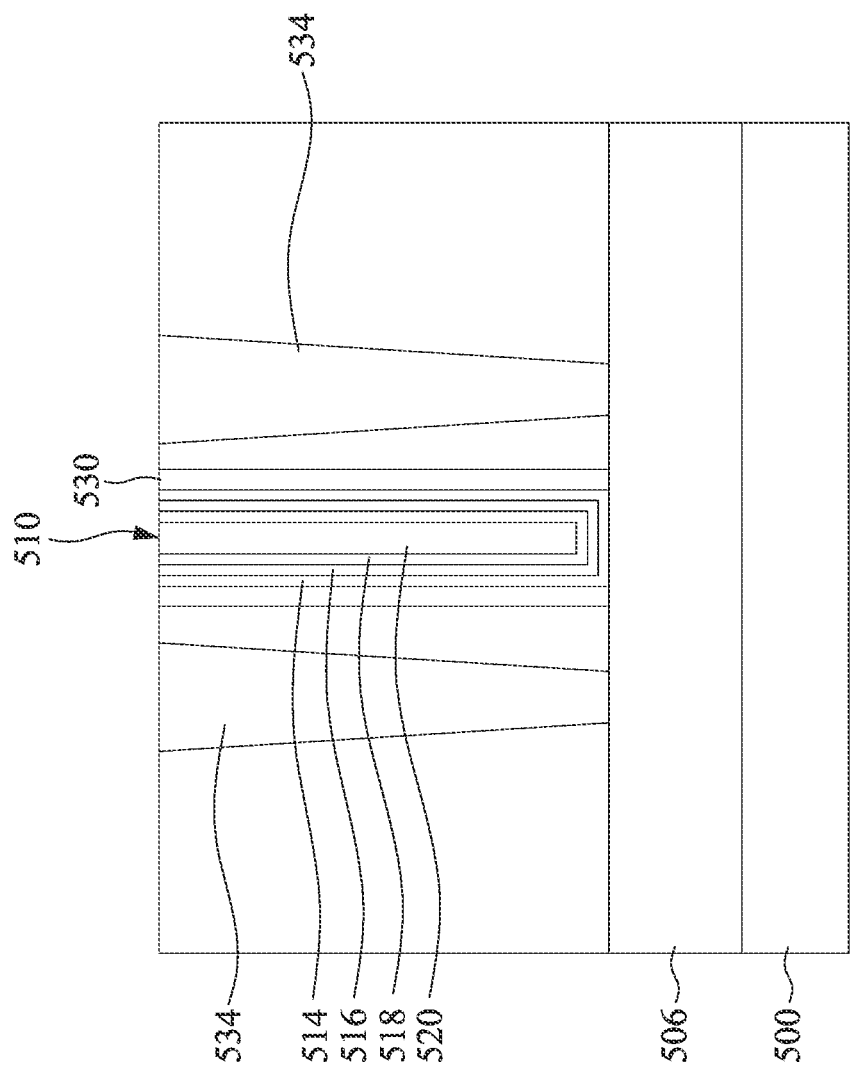
FIG. 30E is a cross-sectional view of the IC structure of FIG. 30A obtained from a fourth cut, which is along the longitudinal axis of the fin of the fin-type MRAM access transistor but offset from the fin.

In the embodiments as illustrated in FIGS. 10A-29, the IC structure uses a gate-all-around (GAA) transistor having two independent gates to serve as the MRAM access transistor. However, in some other embodiments, the MRAM access transistor can be a fin field-effect transistor (FinFET) having two independent gates, as illustrated in FIGS. 30A-30E. FIG. 30A is a plan view of an integrated circuit (IC) structure zoomed-in to a fin-type MRAM access transistor 404 having independent gates coupled to different word lines, in accordance with some embodiments of the present disclosure. FIG. 30B is a cross-sectional view of the IC structure obtained from a first cut (e.g., cut Y-Y in FIG. 30A), which is perpendicular to a longitudinal axis of the fin of the fin-type MRAM access transistor 404. FIG. 30C is a cross-sectional view of the IC structure obtained from a second cut (e.g., cut X1-X1 in FIG. 30A), which is along the longitudinal axis of the fin of the fin-type MRAM access transistor 404. FIG. 30D is a cross-sectional view of the IC structure obtained from a third cut (e.g., cut X2-X2 in FIG. 30A), which is along the longitudinal axis of the fin of the fin-type MRAM access transistor 404 but offset from the fin. FIG. 30E is a cross-sectional view of the IC structure obtained from a fourth cut (e.g., cut X3-X3 in FIG. 30A), which is along the longitudinal axis of the fin of the fin-type MRAM access transistor 404 but offset from the fin.

In some embodiments, the fin-type MRAM access transistor 404 comprises a fin 502 on a substrate 500, wherein the fin 502 acts as a semiconductor channel for the transistor 404. Isolation regions 506 are disposed between adjacent fins 502, which may protrude above and from between neighboring isolation regions 506. Although a bottom portion of the fin 502 are illustrated as being single, continuous materials with the substrate 500, the bottom portion of the fin 502 and/or the substrate 500 may comprise a single material or a plurality of materials. In this context, the fin 502 refers to the portion extending between the neighboring isolation regions 506.

The MRAM access transistor 404 includes epitaxial source/drain regions 508 disposed on the fin 502 and on separate regions of the fin 502. The MRAM access transistor 404 further includes a first gate structure 510 on a first side FS3 of the fin 502 and a second gate structure 512 on a second side FS4 of the fin 502. As a result, the first gate structure 510 controls a first side channel region (e.g., left side channel region) of the fin 502, and the second gate structure 512 controls a second side channel region (e.g., right side channel region) of the fin 502.

The first gate structure 510 includes an interfacial layer 514, a high-k dielectric layer 516 over the interfacial layer 514, a work function metal layer 518 over the high-k dielectric layer 516, and a gate fill metal 520 over the work function metal layer 518. The second gate structure 512 also includes an interfacial layer 522, a high-k dielectric layer 524 over the interfacial layer 522, a work function metal layer 526 over the high-k dielectric layer 524, and a gate fill metal 528 over the work function metal layer 526. The first and second gate structures 510 and 512 are electrically isolated by a gate-cut dielectric structure 529, and thus the first and second gate structures 510 and 512 can serve as two independent gate terminals G1 and G2 that are independently controlled by different word lines WL1 and WL2.

Gate spacers 530 are disposed around sidewalls of the first and second gate structure 510 and 512 from a top view as illustrated in FIG. 30A. The gate spacers 530 may serve to electrically isolate the first, second gate structures 510, 512 from the epitaxial source/drain regions 508.

Source/drain contacts 534 are disposed on the epitaxially source/drain regions 508, respectively. An ILD layer 542 is formed around the source/drain contacts. Source/drain vias 536 are respectively disposed on the source/drain contacts 534. First and second gate contact 538 and 540 are disposed on the first and second gate structures 510 and 512, respectively. The first and second gate contacts 538 and 540, the source/drain contacts 534 and the source/drain vias 536 can be referred to as middle-end-of-line (MEOL) conductive features that electrically connect front-end-of-line (FEOL) conductive features (e.g., first and second gate structures 510 and 512, and source/drain regions 508 of the MRAM access transistor 404) to back-end-of-line (BEOL) features (e.g., first and second word lines WL1, WL2, the source line SL, and the MTJ cell 102), which in turn allows the MRAM access transistor 404 being electrically coupled to the MTJ cell 102 to perform AND/OR logic operations as discussed previously.

FIGS. 31A-38B are cross-sectional views of intermediate stages in the manufacturing of an FinFET having two independent gates for implementing 1T-1MTJ cell with logic functions, in accordance with some embodiments of the present disclosure. The manufacturing process steps can be used to fabricate the IC structure as illustrated in FIGS. 30A-30E. In FIGS. 31A-38B, the "A" figures (e.g., FIGS. 31A, 32A, etc.) illustrate a cross-sectional view corresponding to the cut X1-X1 in FIG. 30A, and the "B" figures (e.g., FIGS. 31B, 32B, etc.) illustrate a cross-sectional view corresponding to the cut Y-Y in FIG. 30A. It is understood that additional operations can be provided before, during, and after processes shown by FIGS. 31A-38B, and some of the operations described below can be replaced or eliminated, for additional embodiments of the method. The order of the operations/processes may be interchangeable.

Figure 31B:
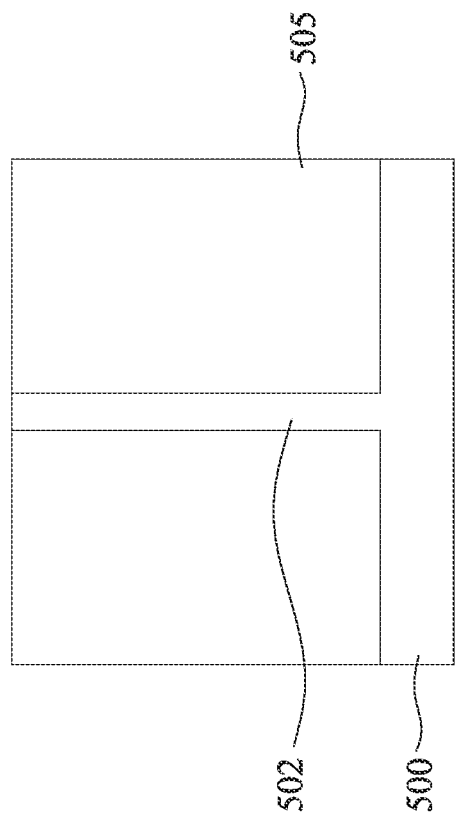
FIGS. 31A-38B are cross-sectional views of intermediate stages in the manufacturing of an FinFET having two independent gates, in accordance with some embodiments of the present disclosure.

FIGS. 31A and 31B illustrate an initial structure that includes a substrate 500. The substrate 500 may be a semiconductor substrate, such as a bulk semiconductor, a semiconductor-on-insulator (SOI) substrate, or the like, which may be doped (e.g., with a p-type or an n-type dopant) or undoped. Details about the substrate 500 are similar to that of the substrate 200, and thus they are not repeated for the sake of brevity. FIGS. 31A and 31B also illustrates a fin 502 formed in the substrate 500. In some embodiments, the fin 502 may be formed in the substrate 500 by etching trenches in the substrate 500. The etching may be any acceptable etch process, such as a reactive ion etch (RIE), neutral beam etch (NBE), the like, or combinations thereof. The etch may be anisotropic.

The fins may be patterned by any suitable method. For example, the fin 502 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fin 502.

Once fins 502 are formed, an insulation material 505 is formed over the substrate 500 and between neighboring fins 502. The insulation material 505 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials formed by any acceptable process may be used. In the illustrated embodiment, the insulation material 505 is silicon oxide formed by a FCVD process. An anneal process may be performed once the insulation material is formed. In some embodiments, the insulation material 505 is formed such that excess insulation material 505 covers the fin 502. Although the insulation material 505 is illustrated as a single layer, some embodiments may utilize multiple layers. For example, in some embodiments a liner (not shown) may first be formed along a surface of the substrate 500 and the fins 502. Thereafter, a fill material, such as those discussed above may be formed over the liner.

Once the insulation material 505 is deposited over the fin 502, a removal process is applied to the insulation material 505 to remove excess insulation material 505 over the fin 502. In some embodiments, a planarization process such as a chemical mechanical polish (CMP), an etch-back process, combinations thereof, or the like may be utilized. The planarization process exposes the fin 502 such that top surface of the fin 502 and the insulation material 505 are level after the planarization process is complete.

Figure 32A:
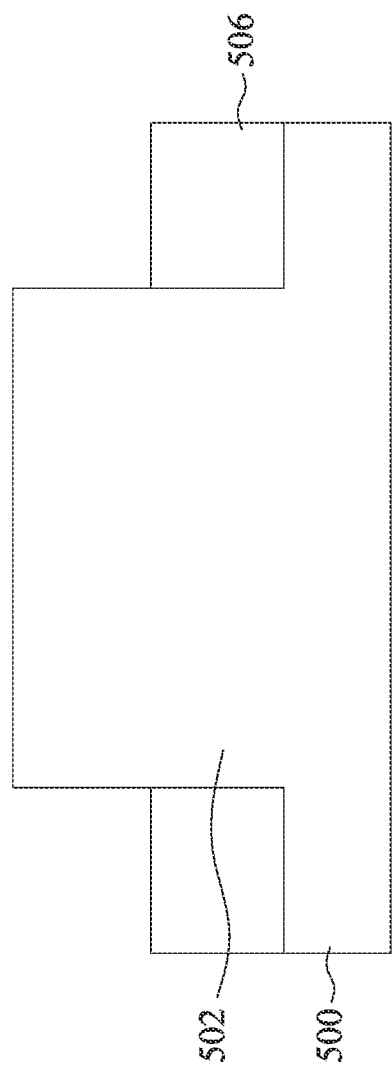
Figure 32B:
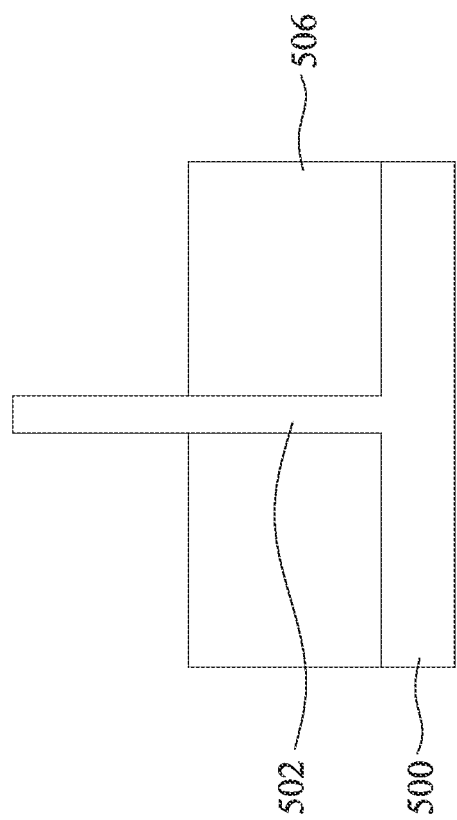

In FIGS. 32A-32B, the insulation material 505 is recessed to form Shallow Trench Isolation (STI) regions 506. The insulation material 505 is recessed such that upper portion of fin 502 protrudes from between neighboring STI regions 506. Further, the top surface of the STI region 506 may have a flat surface as illustrated, a convex surface, a concave surface (such as dishing), or combinations thereof. The top surface of the STI region 506 may be formed flat, convex, and/or concave by an appropriate etch. The STI region 506 may be recessed using an acceptable etching process, such as one that is selective to the material of the insulation material 505 (e.g., etches the material of the insulation material 505 at a faster rate than the material of the fin 502). For example, an oxide removal using, for example, dilute hydrofluoric (dHF) acid may be used.

The process described with respect to FIGS. 31A-32B is just one example of how the fins 502 may be formed. In some embodiments, fins may be formed by an epitaxial growth process. For example, a dielectric layer can be formed over a top surface of the substrate 500, and trenches can be etched through the dielectric layer to expose the underlying substrate 500. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 502. For example, the fin 502 in FIGS. 32A-32B can be recessed, and a material different from the fin 502 may be epitaxially grown over the recessed fin 502. In such embodiments, the fin 502 comprises the recessed material as well as the epitaxially grown material disposed over the recessed material. In an even further embodiment, a dielectric layer can be formed over a top surface of the substrate 500, and trenches can be etched through the dielectric layer. Heteroepitaxial structures can then be epitaxially grown in the trenches using a material different from the substrate 500, and the dielectric layer can be recessed such that the heteroepitaxial structures protrude from the dielectric layer to form the fins 502. In some embodiments where homoepitaxial or heteroepitaxial structures are epitaxially grown, the epitaxially grown materials may be in-situ doped during growth, which may obviate prior and subsequent implantations although in situ and implantation doping may be used together.

Figure 33B:
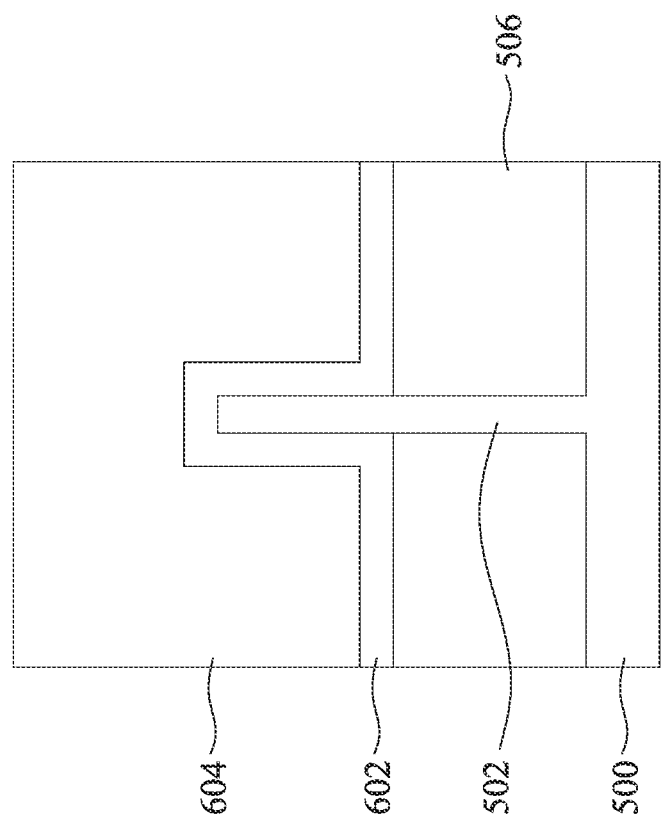

In FIGS. 33A-33B, a dummy gate dielectric layer 602 is formed over the fin 502, and a dummy gate structure 604 is formed over the dummy gate dielectric layer 602. Formation of the dummy gate dielectric layer 602 and the dummy gate structure 604 includes, for example, depositing a layer of dielectric material over the fin 502 and a layer of dummy gate material over the layer of dielectric material by using suitable deposition techniques, followed by patterning the layer of dummy gate material into the dummy gate structure 604 and patterning the layer of dielectric material into the dummy gate dielectric layer 602 by using suitable photolithography and etching techniques. The resultant dummy gate structure 604 has a longitudinal axis perpendicular to the longitudinal axis of the fin 502. Materials of the dummy gate dielectric layer 602 and the dummy gate structure 604 are similar to that of the sacrificial dielectric layer 306 and dummy gate structure 308 as discussed previously with respect to FIGS. 12A and 12B.

Figure 34A:
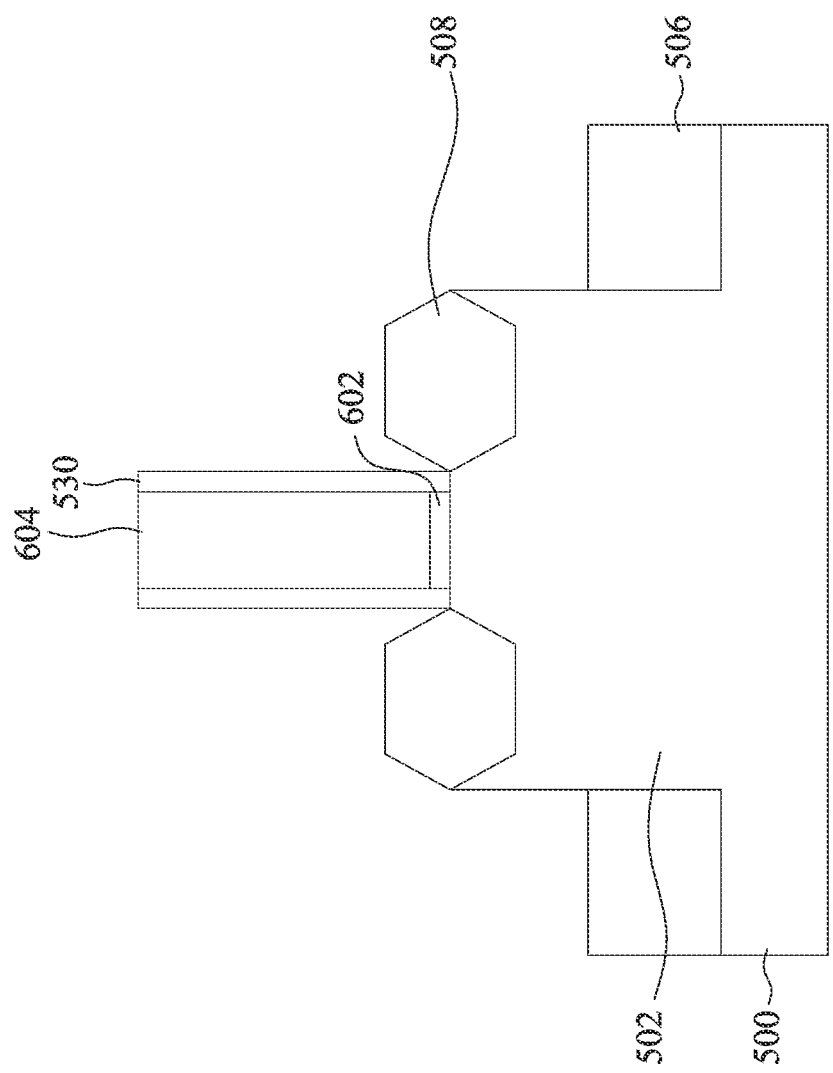
Figure 34B:
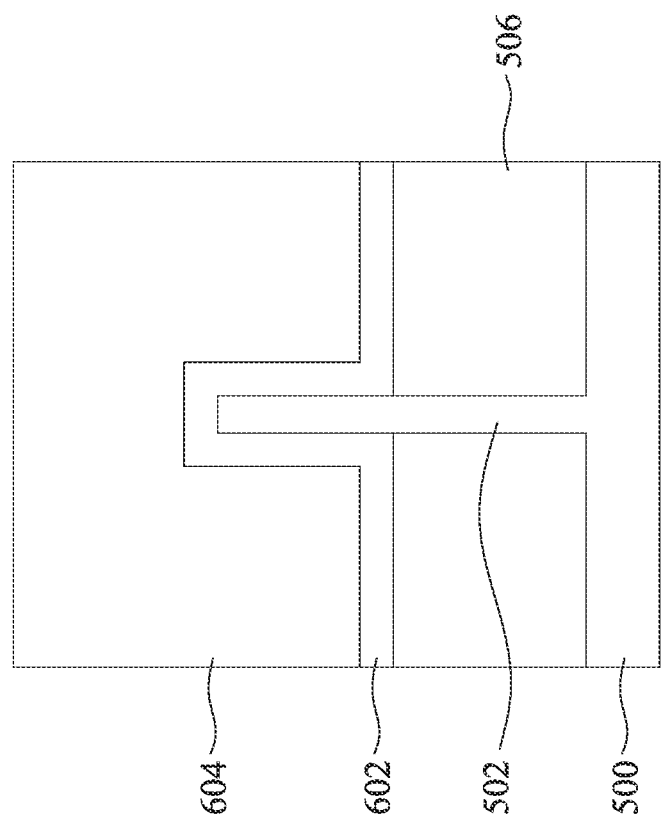

In FIGS. 34A and 34B, gate spacers 530 are formed on sidewalls of the dummy gate structure 608. In some embodiments of the spacer formation step, a spacer material layer is deposited on the substrate 500. An anisotropic etching process is then performed on the deposited spacer material layer to expose portions of the fin 502 not covered by the dummy gate structure 604 (e.g., in source/drain regions of the fin 502). Portions of the spacer material layer directly above the dummy gate structure 604 may be completely removed by this anisotropic etching process. Portions of the spacer material layer on sidewalls of the dummy gate structure 604 may remain, forming gate sidewall spacers, which is denoted as the gate spacers 530, for the sake of simplicity. Materials of the gate spacers 530 are similar to that of the gate spacers 230 as discussed previously with respect to FIGS. 13A and 13B, and thus they are not repeated for the sake of brevity.

After the gate spacers 530 are formed, epitaxial source/drain regions 508 are formed on the fin 502 and on opposite sides of the dummy gate structure 604. For example, exposed portions of the semiconductor fin 502 that extend laterally beyond the gate spacers 530 (e.g., in source and drain regions of the fin 502) are etched by using, for example, an anisotropic etching process that uses the dummy gate structure 604 and the gate spacers 530 as an etch mask, resulting in recesses into the semiconductor fin 502. In some embodiments, the anisotropic etching may be performed by a dry chemical etch with a plasma source and a reaction gas. The plasma source may be an inductively coupled plasma (ICR) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof. Then, the epitaxial source/drain regions 508 are epitaxially grown in the recesses of the fin 502. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of semiconductor material of the fin 502. In some embodiments, an epitaxial material may be deposited by a selective epitaxial growth (SEG) process to fill the recesses of the fin 502 and extend further beyond the original surface of the semiconductor fin 502 to form raised epitaxy structures 508, which have top surfaces higher than top surfaces of the semiconductor fin 502. Details about epitaxial materials and dopants of the epitaxial source/drain regions 508 are similar to the epitaxial source/drain regions 208 as discussed previously with respect to FIGS. 14A and 14B, and thus they are not repeated for the sake of brevity.

Figure 35A:
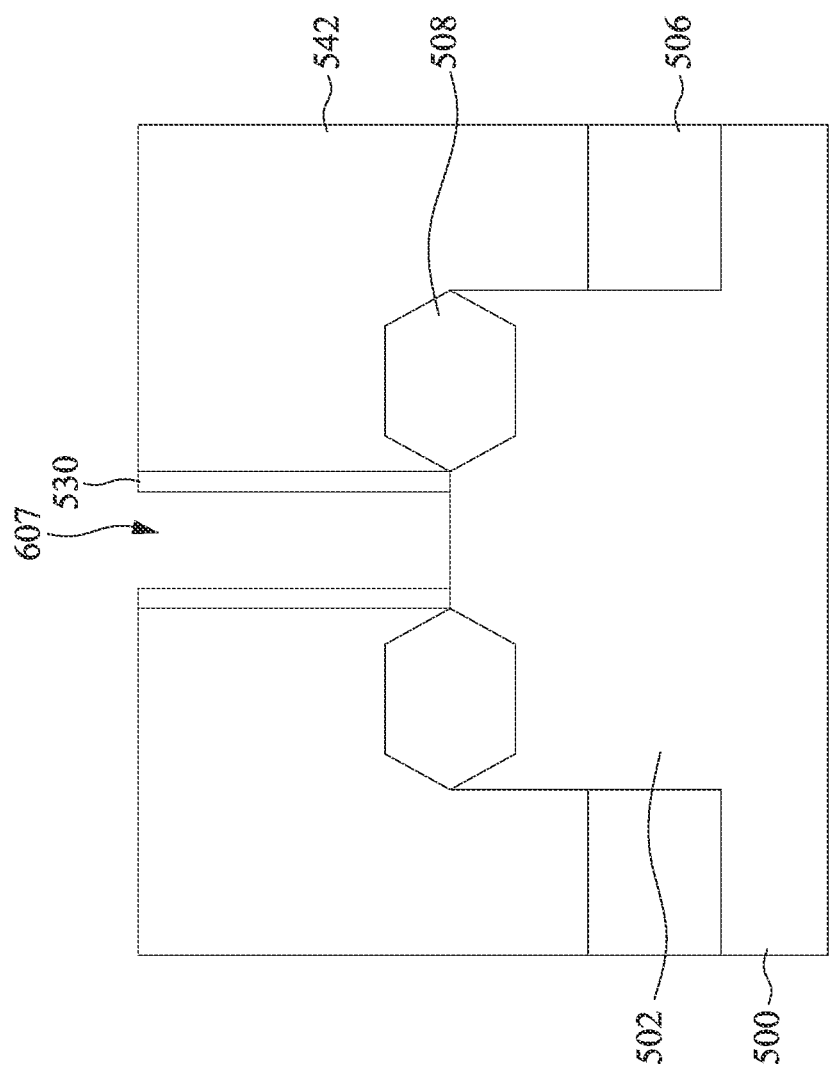
Figure 35B:
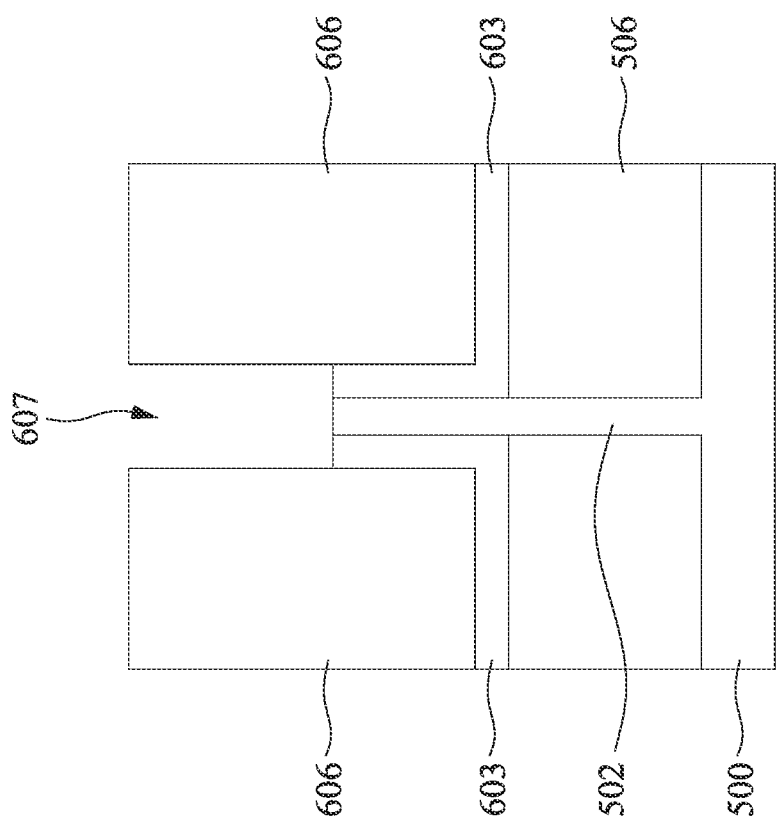

In FIGS. 35A and 35B, an ILD layer 542 is formed over the substrate 500. The ILD layer 542 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. Then, a planarization process, such as a CMP, may be performed to level the top surface of the ILD layer 542 with the top surface of the dummy gate structure 604.

FIGS. 35A and 35B also illustrate cutting or separation of the dummy gate structure 604 into individual and separated dummy gates 606 in accordance with some embodiments. For example, one or more etching processes are performed to cut the dummy gate structure 604, so that a gate-cut opening 607 is formed between individual dummy gates 606. During the one or more etching processes, a patterned mask (not shown) can be formed to protect portions of the dummy gate structure 604 that are not to be removed, and the patterned mask can be removed after the one or more etching processes. The etching duration time is controlled such that the etching stops when the top surface of the fin 502 gets exposed. In some embodiments, the dummy gate dielectric layer 602 is also etched and separated into individual dummy gate dielectric layers 603 as well. In some embodiments where the dummy gate structure 604 is formed of polysilicon, the gate-cut opening 607 can be referred to as cut polysilicon (CPO) regions that cut the polysilicon gates.

Figure 36A:
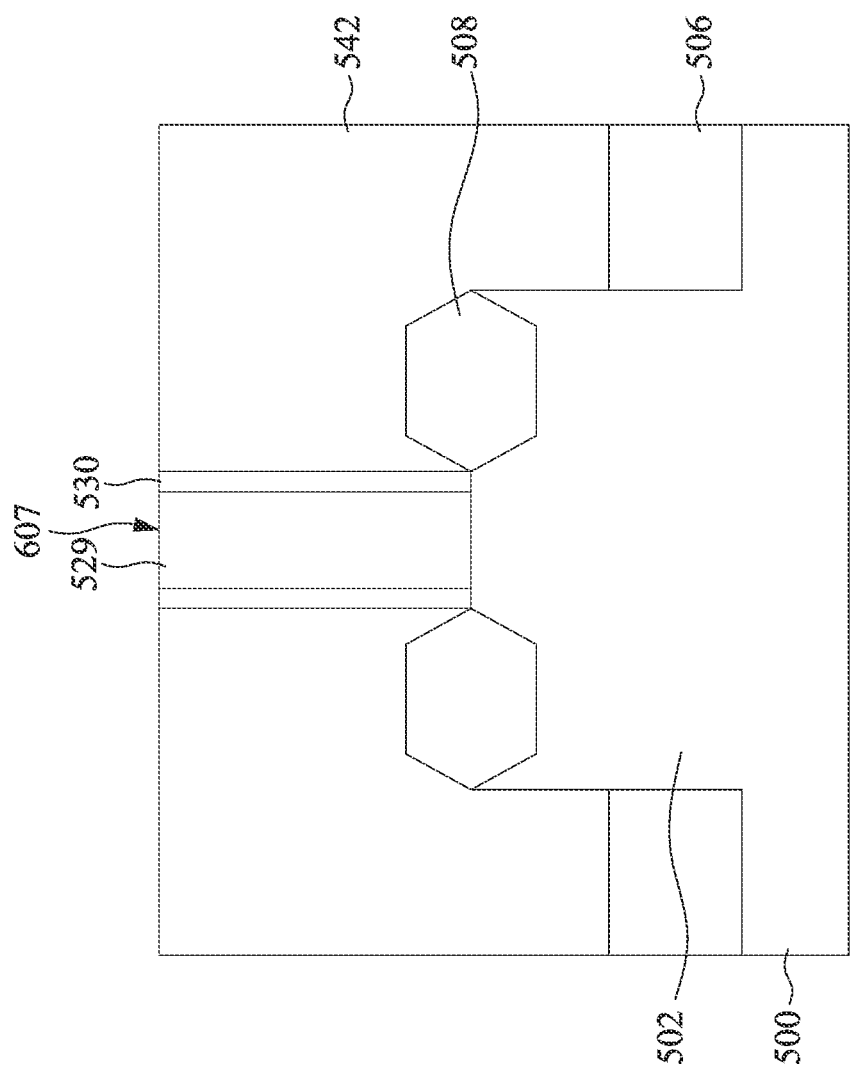
Figure 36B:
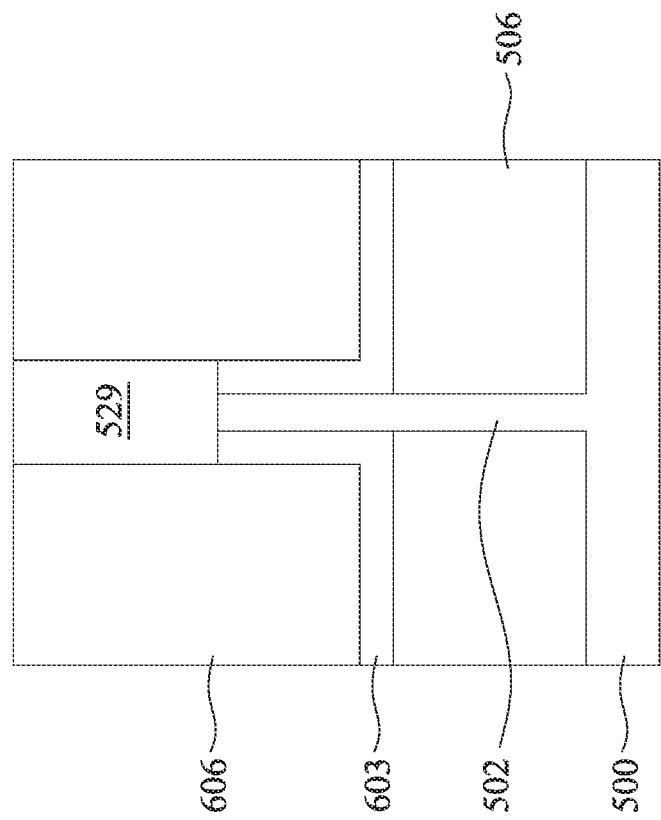

In FIGS. 36A and 36B, a gate-cut dielectric structure 529 is formed in the gate-cut opening 607 and interposing the dummy gates 606. In some embodiments, the gate-cut dielectric structure 529 is formed by, for example, depositing one or more dielectric materials (e.g., silicon oxide) into the gate-cut opening 607, followed by a CMP process to remove excess dielectric materials outside the gate-cut opening 607.

Figure 37A:
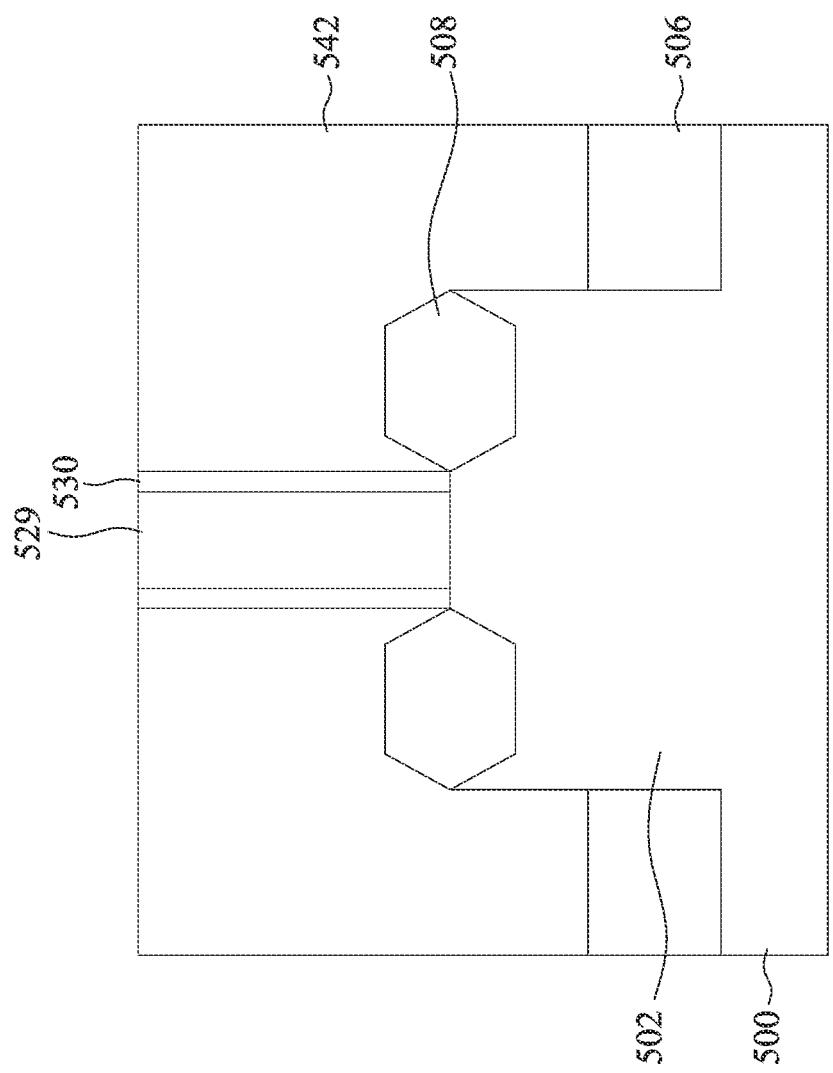

In FIGS. 37A and 37B, the dummy gates 606 and the dummy gate dielectric layers 603 are removed by one or more selective etching processes. The dummy gate removal step form two first and second gate trenches GT2 and GT3 on opposite sides of the fin 502 and also on opposite sides of the gate-cut dielectric structure 529.

Figure 38A:
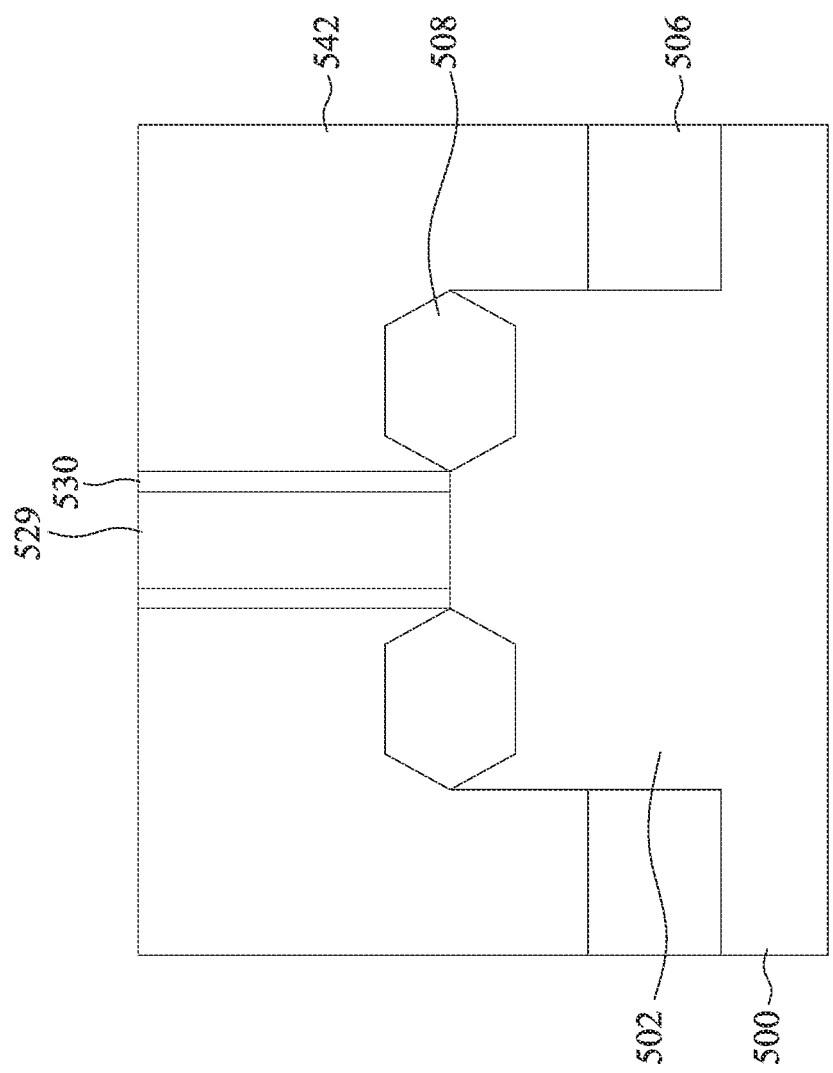
Figure 38B:
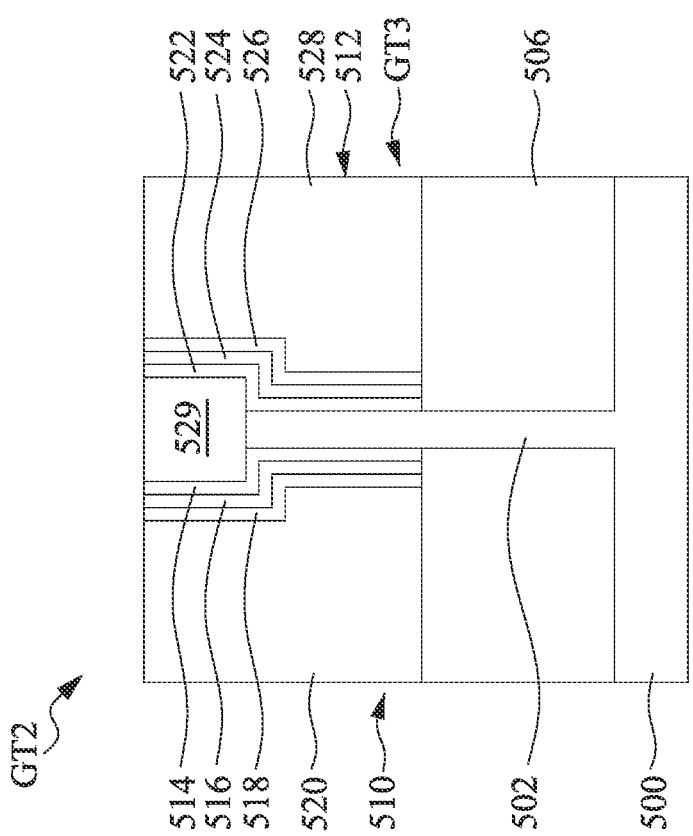

In FIGS. 38A and 38B, a first gate structure 510 and a second gate structure 512 are HKMG structures formed respectively in the first and second gate trenches GT2 and GT3. In some embodiments about the HKMG formation step, an interfacial layer is formed over the substrate 500 and in both the first and second gate trench GT2 and GT3, a high-k dielectric layer is deposited over the interfacial layer, a work function metal layer is deposited over the high-k dielectric layer, and a gate fill metal is deposited over the work function metal layer. Then, a CMP process is performed on these materials until the gate-cut dielectric structure 529 is exposed. After the CMP process is complete, remaining materials in the first gate trench GT2 collectively serve as the first gate structure 510 and comprise an interfacial layer 514, a high-k dielectric layer 516 over the interfacial layer 514, a work function metal layer 518 over the high-k dielectric layer 516, and a gate fill metal 520 over the work function metal layer 518; and remaining materials in the second gate trench GT3 collectively serve as the second gate structure 512 and comprise an interfacial layer 522, a high-k dielectric layer 524 over the interfacial layer 522, a work function metal layer 526 over the high-k dielectric layer 524, and a gate fill metal 528 over the work function metal layer 526. In some embodiments, before depositing the gate fill metal in the gate trenches GT2 and GT3, horizontal portions of the work function metal layer, high-k dielectric layer, and interfacial layer can be removed from the STI regions 506 by an anisotropic etching process, and thus the resultant gate fill metal will be in contact with the STI regions 506 as illustrated in FIG. 38B. In some other embodiments, horizontal portions of the work function metal layer, high-k dielectric layer, and interfacial layer can also remain on the STI regions 506. In that case, the gate fill metal will be spaced from the STI regions 506.

Based on the above discussions, it can be seen that the present disclosure in various embodiments offers advantages. It is understood, however, that other embodiments may offer additional advantages, and not all advantages are necessarily disclosed herein, and that no particular advantage is required for all embodiments. One advantage is that in the IC structure each 1T-1MTJ MRAM cell not only serves as a memory device for storing data, but also serves as a logic device for performing logic computation, which in turn realizes in-memory computing using a single 1T-1MTJ MRAM cell. Another advantage is that data transfer between memory devices and logic devices can be skipped, the logic operation results of each MRAM cell can be stored in its MTJ cell.

In some embodiments, an IC structure comprises an MTJ cell, a transistor, a first word line, and a second word line. The transistor is electrically coupled to the MTJ cell. The transistor comprises a first gate terminal and a second gate terminal independent of the first gate terminal. The first word line is electrically coupled to the first gate terminal of the transistor. The second word line is electrically coupled to the second gate terminal of the transistor. A resistance state of the MTJ cell is dependent on a first word line voltage applied to the first word line and a second word line voltage applied to the second word line, and the resistance state of the MTJ cell follows an AND gate logic or an OR gate logic. In some embodiments, the resistance state of the MTJ cell is unchanged when a first one of the first and second word line voltages is a high voltage, and a second one of the first and second word line voltage is a low voltage lower than the high voltage. In some embodiments, the resistance state of the MTJ cell is switched when the first and second word line voltages are non-zero voltages. In some embodiments, the resistance state of the MTJ cell is switched from a low resistance state having a first resistance to a high resistance state having a second resistance higher than the first resistance. In some embodiments, the resistance state of the MTJ cell is switched when one of the first and second word line voltages is a non-zero voltage. In some embodiments, the transistor is a gate-all-around (GAA) transistor. In some embodiments, the transistor further comprises a plurality of channel layers, and each of the plurality of channel layers has different regions respectively controlled by the first gate terminal and the second gate terminal. In some embodiments, the transistor is a FinFET. In some embodiments, the transistor further comprises a semiconductor fin, and the semiconductor fin has a first region controlled by the first gate terminal and a second region controlled by the second gate terminal.

In some embodiments, an IC structure comprises a source region and a drain region, a plurality of channel layers, a first gate structure and a second gate structure. The source region and the drain region are on a substrate. The plurality of channel layers are arranged one above another over the substrate, and extend from the source region to the drain region. The first gate structure and the second gate structure laterally between the source region and the drain region. The first gate structure is electrically isolated from the second gate structure. The plurality of channel layers comprise a first channel layer having a bottom surface contacting the first gate structure and a top surface contacting the second gate structure. In some embodiments, the plurality of channel layers further comprise a second channel layer having a bottom surface contacting the second gate structure and a top surface contacting the first gate structure. In some embodiments, the second channel layer is above the first channel layer. In some embodiments, the plurality of channel layers further comprise a third channel layer having a bottom surface contacting the first gate structure and a top surface contacting the second gate structure. In some embodiments, the third channel layer is above the second channel layer. In some embodiments, the IC structure further comprises an MTJ cell electrically coupled to one of the source region and the drain region. In some embodiments, the MTJ cell has a resistance state which is dependent on a first voltage applied to the first gate structure and a second voltage applied to the second gate structure and which follows an AND gate logic or an OR gate logic.

In some embodiments, a method includes forming a fin structure having a stack of alternating first semiconductor layers, second semiconductor layers, and third semiconductor layers over a substrate; etching the first semiconductor layers to form a first space between a first one and a second one of the second semiconductor layers; forming a first gate structure in the first space between the first one and the second one of the second semiconductor layers; etching the third semiconductor layers to form a second space between the second one and a third one of the second semiconductor layers; and forming a second gate structure in the second space between the second one and the third one of the second semiconductor layers. In some embodiments, etching the first semiconductor layers further forms a third space below the third one of the second semiconductor layers, and the first gate structure is further formed in the third space. In some embodiments, etching the third semiconductor layers further forms a fourth space above the first one of the second semiconductor layers, and the second gate structure is further formed in the fourth space.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a fin structure having a stack of alternating first semiconductor layers, second semiconductor layers, and third semiconductor layers over a substrate;
etching the first semiconductor layers to form a first space between a first one and a second one of the second semiconductor layers;
forming a first gate structure in the first space between the first one and the second one of the second semiconductor layers;
after forming the first gate structure, etching the third semiconductor layers to form a second space between the second one and a third one of the second semiconductor layers; and
forming a second gate structure in the second space between the second one and the third one of the second semiconductor layers.

2. The method of claim 1, wherein etching the first semiconductor layers further forms a third space below the third one of the second semiconductor layers, and the first gate structure is further formed in the third space.

3. The method of claim 1, wherein etching the third semiconductor layers further forms a fourth space above the first one of the second semiconductor layers, and the second gate structure is further formed in the fourth space.

4. A method comprising:
forming a magnetic tunnel junction (MTJ) cell;
forming a transistor electrically coupled to the MTJ cell, the transistor comprising a first gate terminal and a second gate terminal independent of the first gate terminal, wherein in a cross-sectional view, the first gate terminal has a first portion and a second portion extending along a horizontal direction, the second gate terminal has a portion extending along the horizontal direction and disposed vertically between the first portion and the second portion of the first gate terminal;
forming a first word line electrically coupled to the first gate terminal of the transistor; and
forming a second word line electrically coupled to the second gate terminal of the transistor, wherein a resistance state of the MTJ cell is dependent on a first word line voltage applied to the first word line and a second word line voltage applied to the second word line, and the resistance state of the MTJ cell follows an AND gate logic or an OR gate logic.

5. The method of claim 4, wherein the resistance state of the MTJ cell is unchanged when a first one of the first and second word line voltages is a high voltage, and a second one of the first and second word line voltages is a low voltage lower than the high voltage.

6. The method of claim 4, wherein the resistance state of the MTJ cell is switched when the first and second word line voltages are non-zero voltages.

7. The method of claim 6, wherein the resistance state of the MTJ cell is switched from a low resistance state having a first resistance to a high resistance state having a second resistance higher than the first resistance.

8. The method of claim 4, wherein the resistance state of the MTJ cell is switched when one of the first and second word line voltages is a non-zero voltage.

9. The method of claim 8, wherein the resistance state of the MTJ cell is switched from a low resistance state having a first resistance to a high resistance state having a second resistance higher than the first resistance.

10. The method of claim 4, wherein the transistor is a gate-all-around (GAA) transistor.

11. The method of claim 4, wherein the transistor further comprises a plurality of channel layers, and each of the plurality of channel layers has different regions respectively controlled by the first gate terminal and the second gate terminal.

12. A method comprising:
forming a source region and a drain region on a substrate;
forming a plurality of channel layers arranged one above another over the substrate, and extending from the source region to the drain region; and
forming a first gate structure and a second gate structure laterally between the source region and the drain region, wherein the first gate structure is electrically isolated from the second gate structure, and the plurality of channel layers comprise a first channel layer having a bottom surface contacting the first gate structure and a top surface contacting the second gate structure in a cross-sectional view.

13. The method of claim 12, wherein the plurality of channel layers further comprise a second channel layer having a bottom surface contacting the second gate structure and a top surface contacting the first gate structure in the cross-sectional view.

14. The method of claim 13, wherein the second channel layer is above the first channel layer.

15. The method of claim 13, wherein the plurality of channel layers further comprise a third channel layer having a bottom surface contacting the first gate structure and a top surface contacting the second gate structure in the cross-sectional view.

16. The method of claim 15, wherein the third channel layer is above the second channel layer.

17. The method of claim 12, further comprising:
forming a magnetic tunnel junction (MTJ) cell electrically coupled to one of the source region and the drain region.

18. The method of claim 17, wherein the MTJ cell has a resistance state which is dependent on a first voltage applied to the first gate structure and a second voltage applied to the second gate structure and which follows an AND gate logic or an OR gate logic.

19. The method of claim 4, wherein the second gate terminal has a length greater than the first gate terminal in a top view.

20. The method of claim 12, wherein in the cross-sectional view, the first gate structure comprises a first portion and a second portion both extending parallel with the plurality of channel layers, the second gate structure comprises a portion extending parallel with the plurality of channel layers, and the portion of the second gate structure is disposed between the first and second portions of the first gate structure.

* * * * *